(12) United States Patent
Chien et al.

(10) Patent No.: US 12,165,973 B2
(45) Date of Patent: Dec. 10, 2024

(54) SEMICONDUCTOR DEVICE WITH BACKSIDE POWER RAIL AND METHOD FOR FORMING THE SAME

(71) Applicant: Taiwan Semiconductor Manufacturing Company, Ltd., Hsin-Chu (TW)

(72) Inventors: Hung-Chung Chien, Chiayi County (TW); Chao-Hong Chen, Hsinchu (TW); Ming-Feng Shieh, Tainan County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 434 days.

(21) Appl. No.: 17/344,478

(22) Filed: Jun. 10, 2021

(65) Prior Publication Data
US 2022/0102274 A1 Mar. 31, 2022

Related U.S. Application Data

(60) Provisional application No. 63/198,139, filed on Sep. 30, 2020.

(51) Int. Cl.
*H01L 23/528* (2006.01)
*H01L 21/02* (2006.01)
(Continued)

(52) U.S. Cl.
CPC ...... *H01L 23/5286* (2013.01); *H01L 21/0259* (2013.01); *H01L 29/0665* (2013.01);
(Continued)

(58) Field of Classification Search
CPC ............ H01L 23/5286; H01L 21/0259; H01L 29/0665; H01L 29/401; H01L 29/41733;
(Continued)

(56) References Cited

U.S. PATENT DOCUMENTS 6,680,243 B1 * 1/2004 Kamath .............. H01L 21/2652
438/528
8,772,109 B2 7/2014 Colinge
(Continued)

OTHER PUBLICATIONS

IP.com npl search (Year: 2024).*

*Primary Examiner* — William B Partridge
*Assistant Examiner* — David Paul Sedorook
(74) *Attorney, Agent, or Firm* — HAYNES AND BOONE, LLP

(57) ABSTRACT

A method of manufacturing a semiconductor device includes forming a fin structure over a substrate, forming a sacrificial gate structure over the fin structure, and etching a source/drain (S/D) region of the fin structure to form an S/D recess. The fin structure includes first semiconductor layers and second semiconductor layers alternately stacked. The method further includes depositing an insulating dielectric layer in the S/D recess, depositing an etch protection layer over a bottom portion of the insulating dielectric layer, and partially removing the insulating dielectric layer. The method further includes growing an epitaxial S/D feature in the S/D recess. The bottom portion of the insulating dielectric layer interposes the epitaxial S/D feature and the substrate.

20 Claims, 49 Drawing Sheets

(51) Int. Cl.
*H01L 29/06* (2006.01)
*H01L 29/40* (2006.01)
*H01L 29/417* (2006.01)
*H01L 29/423* (2006.01)
*H01L 29/66* (2006.01)
*H01L 29/786* (2006.01)

(52) U.S. Cl.
CPC ...... *H01L 29/401* (2013.01); *H01L 29/41733* (2013.01); *H01L 29/42392* (2013.01); *H01L 29/66545* (2013.01); *H01L 29/66742* (2013.01); *H01L 29/78618* (2013.01); *H01L 29/78696* (2013.01)

(58) Field of Classification Search
CPC ......... H01L 29/42392; H01L 29/66545; H01L 29/66742; H01L 29/78618; H01L 29/78696

See application file for complete search history.

(56) References Cited

U.S. PATENT DOCUMENTS

| | | | |
|---|---|---|---|
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 10,665,669 | B1* | 5/2020 | Xie ................... H01L 21/02381 |
| 2005/0167782 | A1 | 8/2005 | Sanchez et al. |
| 2014/0175561 | A1* | 6/2014 | Colinge ................ H01L 29/785 438/283 |
| 2016/0079124 | A1* | 3/2016 | Yin ....................... H01L 21/266 438/283 |
| 2018/0219012 | A1 | 8/2018 | Lilak et al. |
| 2020/0227570 | A1* | 7/2020 | Chen ................... H01L 29/0673 |
| 2020/0279916 | A1* | 9/2020 | Rachmady ............ H01L 29/785 |
| 2020/0294998 | A1* | 9/2020 | Lilak ................. H01L 21/76897 |
| 2021/0408285 | A1* | 12/2021 | Hickey ............. H01L 29/66545 |

* cited by examiner

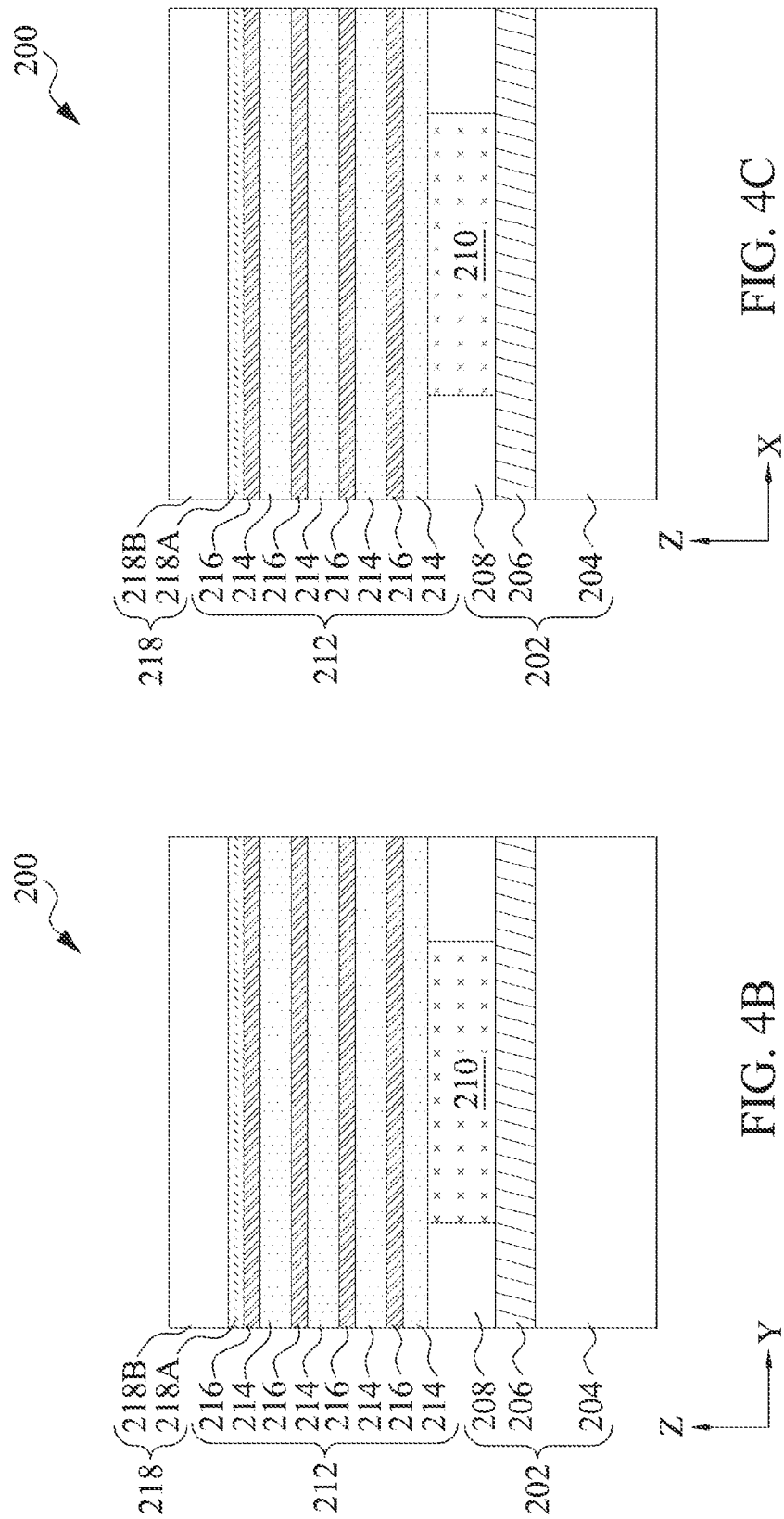

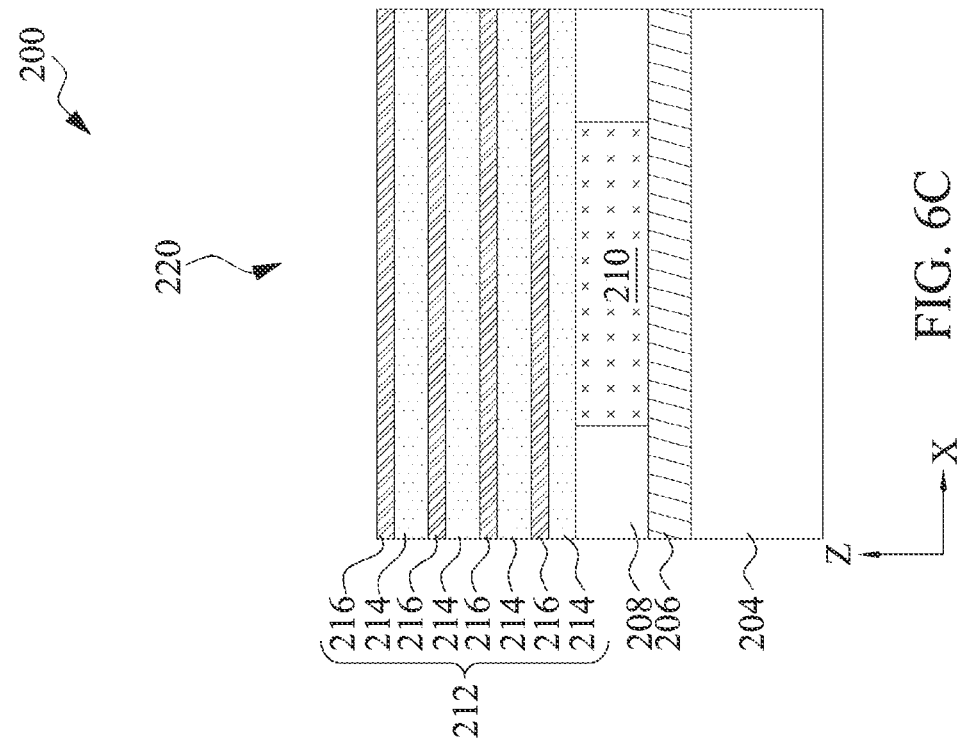
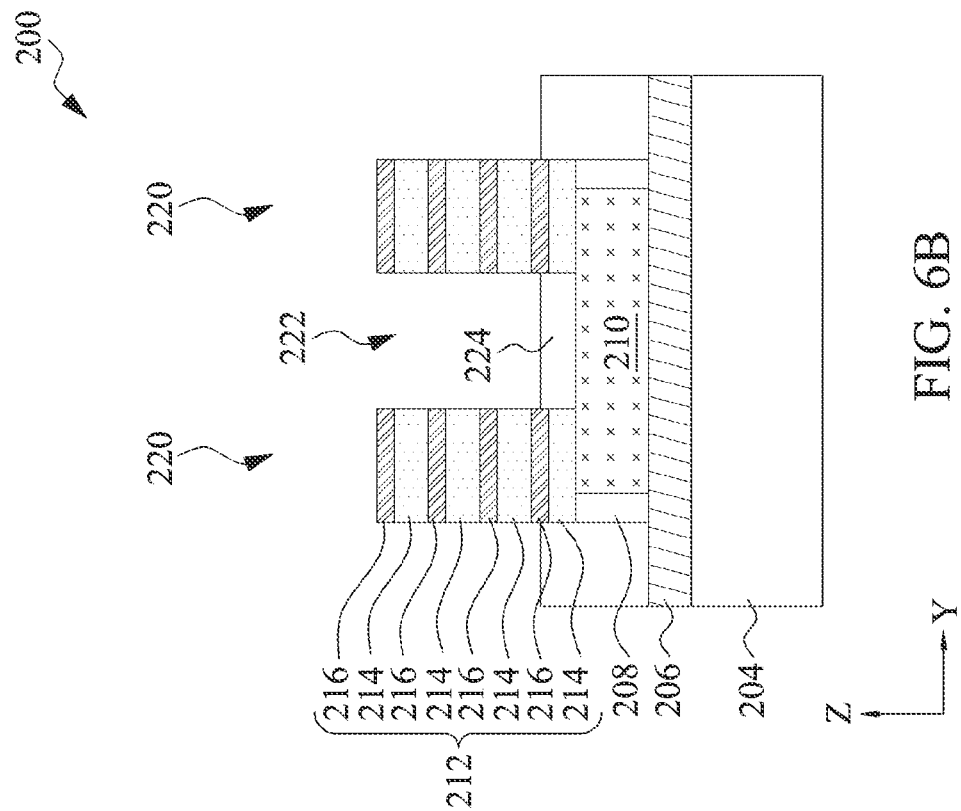

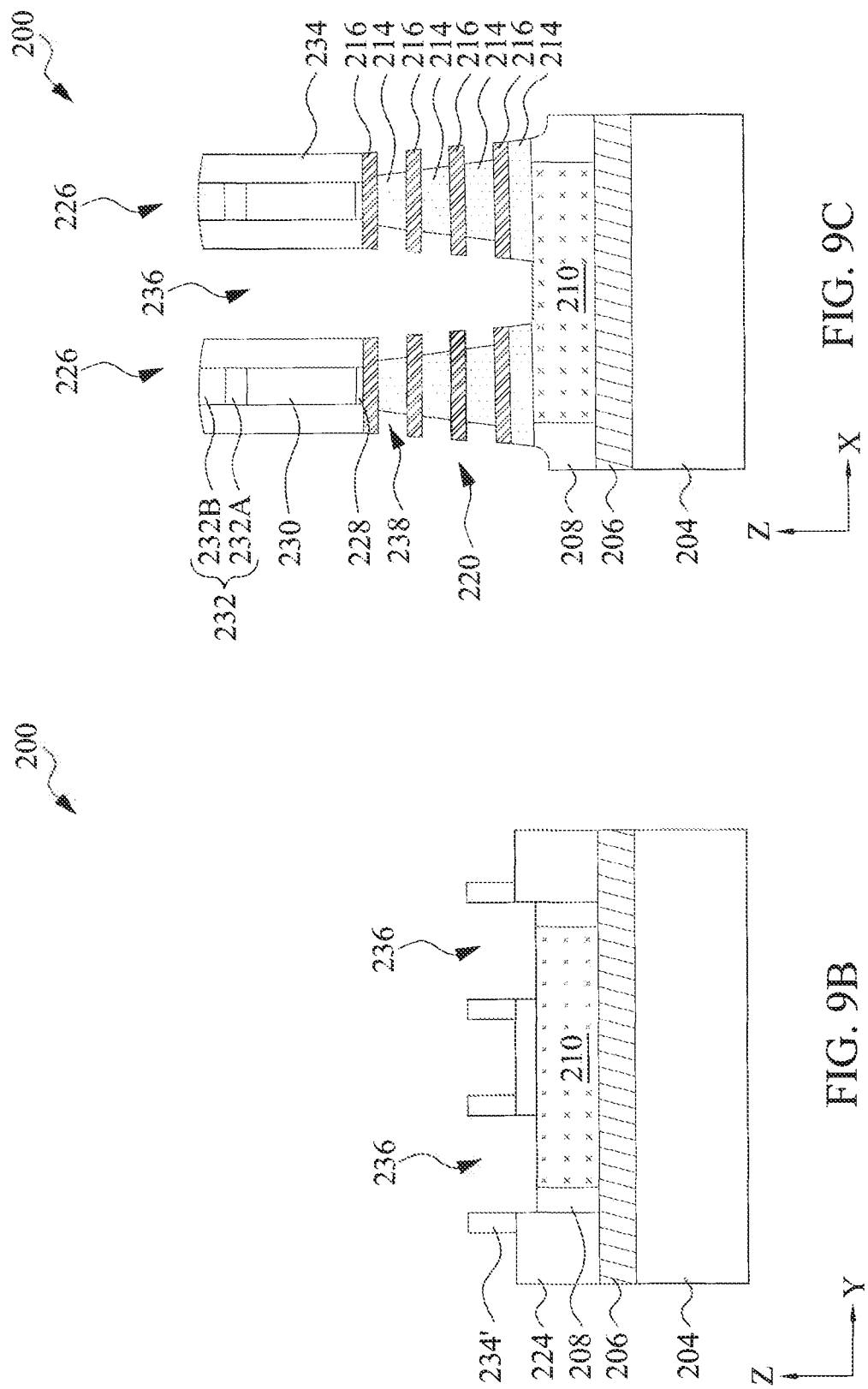

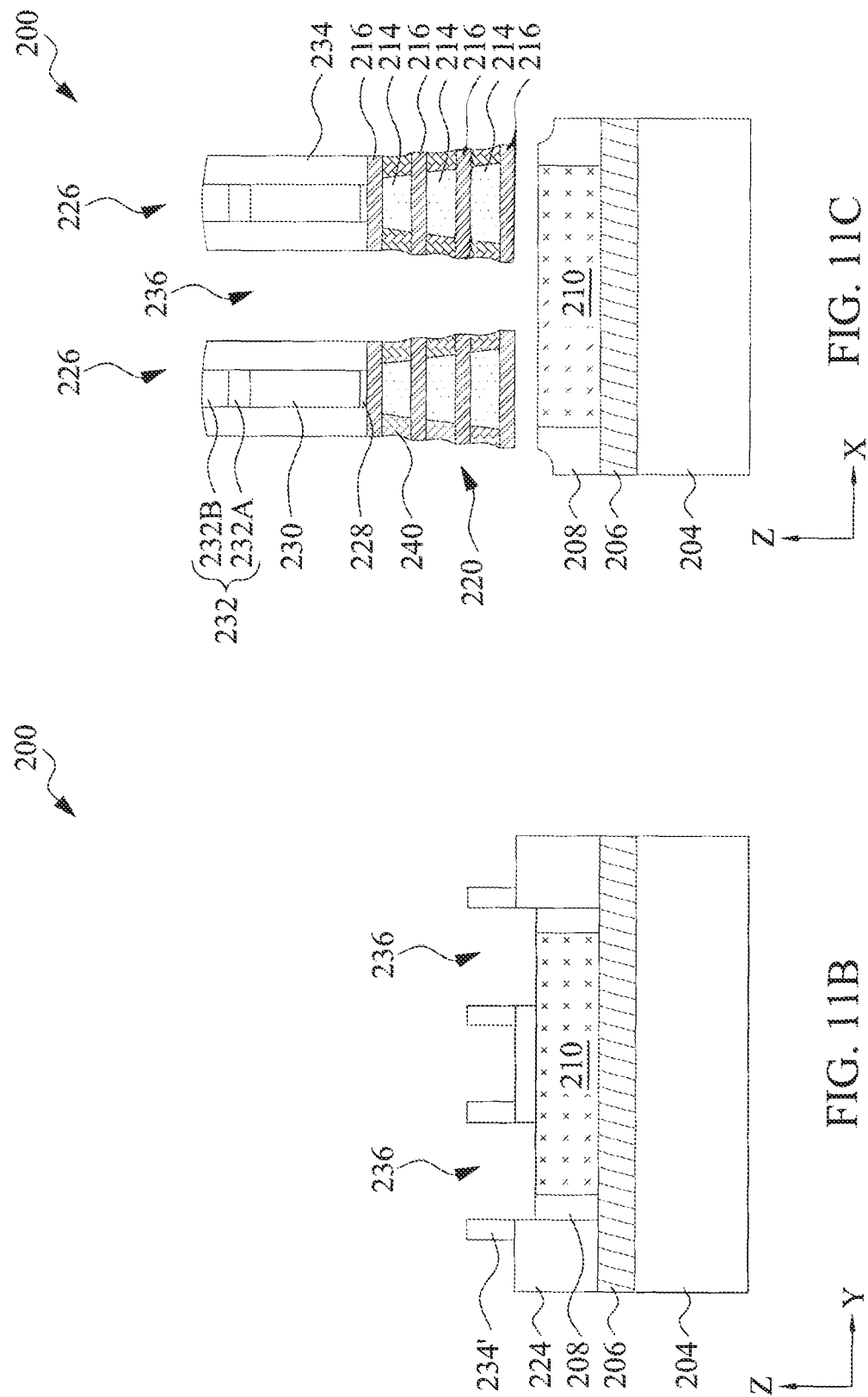

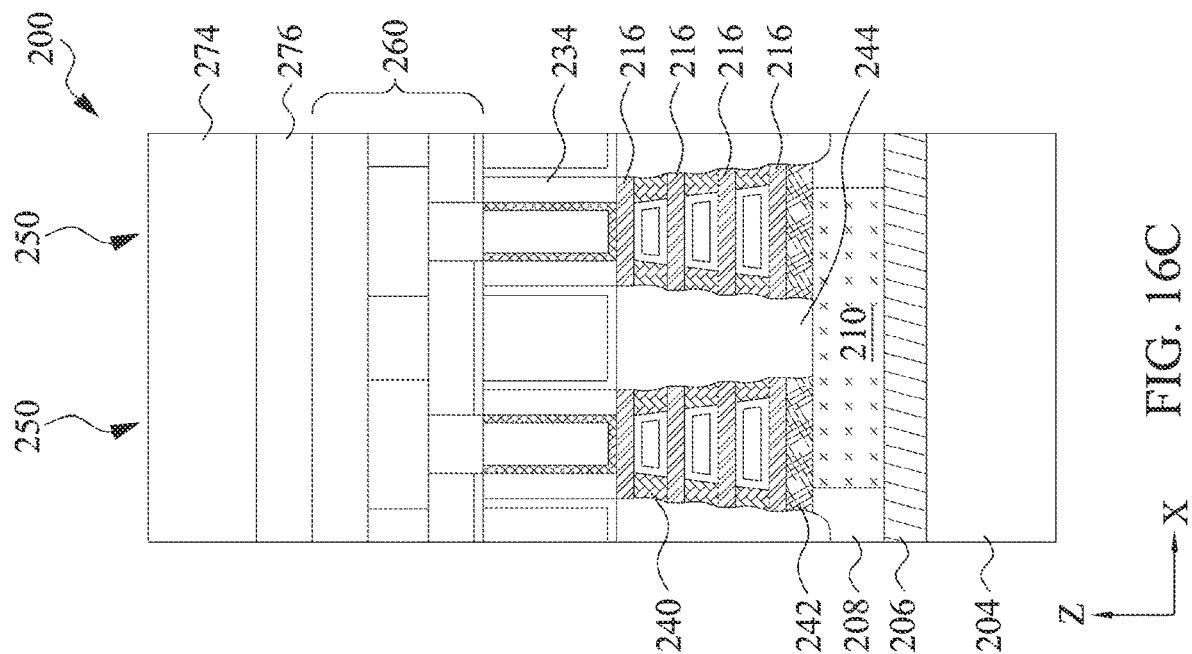
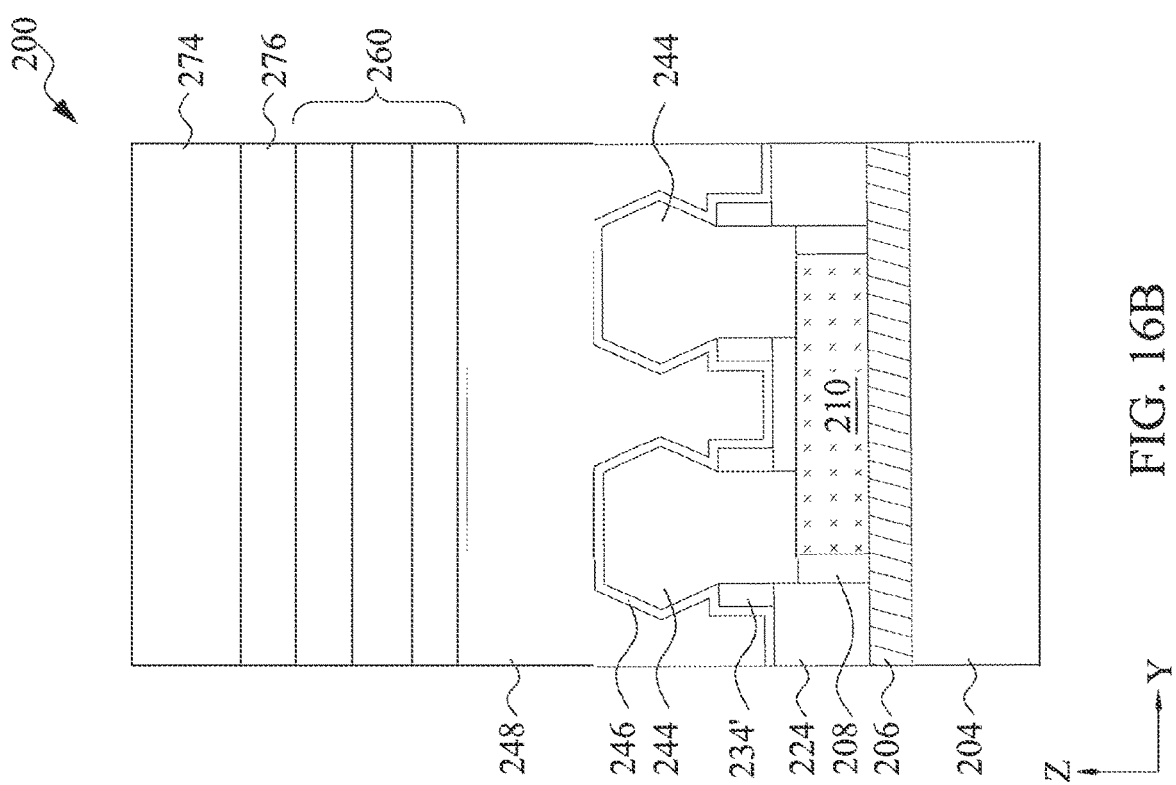
FIG. 16C
FIG. 16B

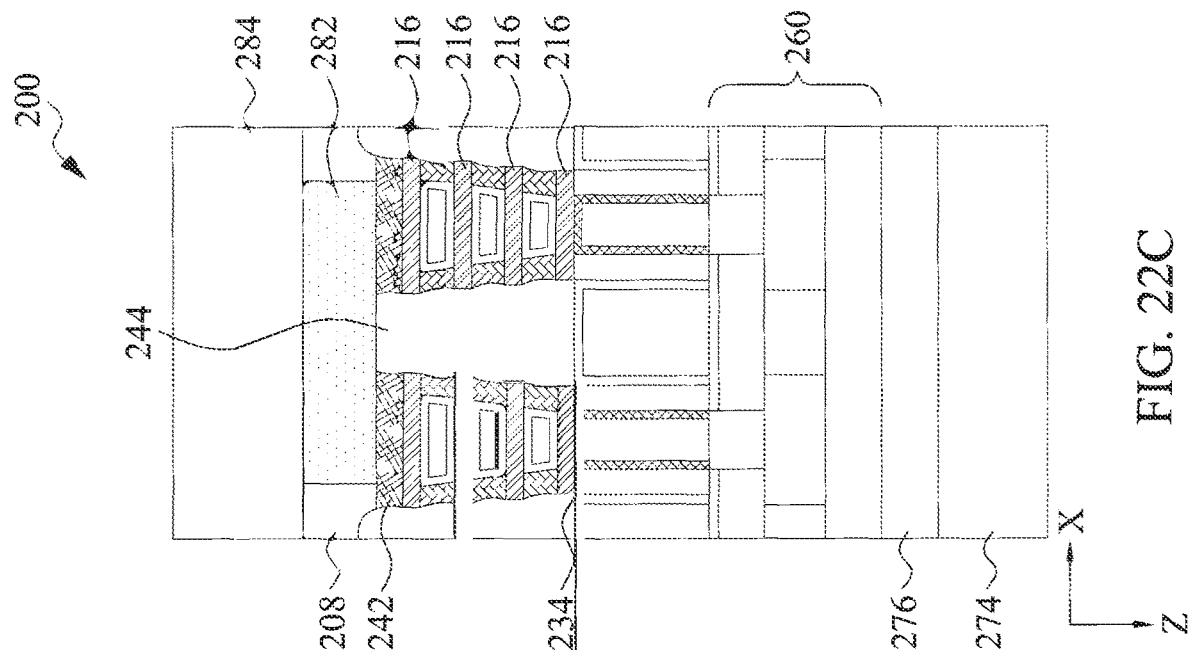
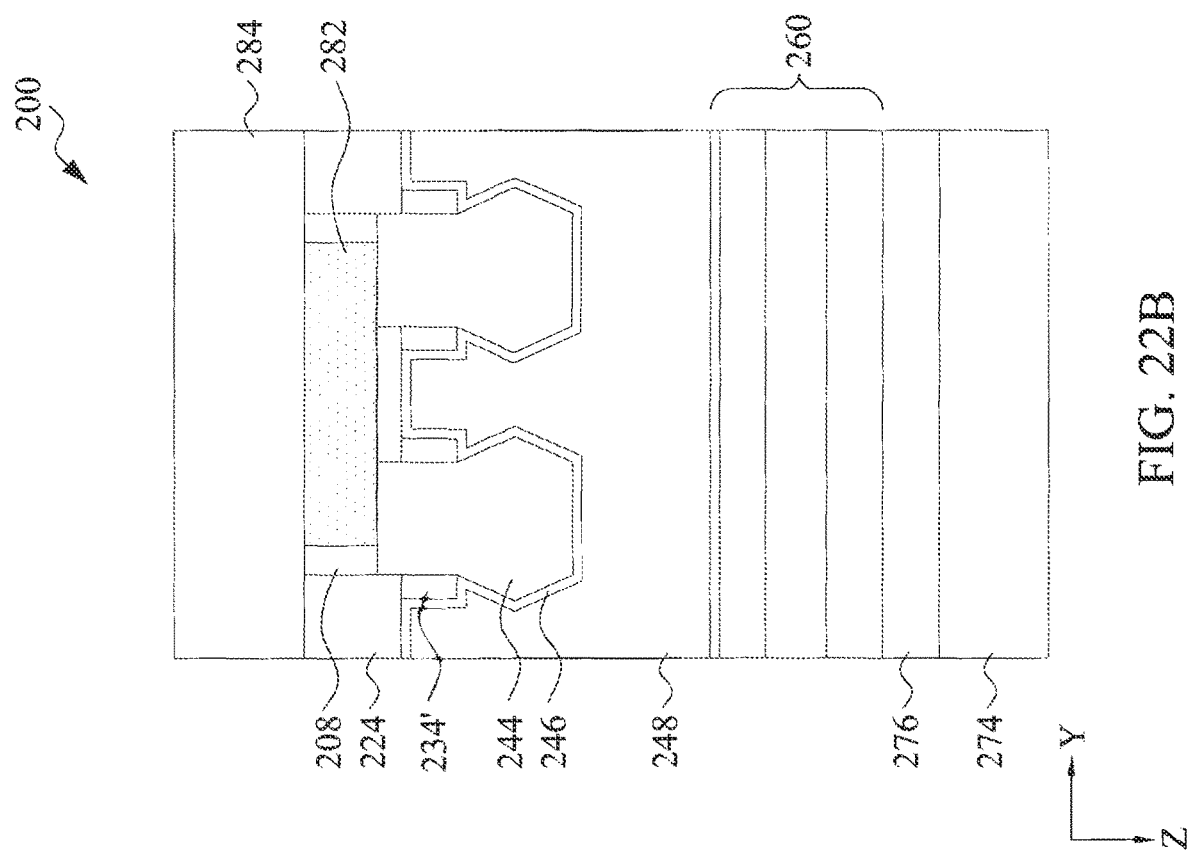
FIG. 22C
FIG. 22B

US 12,165,973 B2

SEMICONDUCTOR DEVICE WITH BACKSIDE POWER RAIL AND METHOD FOR FORMING THE SAME

PRIORITY DATA

This application claims priority to U.S. Provisional Patent Application No. 63/198,139 filed on Sep. 30, 2020, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with the FinFET, is the gate-all-around (GAA) transistor. The GAA transistor gets its name from the gate structure which can extend around the channel region providing access to the channel on four sides. The GAA transistor is compatible with conventional complementary metal-oxide-semiconductor (CMOS) processes and its structure allows it to be aggressively scaled while maintaining gate control and mitigating SCEs.

Conventionally, multi-gate devices (e.g., FinFETs and GAA transistors) are built in a stacked-up fashion, having transistors at the lowest level and interconnect (vias and wires) on top of the transistors to provide connectivity to the transistors. Power rails (such as metal lines for voltage sources and ground planes) are also above the transistors and may be part of the interconnect. As the integrated circuits continue to scale down, so do the power rails. This inevitably leads to increased voltage drop across the power rails, as well as increased power consumption of the integrated circuits. Therefore, although existing approaches in semiconductor fabrication have been generally adequate for their intended purposes, they have not been entirely satisfactory in all respects. One area of interest is how to form power rails and vias on the backside of an IC with reduced resistance and reduced coupling capacitance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2B, 3B, 4B, 5B, 6B, 7B, 8B, 9B, 10B, 11B, 12B, 13B, 14B, 15B, 16B, 17B, 18B, 19B, 20B, 21B, 22B, and 23B illustrate cross-sectional views perpendicular to the lengthwise direction of channel structures of the semiconductor device in respective perspective views during fabrication processes according to the method of FIGS. 1A and 1B, in accordance with some embodiments of the present disclosure.

FIGS. 2C, 3C, 4C, 5C, 6C, 7C, 8C, 9C, 10C, 11C, 12C, 13C, 14C, 15C, 16C, 17C, 18C, 19C, 20C, 21C, 22C, and 23C illustrate cross-sectional views along the along the lengthwise direction of channel structures of the semiconductor device in respective perspective views during fabrication processes according to the method of FIGS. 1A and 1B, in accordance with some embodiments of the present disclosure.

DETAILED DESCRIPTION

Figure 1A:
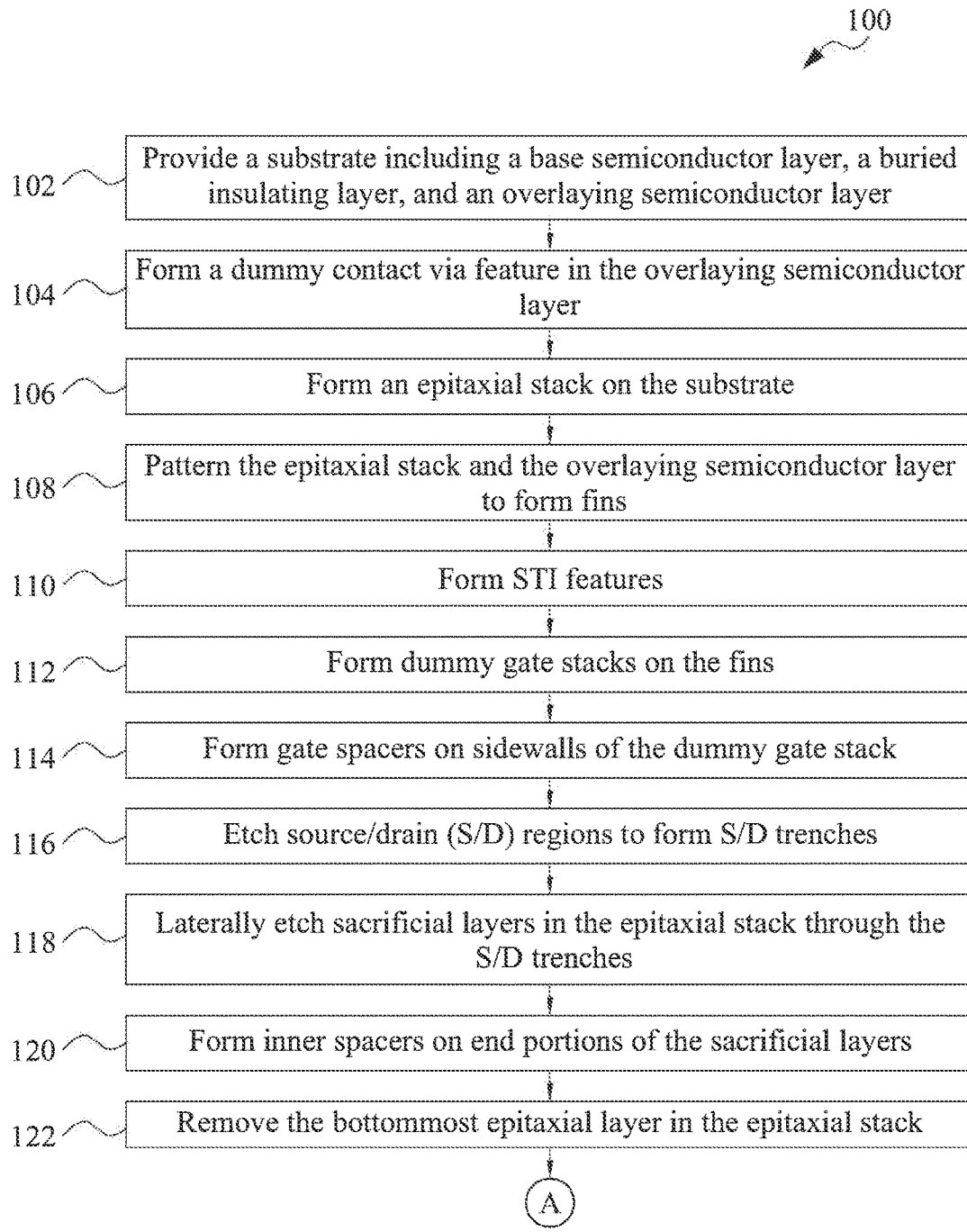
FIGS. 1A and 1B illustrate a flowchart of an example method for making a semiconductor device in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor fabrication of multi-gate transistors in a semiconductor device. As used herein, a semiconductor device refers to for example, one or more transistors, integrated circuits, a semiconductor chip (e.g., memory chip, logic chip on a semiconductor die), a stack of semiconductor chips, a semiconductor package, a semiconductor wafer, and the like. The term "multi-gate transistor" refers to a transistor, such as a fin field-effect transistor (FinFET) that has gate material(s) disposed on multiple sides of a channel structure of the transistor. In some examples, the multi-gate transistor is referred to as a gate-all around (GAA) transistor when gate material(s) are disposed on at least four sides of a channel structure of the multi-gate transistor. The term "channel structure" is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross section. In some examples, the channel structure is referred to as a "nanowire", a "nanosheet", and the like that as used herein includes channel structures of various geometries (e.g., cylindrical, bar-shaped) and various dimensions.

As the semiconductor industry further progresses into sub-10 nanometer (nm) technology process nodes in pursuit of higher device density, higher performance, and lower costs, power rails in IC need further improvement in order to provide the needed performance boost as well as reducing power consumption. An object of the present disclosure is to devise power rails (or power routings) on a back side (or backside) of a structure containing transistors (such as GAA transistors and/or FinFET transistors) in addition to an interconnect structure (which may include power rails as well) on a front side (or frontside) of the structure. This increases the number of metal tracks available in the structure for directly connecting to source/drain (S/D) contacts and vias. It also increases the gate density for greater device integration than existing structures without the backside power rails. The backside power rails may have wider dimension than the first level metal (M0) tracks on the frontside of the structure, which beneficially reduces the power rail resistance. In accordance with some embodiments, a sacrificial (dummy) contact via is formed on a wafer's backside before channel structures are formed in the frontside, and it is replaced at a later processing stage by a conductive contact via (e.g., during backside processing of the wafer). By forming the backside sacrificial contact via, a large contact area may be reserved between an S/D epitaxial feature and backside power rails, effectively reducing contact resistance and improving device performance. Moreover, embodiments disclosed herein provide for greatly improved overlay control.

The details of the structure and fabrication methods of the present disclosure are described below in conjunction with the accompanied drawings, which illustrate a process of making GAA transistors, according to some embodiments. GAA transistors are promising candidates to take CMOS to the next stage of the roadmap due to their better gate control ability, lower leakage current, and fully FinFET device layout compatibility. For the purposes of simplicity, the present disclosure uses GAA transistors as an example. Those of ordinary skill in the art should appreciate that they may readily use the present disclosure as a basis for designing or modifying other processes and structures (such as FinFET devices) for carrying out the same purposes and/or achieving the same advantages of the embodiments introduced herein.

Figure 1B:
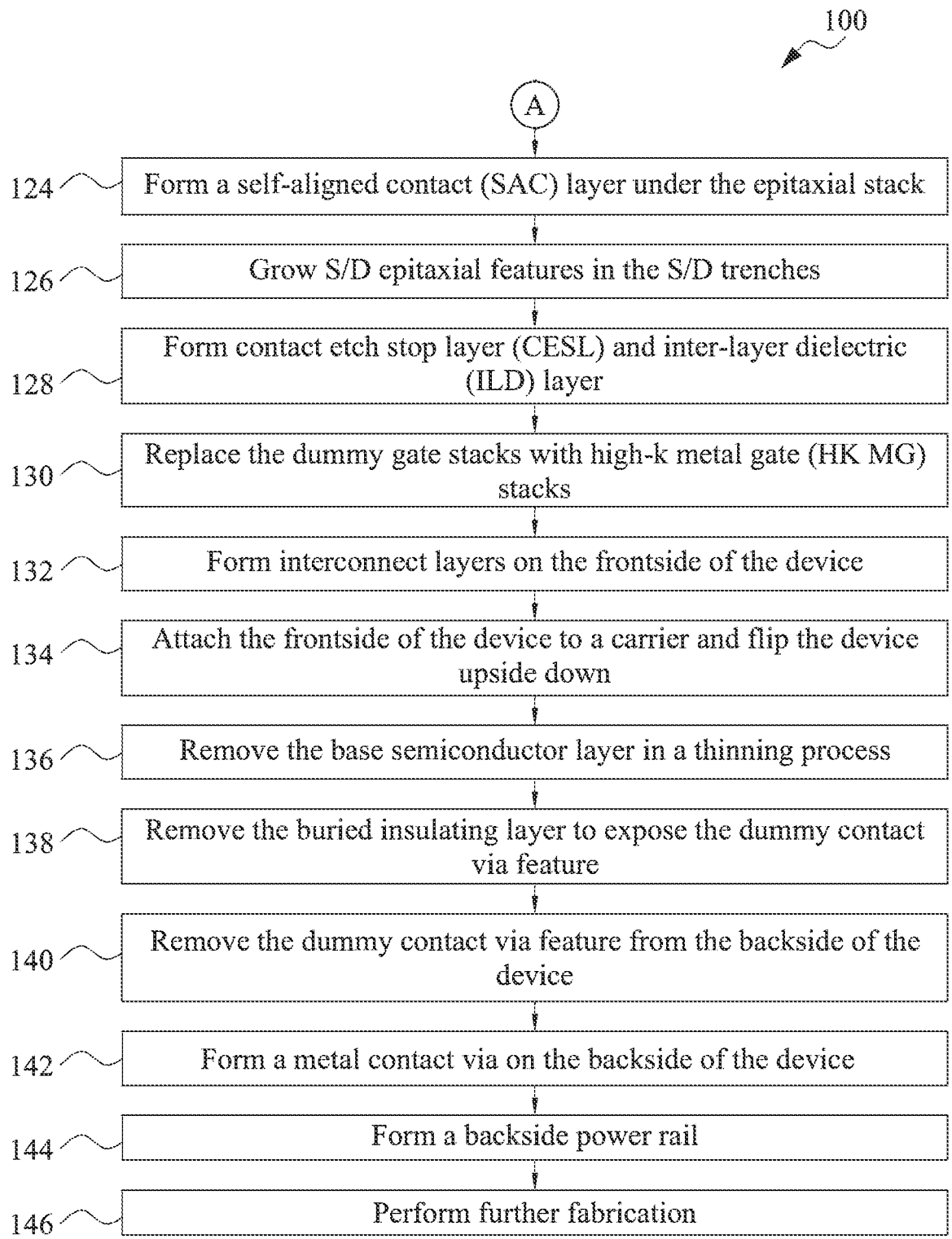

FIGS. 1A and 1B illustrate a flow chart of a method 100 for fabricating a semiconductor device according to various embodiments of the present disclosure. Additional processing is contemplated by the present disclosure. Additional operations can be provided before, during, and after method 100, and some of the operations described can be moved, replaced, or eliminated for additional embodiments of method 100. FIGS. 1A and 1B are described below in conjunction with FIG. 2A through FIG. 27 that illustrate various top and cross-sectional views of a semiconductor device (or device) 200 at various steps of fabrication according to the method 100, in accordance with some embodiments. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2A through 27 have been simplified for the sake of clarity to better understand the inventive concepts of the present disclosure. Additional features can be added in the device 200, and some of the features described below can be replaced, modified, or eliminated in other embodiments of the device 200.

Figure 2A:
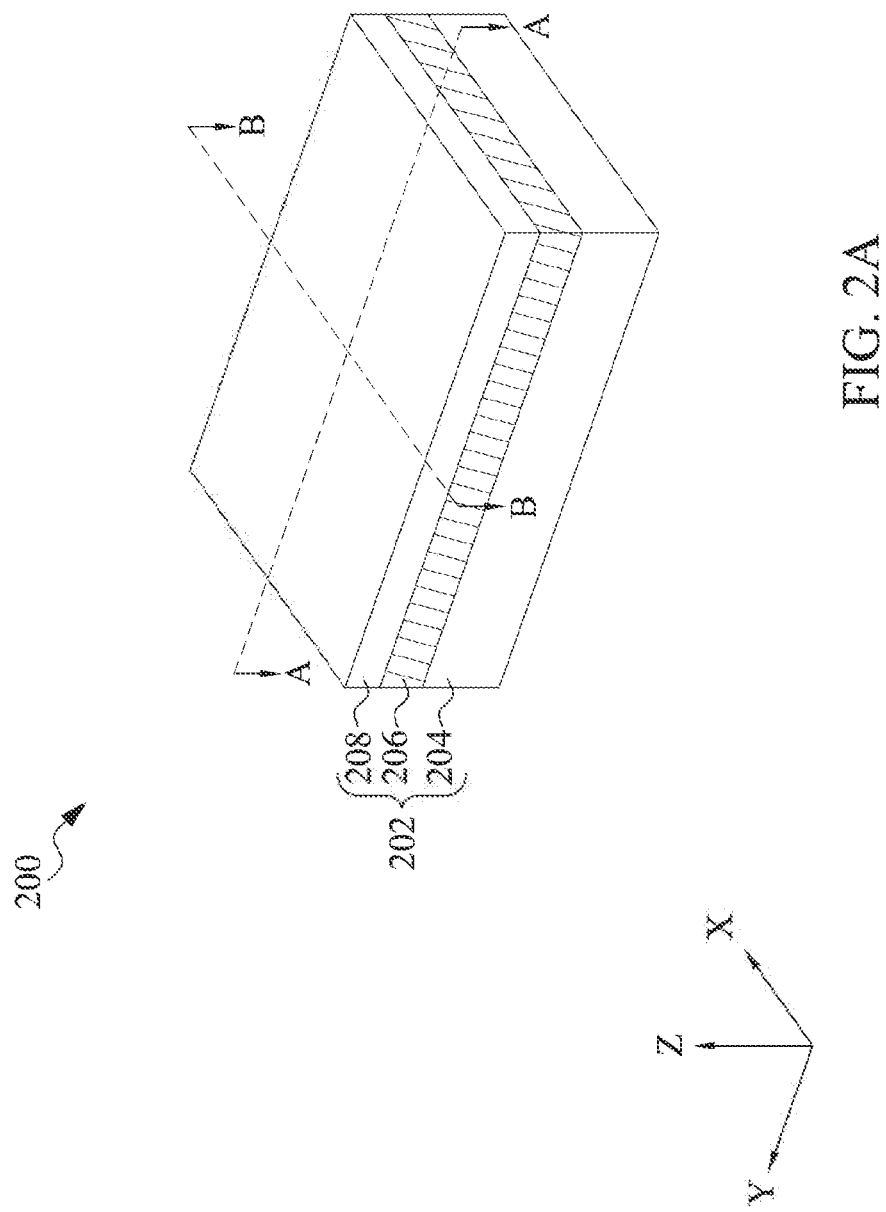
FIGS. 2A, 3A, 4A, 5A, 6A, 7A, 8A, 9A, 10A, 11A, 12A, 13A, 14A, 15A, 16A, 17A, 18A, 19A, 20A, 21A, 22A, and 23A illustrate perspective views of a semiconductor device constructed according to the method in FIGS. 1A and 1B, in accordance with some embodiments.
Figure 2C:
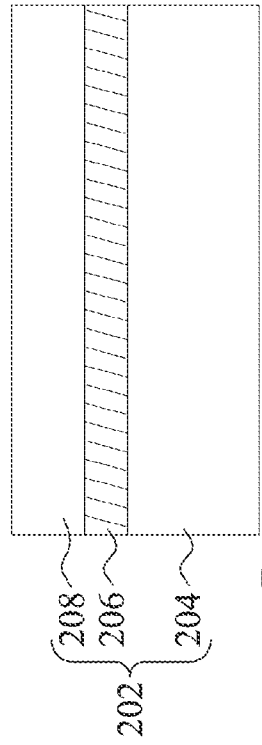
Figure 2B:
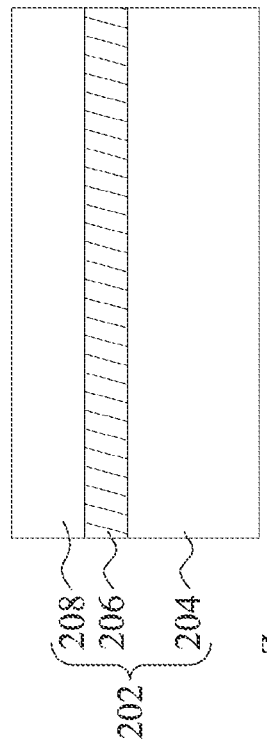

At operation 102, the method 100 (FIG. 1A) provides a device 200 having a substrate 202, as shown in FIGS. 2A-2C. FIG. 2A illustrates a perspective view of the device 200, and FIGS. 2B and 2C illustrate cross-sectional views of the device 200, in portion, along the A-A line and the B-B line in FIG. 2A, respectively. Particularly, the A-A line is a cut along the lengthwise direction of to-be-formed gate structures (direction "Y" or Y-direction) and the B-B line is a cut along the lengthwise direction of to-be-formed semiconductor fins (direction "X" or X-direction). The A-A lines and B-B lines in FIGS. 3A through 27 are similarly configured. In some embodiments, the substrate 202 is a silicon-on-insulator (SOI) substrate, which may include a base semiconductor layer 204, a buried insulating layer 206, and an overlaying semiconductor layer 208. The base semiconductor layer 204 and the overlaying semiconductor layer 208 may both include bulk single-crystalline silicon. In some embodiments, the buried insulating layer 206 is a buried oxide layer. Alternatively, the base semiconductor layer 204 and the overlaying semiconductor layer 208 may include the same or different semiconductor compositions, such as but not limited to Si, Ge, SiGe, GaAs, InSb, GaP, GaSb, InAlAs, InGaAs, GaSbP, GaAsSb, InP, or combinations thereof.

Figure 3A:
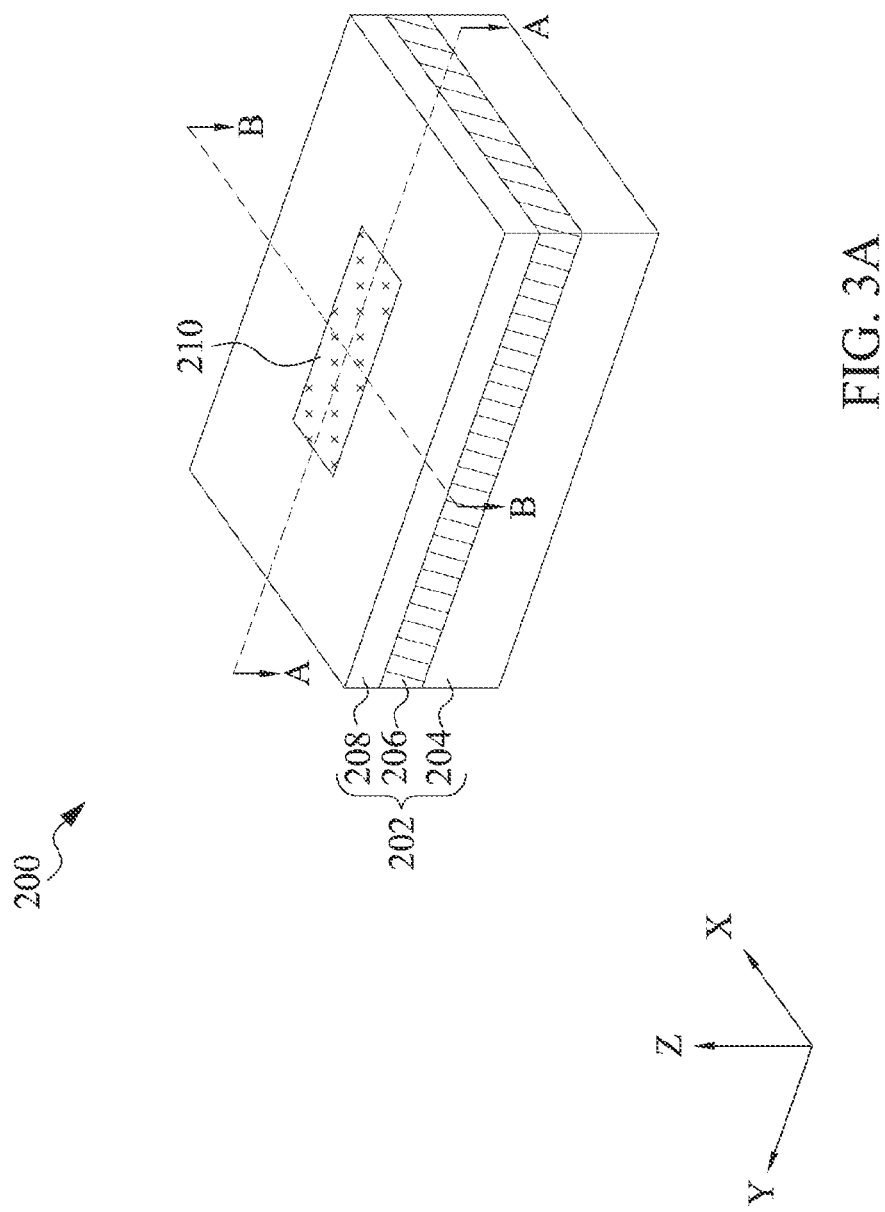
Figure 3C:
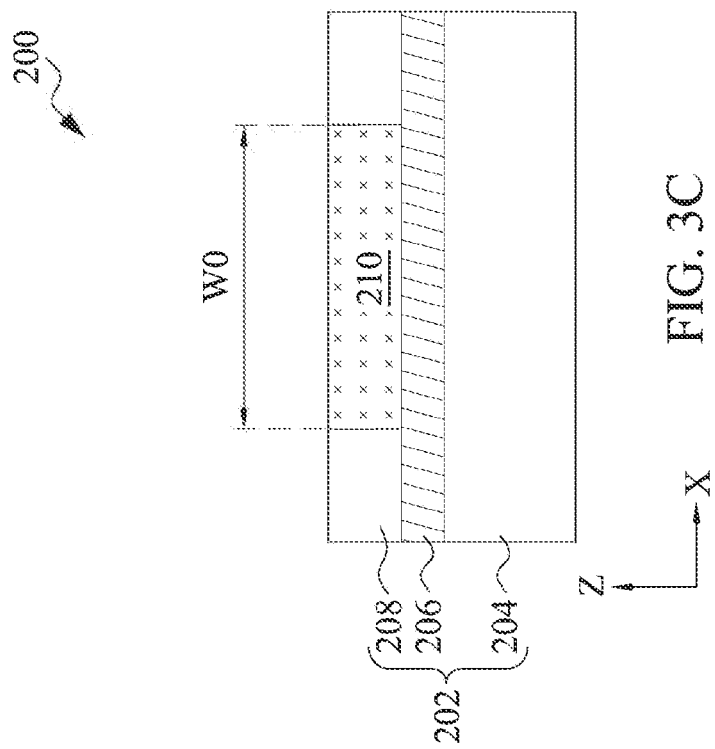
Figure 3B:
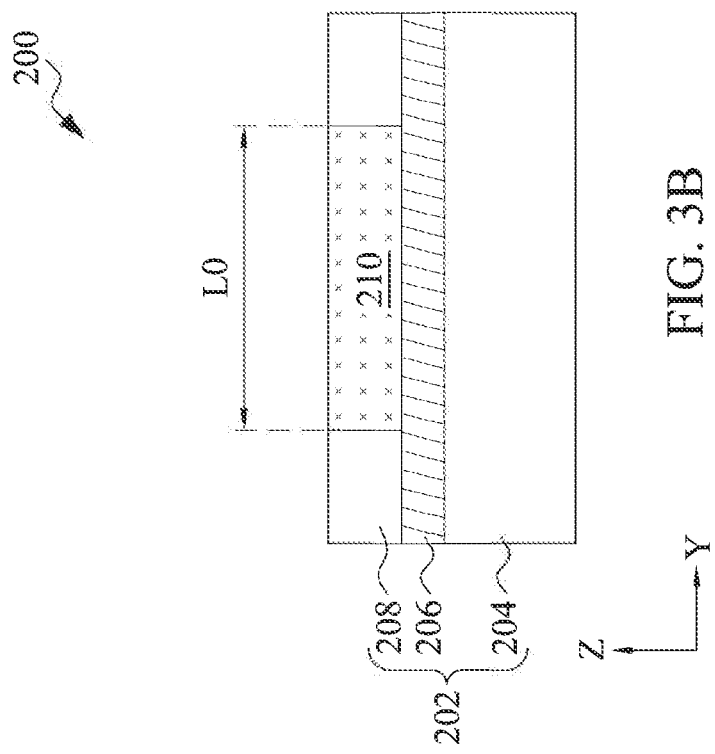

At operation 104, the method 100 (FIG. 1A) forms a sacrificial (dummy) contact via feature 210 embedded in the overlaying semiconductor layer 208, as shown in FIGS. 3A-3C. The sacrificial contact via feature 210 reserves a space for the to-be-formed S/D contact via and its thickness is chosen based on device performance considerations. In some embodiments, the sacrificial contact via feature 210 has a thickness ranging from about 10 nm to about 200 nm. The forming of the sacrificial contact via feature 210 may include a patterning process to form an opening in the overlaying semiconductor layer 208 and subsequently depositing a dielectric material in the opening. In some embodiments, the overlaying semiconductor layer 208 is patterned using any suitable methods such as a photolithography process, which may include forming a resist layer (not shown) on the device 200, exposing the resist layer by a lithography exposure process, performing a post-exposure bake process, developing the resist layer to form the patterned resist layer that exposes part of the overlaying semiconductor layer 208, etching the overlaying semiconductor layer 208 to form an opening exposing the buried insulating layer 206, and finally removing the patterned resist layer. The lithography process may be alternatively replaced by other suitable techniques, such as e-beam writing, ion-beam writing, maskless patterning or molecular printing. The dielectric material of the sacrificial contact via feature 210 may be deposited in the opening by chemical vapor deposition (CVD), including low pressure CVD (LPCVD) and plasma enhanced CVD (PECVD), physical vapor deposition (PVD), atomic layer deposition (ALD), or other suitable process. A planarization operation, such as a chemical mechanical polishing (CMP) process, may also be performed to remove excessive dielectric material to expose a top surface of the overlaying semiconductor layer 208. The dielectric material is selected such that there is a high etch selectivity between the overlaying semiconductor layer 208 and the sacrificial contact via feature 210. In some embodiments, the overlaying semiconductor layer 208 includes silicon (Si), and the sacrificial contact via feature 210 includes SiN, SiC, SiOCN, SiOC, other silicon derivative materials, or a metal oxide (e.g., $Al_2O_3$). The length L0 of the sacrificial contact via feature 210 along the Y-direction is in a range from about 40 nm to about 240 nm in some embodiments. The width W0 of the sacrificial contact via feature 210 along the X-direction is in a range from about 40 nm to about 120 nm in some embodiments.

Figure 4A:
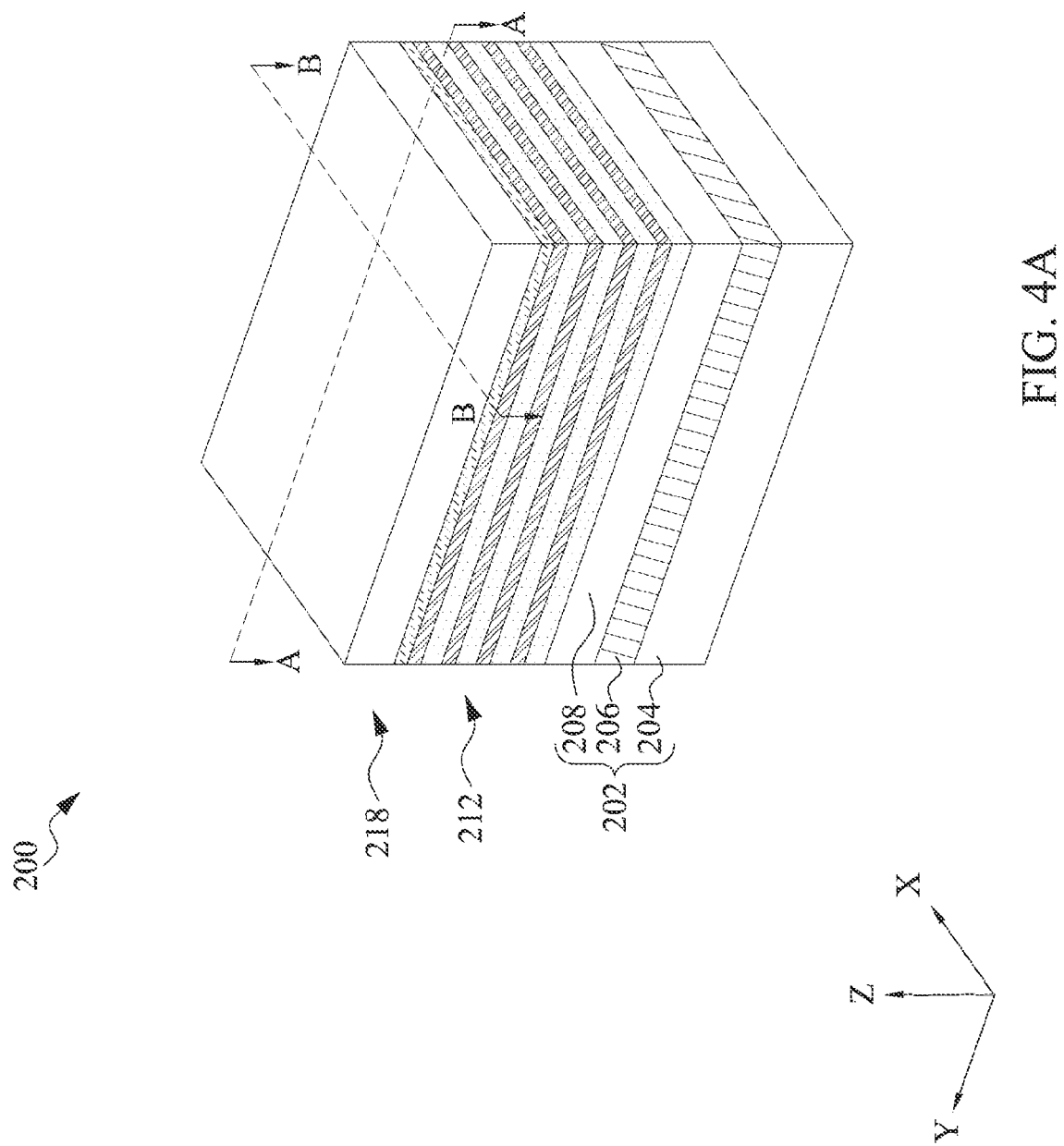

At operation 106, the method 100 (FIG. 1A) forms an epitaxial stack 212 over the substrate 202, as shown in FIGS. 4A-4C. The epitaxial stack 212 includes epitaxial layers 214 of a first composition interposed by epitaxial layers 216 of a second composition. The first and second compositions can be different. In an embodiment, the epitaxial layers 214 are SiGe layers and the epitaxial layers 216 are Si layers. However, other embodiments are possible including those that provide for a first composition and a second composition having different oxidation rates and/or etch selectivity. It is noted that four (4) layers of each of the epitaxial layers 214 and 216 are illustrated in FIGS. 4A-4C, which is for illustrative purposes only and not intended to be limiting beyond what is specifically recited in the claims. It can be appreciated that any number of epitaxial layers can be formed in the epitaxial stack 212; the number of layers depending on the desired number of channel structures for the device 200. In some embodiments, the number of the epitaxial layers 214 or the epitaxial layer 216 is between 2 and 10, such as 3 or 5.

By way of example, epitaxial growth of the epitaxial stack 212 may be performed by a molecular beam epitaxy (MBE) process, a metalorganic chemical vapor deposition (MOCVD) process, and/or other suitable epitaxial growth processes. In some embodiments, the epitaxially grown layers, such as the epitaxial layers 216, include the same material as the overlaying semiconductor layer 208, such as Si. In some embodiments, either of the epitaxial layers 214 and 216 may include a different material than the overlaying semiconductor layer 208. In furtherance of the embodiments, either of the epitaxial layers 214 and 216 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 214 and 216 may be chosen based on providing differing oxidation and etch selectivity properties. As stated above, in at least some examples, the epitaxial layers 214 include epitaxially grown SiGe layers with Ge molar ratio ranging from about 10~55%, and the epitaxial layers 216 include epitaxially grown Si layers. In furtherance of the examples, the bottommost epitaxial layer 214 may include a different Ge molar ratio than other upper epitaxial layers 214. For example, the bottommost epitaxial layer 214 may include an epitaxially grown $Si_{1-x}Ge_x$ layer (e.g., x is about 10~15%) and other upper epitaxial layers 214 may include an epitaxially grown $Si_{1-y}Ge_y$ layer (y>x, e.g., y is about 25~55%). In various embodiments, the epitaxial layers 214 and 216 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process. In yet some alternative embodiments, the bottommost epitaxial layer 216 may have a higher concentration of impurities than other upper epitaxial layer 216, such as due to formation of underneath n-wells and/or p-wells.

In some embodiments, the epitaxial layer 214 has a thickness ranging from about 3 nm to about 6 nm. In furtherance of the embodiments, the epitaxial layers 214 in the epitaxial stack 212 may be substantially uniform in thickness. In yet some alternative embodiments, the bottommost epitaxial layer 214 may be thicker than other upper epitaxial layers 214, such as about 20% to about 50% thicker. In some embodiments, the epitaxial layer 216 has a thickness ranging from about 4 nm to about 12 nm. In furtherance of the embodiments, the epitaxial layers 216 in the epitaxial stack 212 are substantially uniform in thickness. As described in more detail below, the epitaxial layers 216 serve as channel structures for a subsequently-formed multi-gate device and the thickness is chosen based on device performance considerations. The epitaxial layers 214 serve to reserve a spacing (or referred to as a gap) between adjacent channel structures for a subsequently-formed multi-gate device and the thickness is chosen based on device performance considerations as well. Accordingly, the epitaxial layers 214 are also referred to the sacrificial layers 214 and the epitaxial layers 216 are also referred to as the channel layers 216 or the channel structures 216.

Further, at the operation 106, a mask layer 218 is formed over the epitaxial stack 212. In some embodiments, the mask layer 218 includes a first mask layer 218A and a second mask layer 218B. The first mask layer 218A is a pad oxide layer made of silicon oxide, which can be formed by a thermal oxidation process. The second mask layer 218B is made of silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process.

Figure 5A:
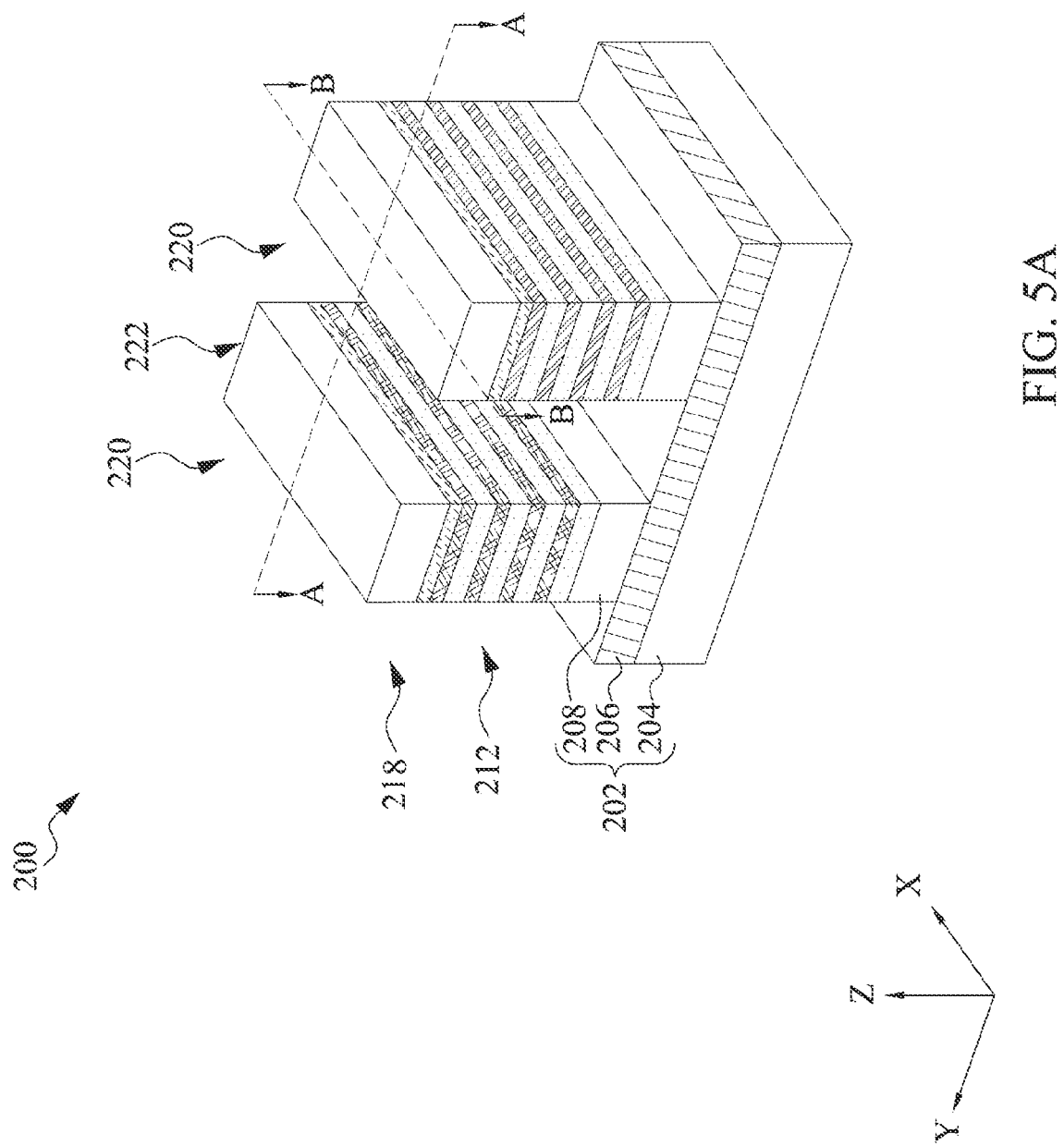
Figures 5B, 5C:
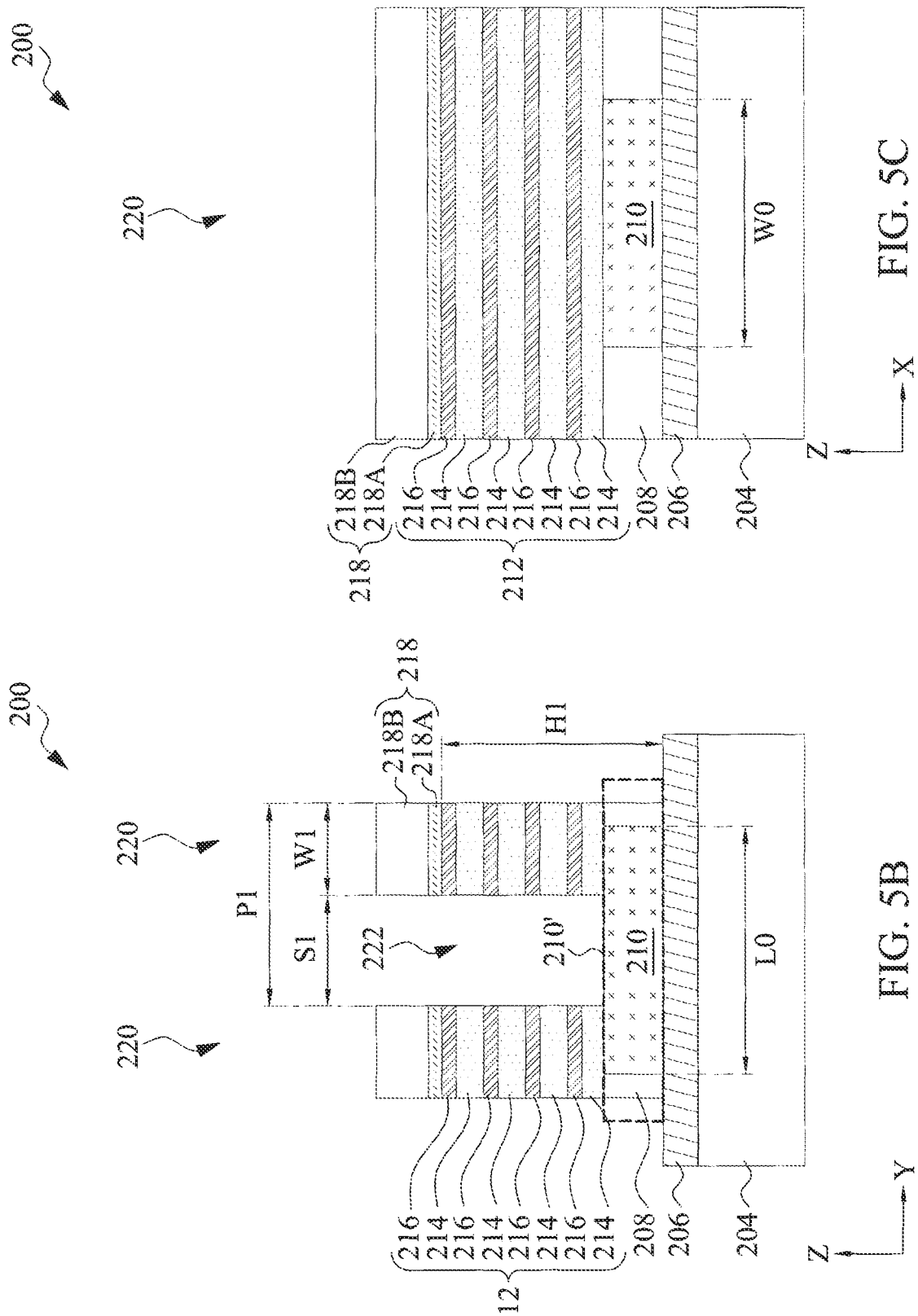

At operation 108, the method 100 (FIG. 1A) patterns the epitaxial stack 212 to form semiconductor fins 220 (also referred to as fins 220), as shown in FIGS. 5A-5C. In various embodiments, each of the fins 220 includes a top portion of the interleaved epitaxial layers 214 and 216 and a bottom portion that is formed by patterning the overlaying semiconductor layer 208. The mask layer 218 is patterned into a mask pattern by using patterning operations including photo-lithography and etching. In some embodiments, the operation 108 patterns the epitaxial stack 212 using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the epitaxial stack 212 in an etching process, such as a dry etch (e.g., reactive ion etching), a wet etch, and/or other suitable process, through openings defined in the patterned mask layer 218. The etchant is selected such that the buried insulating layer 206 and the sacrificial contact via feature 210 remain substantially intact. The stacked epitaxial layers 214 and 216 and the overlaying semiconductor layer 208 are thereby patterned into the fins 220 with trenches 222 between adjacent fins.

Still referring to FIGS. 5A-5C, each of the fins 220 protrudes upwardly in the Z-direction above the buried insulating layer 206 and extends lengthwise in the X-direction. In FIGS. 5A-5C, two (2) fins 220 are spaced apart along the Y-direction. But the number of the fins is not limited to two, and may be as small as one or more than two. In some embodiments, one or more dummy fin structures (not shown) are formed on both sides of the fins 220 to improve pattern fidelity in the patterning operations. The fin width W1 of the upper portion of the fins 220 along the Y-direction is in a range from about 6 nm to about 40 nm in some embodiments. The fin distance S1 between opposing sidewalls of adjacent two fins 220 along the Y-direction is in a range from about 36 nm to about 150 nm or even higher in some embodiments. The fin pitch P1 (P1=W1+S1) of adjacent two fins 220 along the Y-direction is in a range from about 40 nm to about 200 nm or even higher in some embodiments. The height H1 (measured from the exposed top surface of the buried insulating layer 206) of the fins 220 along the Z-direction is in a range from about 100 nm to about 200 nm in some embodiments. In some embodiments, the length L0 of the sacrificial contact via feature 210 along the Y-direction is larger than the fin distance Si but smaller than a sum of the fin pitch P1 and fin width W1 (i.e., S1<L0<P1+W1), such as equals to one fin pitch P1 (e.g., L0=P1) in one example, such that along the Y-direction each of the lateral ends of the sacrificial contact via feature 210 is covered by one of the fins 220, while a center portion of the sacrificial contact via features 210 is exposed in the trench 222. In some other embodiments, the length L0 of the sacrificial contact via feature 210 may be larger than a sum of the fin pitch P1 and fin width W1 (i.e., L0>P1+W1), such as equals to two or multiple times of the fin pitch P1 (e.g., L0=n*P1, n=2, 3, . . . ) in one example, such that along the Y-direction each of the lateral ends of the sacrificial contact via feature 210 extrudes out of the fins 220 (as illustrated by the dotted rectangular box 210' in FIG. 5B). In other words, both sidewalls of each of the fins 220 may land on the top surface of the sacrificial contact via feature 210. As a comparison, referring to FIG. 5C, the width W0 of the sacrificial contact via feature 210 along the X-direction is smaller than a length of the fin 220 in various embodiments.

Figure 6A:
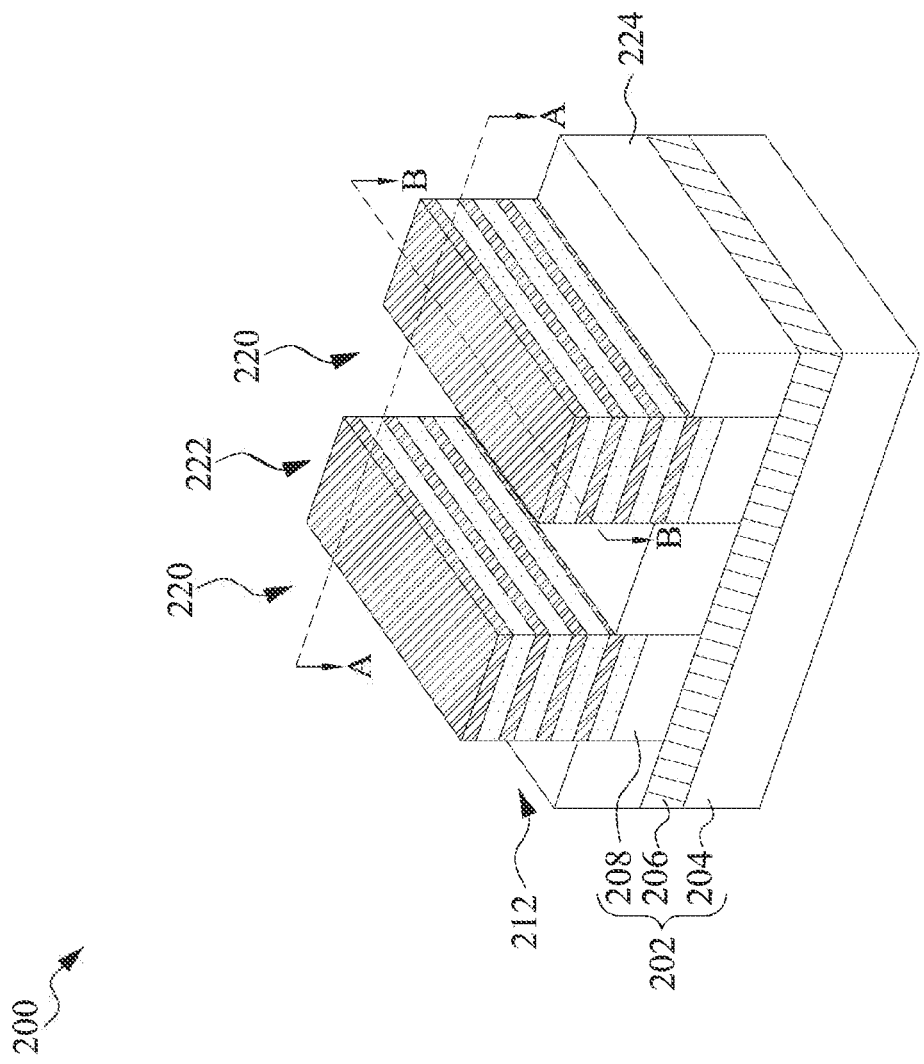

At operation 110, the method 100 (FIG. 1A) deposits a dielectric material in the trenches 222 between adjacent fins 220 to form an isolation feature 224, as shown in FIGS. 6A-6C. The isolation feature 224 may include one or more dielectric layers. Suitable dielectric materials for the isolation feature 224 may include silicon oxides, silicon nitrides, silicon carbides, fluorosilicate glass (FSG), low-K dielectric materials, and/or other suitable dielectric materials. The dielectric material may be deposited by any suitable technique including thermal growth, CVD, HDP-CVD, PVD, ALD, and/or spin-on techniques. Then, a planarization operation, such as a CMP process, is performed such that the upper surface of the topmost semiconductor layer 216 is exposed from the isolation feature 224. The isolation features 224 is subsequently recessed to form shallow trench isolation (STI) features (thus also denoted as STI features 224). Any suitable etching technique may be used to recess the isolation features 224 including dry etching, wet etching, RIE, and/or other etching methods, and in an exemplary embodiment, an anisotropic dry etching is used to selectively remove the dielectric material of the isolation features 224 without etching the fins 220. In some embodiments, the mask layer 218 is removed by a CMP process performed prior to the recessing of the isolation features 224. In some embodiments, the mask layer 218 is removed by an etchant used to recess the isolation features 224. In the illustrated embodiment, the STI feature 224 remains covering the sacrificial contact via feature 210. A top surface of the STI feature 224 may be between the top surface and the bottom surface of the bottommost epitaxial layer 216, such as in the illustrated embodiment. Alternatively, the top surface of the STI feature 224 may be between the top surface and the bottom surface of the bottommost epitaxial layer 214, in accordance with some other embodiments.

Figure 7A:
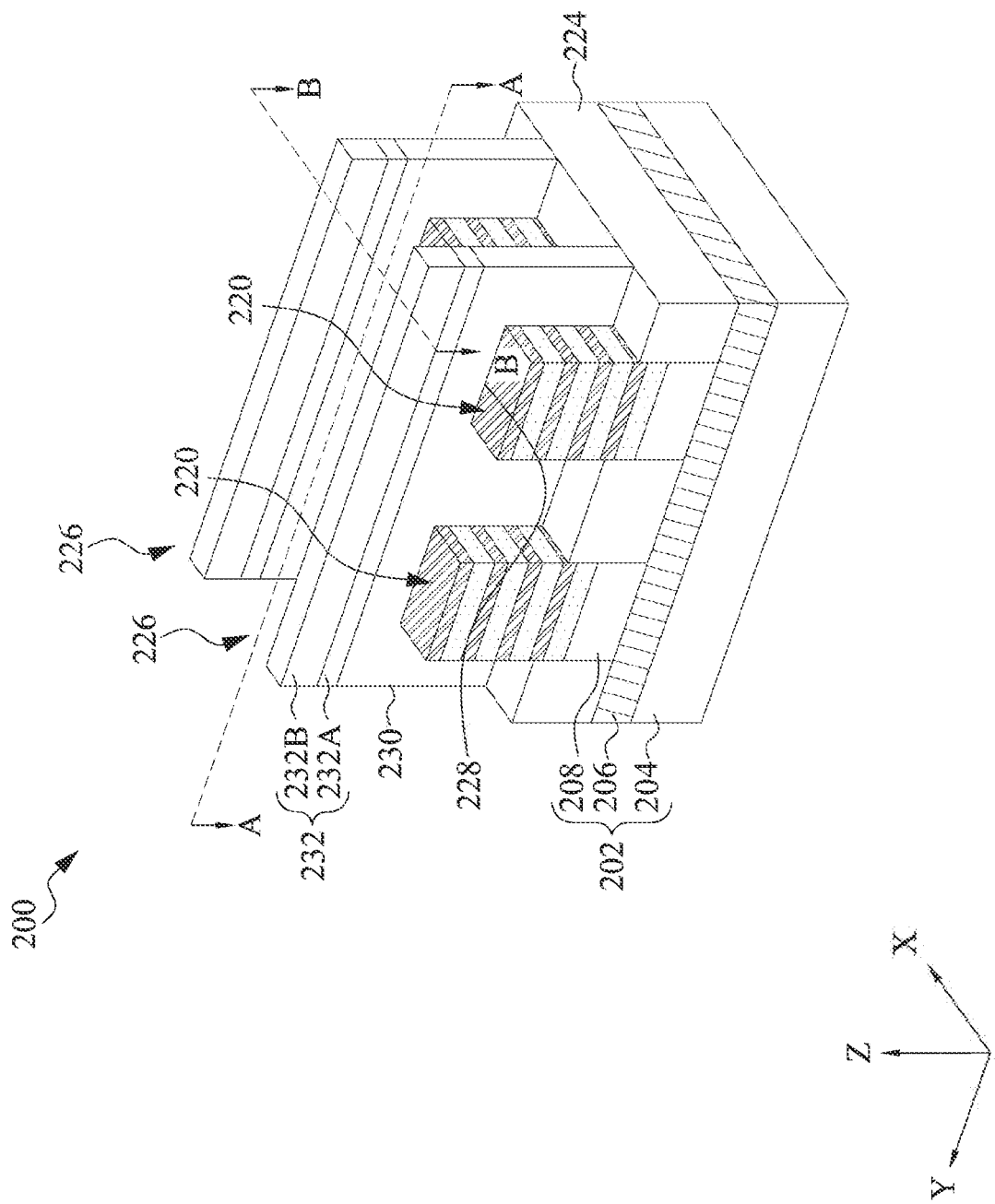
Figures 7B, 7C:
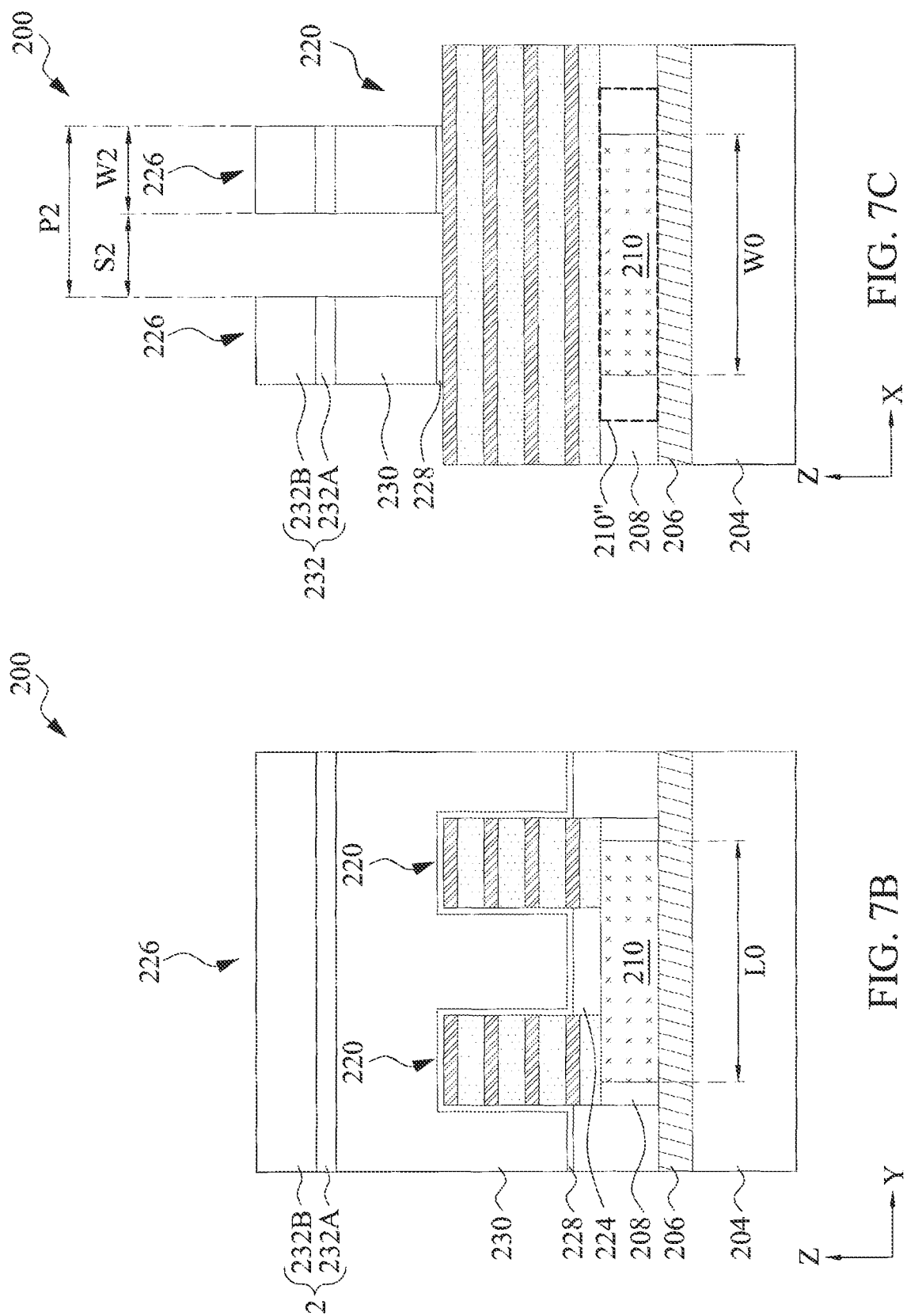

At operation 112, the method 100 (FIG. 1A) forms sacrificial (dummy) gate structures 226, as shown in FIGS. 7A-7C. The sacrificial gate structures 226 are formed over portions of the fins 220 which are to be channel regions. The sacrificial gate structures 226 define channel regions of the to-be-formed GAA transistors. Each sacrificial gate structure 226 includes a sacrificial gate dielectric layer 228 and a sacrificial gate electrode layer 230. The sacrificial gate structure 226 is formed by first blanket depositing the sacrificial gate dielectric layer 228 over the fins 220. A sacrificial gate electrode layer 230 is then deposited on the sacrificial gate dielectric layer 228 and over the fins 220. The sacrificial gate electrode layer 230 includes silicon such as polycrystalline silicon or amorphous silicon. The thickness of the sacrificial gate dielectric layer 228 is in a range from about 1 nm to about 5 nm in some embodiments. The thickness of the sacrificial gate electrode layer 230 is in a range from about 100 nm to about 200 nm in some embodiments. In some embodiments, the sacrificial gate electrode layer 230 is subjected to a planarization operation. The sacrificial gate dielectric layer 228 and the sacrificial gate electrode layer 230 may be deposited using CVD, including LPCVD and PECVD, PVD, ALD, or other suitable process. Subsequently, a mask layer 232 is formed over the sacrificial gate electrode layer. The mask layer 232 may include a pad silicon oxide layer 232A and a silicon nitride mask layer 232B. Subsequently, a patterning operation is performed on the mask layer 232 and sacrificial gate dielectric and electrode layers are patterned into the sacrificial gate structures 226. By patterning the sacrificial gate structures 226, the fins 220 are partially exposed on opposite sides of the sacrificial gate structures 226, thereby defining S/D regions. In this disclosure, a source and a drain are interchangeably used and the structures thereof are substantially the same.

In the illustrated embodiment, two (2) sacrificial gate structures 226 are formed, but the number of the sacrificial gate structures 226 is not limited to one, two, or more sacrificial gate structures, which are arranged in the X-direction. The gate width W2 of the upper portion of the sacrificial gate structure 226 along the X-direction is in a range from about 20 nm to about 100 nm in some embodiments. The gate distance S2 between opposing sidewalls of adjacent two sacrificial gate structure 226 along the X-direction is in a range from about 20 nm to about 150 nm in some embodiments. The gate pitch P2 (P2=W2+S2) of adjacent two sacrificial gate structures 226 along the X-direction is in a range from about 40 nm to about 250 nm in some embodiments. In some embodiments, the width W0 of the sacrificial contact via feature 210 along the X-direction is larger than the gate distance S2 but smaller than a sum of the gate pitch P2 and gate width W2 (i.e., S2<W0<P2+W2), such as equals to one gate pitch P2 (e.g., W0=P2) in one example, such that along the X-direction each of the lateral ends of the sacrificial contact via feature 210 is directly under one of the sacrificial gate structure 226. In some other embodiments, the width W0 of the sacrificial contact via feature 210 may be larger than a sum of the gate pitch P2 and gate width W2 (i.e., W0>P2+W2), such as equals to two or multiple times of the gate pitch P2 (e.g., W0=n*P2, n=2, 3, . . . ) in one example, such that along the X-direction each of the lateral ends of the sacrificial contact via feature 210 extrudes out of the sacrificial gate structure 226 (as illustrated by the dotted rectangular box 210" in FIG. 7C). In other words, both sidewalls of each of the sacrificial gate structures 226 may be directly above the top surface of the sacrificial contact via feature 210.

Figure 8A:
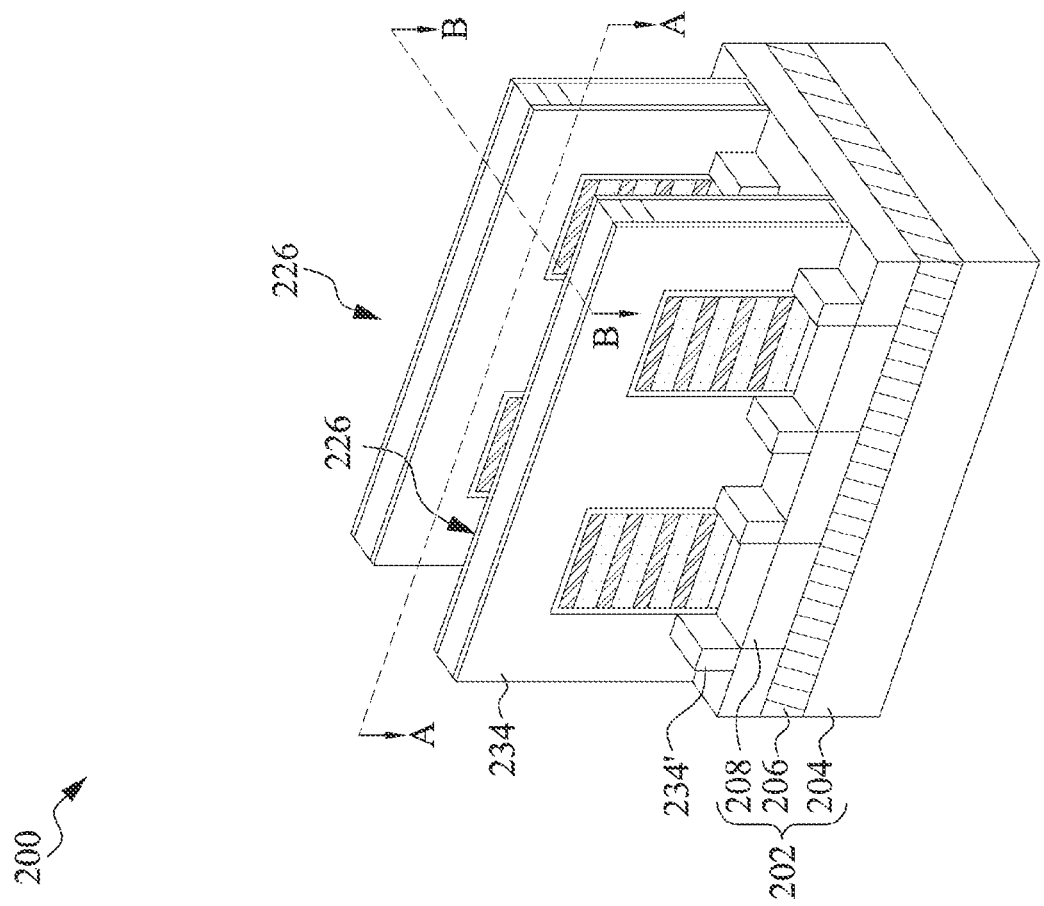
Figures 8B, 8C:
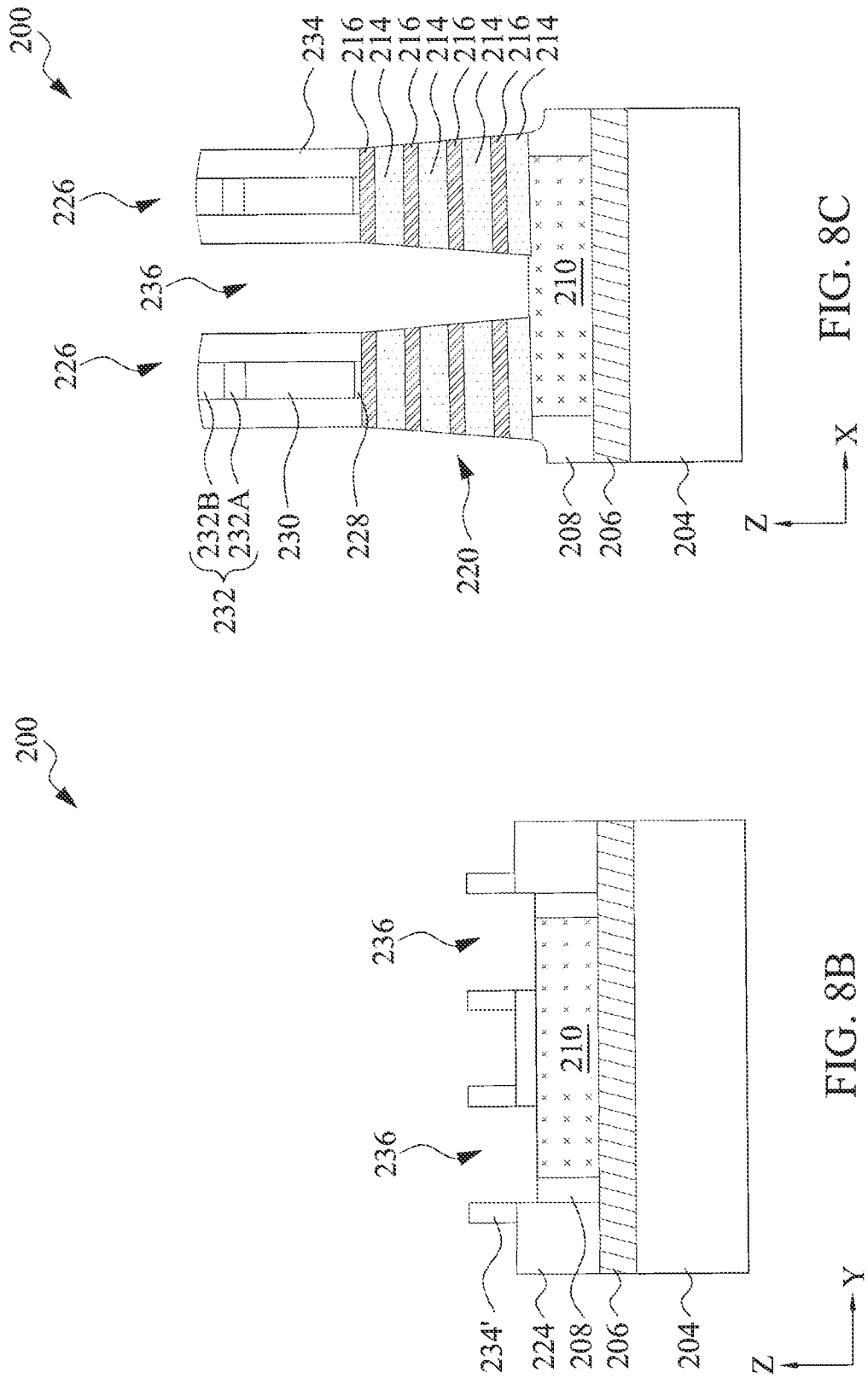

At operation 114, the method 100 (FIG. 1A) forms gate spacers 234 on sidewalls of the sacrificial gate structures 226, as shown in FIGS. 8A-8C. The gate spacers 234 may also cover sidewalls of the fins 220, which are termed as fin spacers 234' for this portion of the gate spacers. The gate spacers 234 may include a dielectric material such as silicon oxide, silicon nitride, silicon carbide, silicon oxynitride, SiCN films, silicon oxycarbide, SiOCN films, and/or combinations thereof. In some embodiments, the gate spacers 234 include multiple layers, such as main spacer walls, liner layers, and the like. By way of example, the gate spacers 234 may be formed by blanket depositing a dielectric material layer in a conformal manner over the sacrificial gate structures 226 using processes such as, a CVD process, a sub-atmospheric CVD (SACVD) process, a flowable CVD process, an ALD process, a PVD process, or other suitable process. In the illustrated embodiment, the deposition of the dielectric material layer is followed by an etching-back (e.g., anisotropically) process to remove the dielectric material layer from horizontal surfaces and expose the top surface of the sacrificial gate structures 226 and the top surface of the fins 220 adjacent to but not covered by the sacrificial gate structures 226 (e.g., S/D regions). The dielectric material layer may remain on the sidewalls of the sacrificial gate structures 226 as the gate spacers 234 (and/or on the sidewalls of the fins 220 as the fin spacers 234'). In some embodiments, the etching-back process may include a wet etch process, a dry etch process, a multiple-step etch process, and/or a combination thereof. The gate spacers 234 may have a thickness ranging from about 5 nm to about 20 nm, in accordance with some embodiments.

Still referring to FIGS. 8A-8C, at operation 116, the method 100 (FIG. 1A) recesses portions of the fins 220 to form S/D trenches (recesses) 236 in the S/D regions. The stacked epitaxial layers 214 and 216 are etched down at the S/D regions. In many embodiments, operation 116 forms the S/D trenches 236 by a suitable etching process, such as a dry etching process, a wet etching process, or an RIE process. The etching process at operation 116 may implement a dry etching process using an etchant including a bromine-containing gas (e.g., HBr and/or $CHBR_3$), a fluorine-containing gas (e.g., $CF_4$, $SF_6$, $CH_2F_2$, $CHF_3$, and/or $C_2F_6$), other suitable gases, or combinations thereof. The etchant is selected such that the overlaying semiconductor layer 208, the sacrificial contact via feature 210, and the STI features 224 remain substantially intact and are exposed in the S/D trenches 236.

Figure 9A:
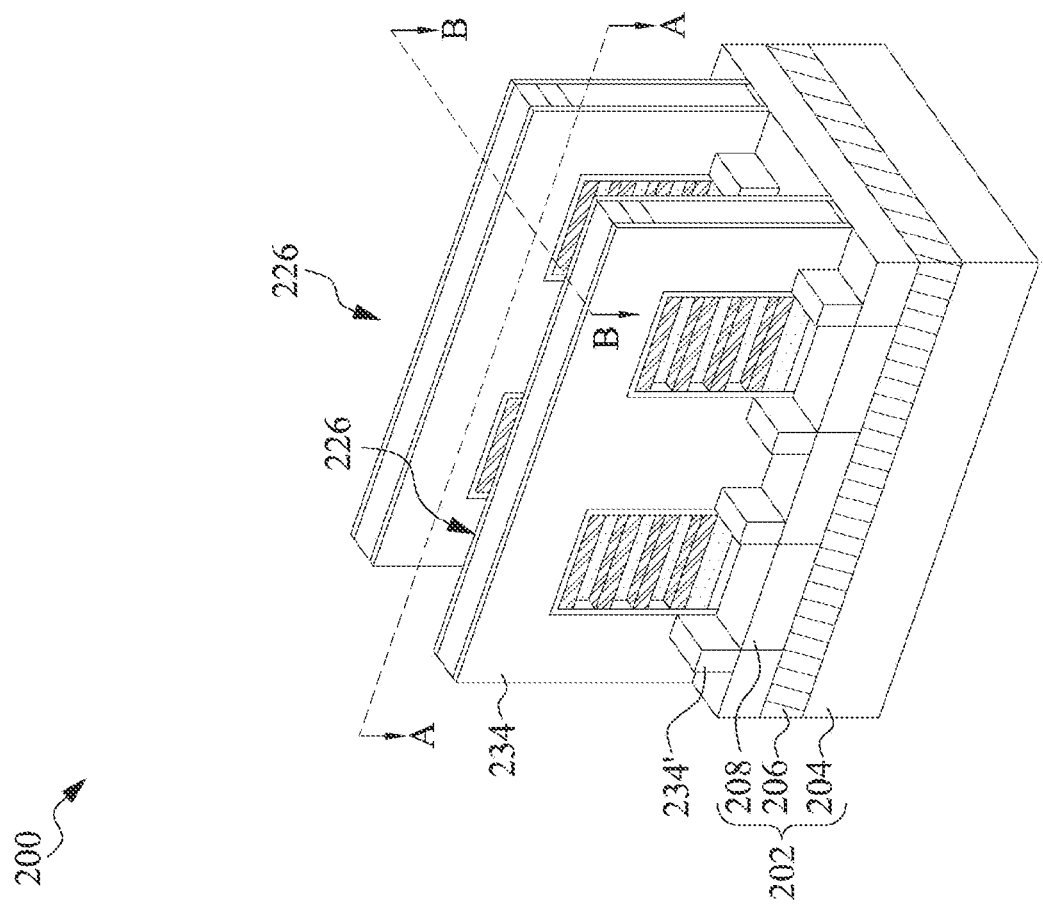

At operation 118, the method 100 (FIG. 1A) laterally etches end portions of the epitaxial layers 214, thereby forming cavities 238, as shown in FIGS. 9A-9C. The amount of the etching of the epitaxial layers 214 is in a range from about 1 nm to about 4 nm in some embodiments. The epitaxial layers 214 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. Alternatively, operation 118 may first selectively oxidize lateral ends of the epitaxial layers 214 that are exposed in the S/D trenches 236 to increase the etch selectivity between the epitaxial layers 214 and 216. In some examples, the oxidation process may be performed by exposing the device 200 to a wet oxidation process, a dry oxidation process, or a combination thereof. Further, as discussed above, during the forming of the bottommost epitaxial layer 214, it may include a different Ge molar ratio (e.g., smaller) than other upper epitaxial layers 214, and the selective etching process may be tuned to have a higher etching rate to the upper epitaxial layers 214 and thus limit the cavities 238 to be formed abutting the recessed lateral ends of the upper epitaxial layers 214 but not the bottommost one, as shown in the illustrated embodiment.

Figure 10A:
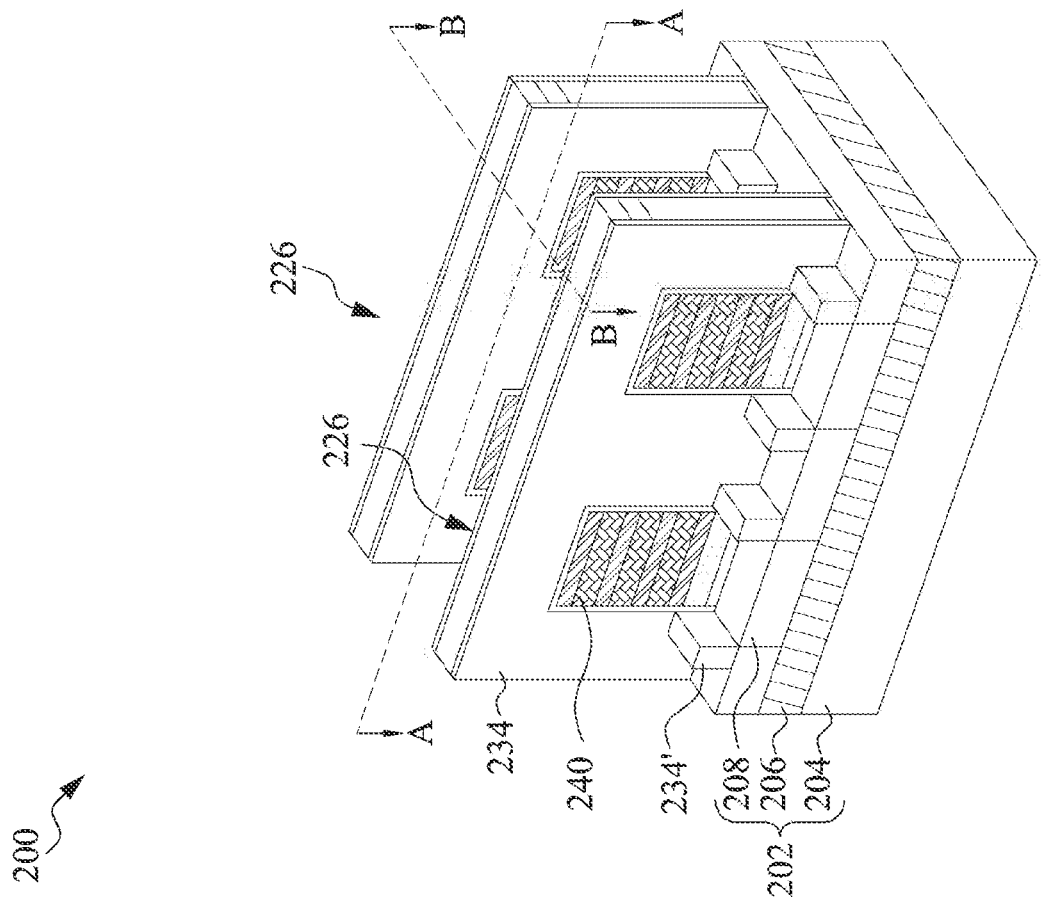
Figures 10B, 10C:
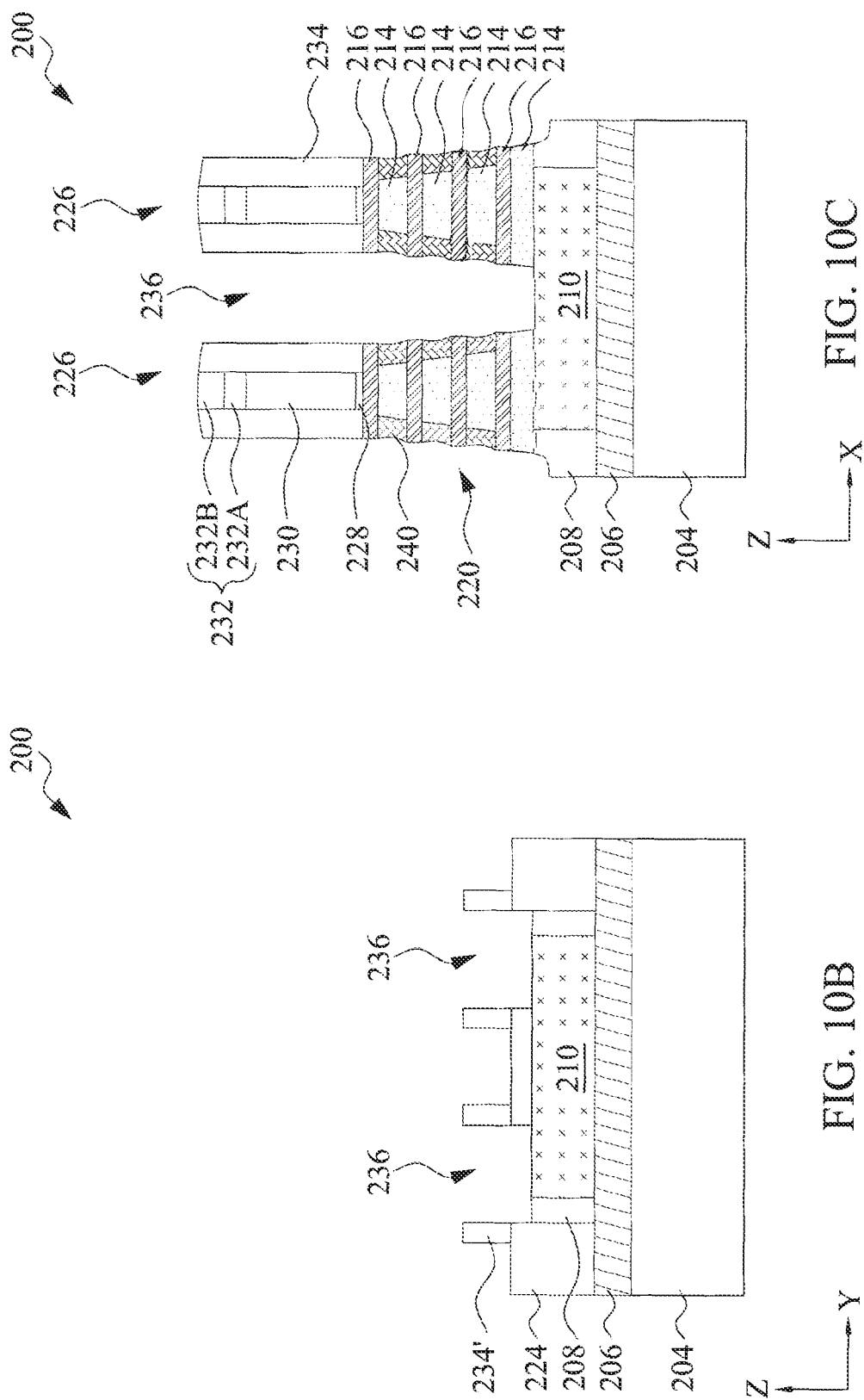

At operation 120, the method 100 (FIG. 1A) forms inner spacers 240 on the recessed lateral ends of the upper epitaxial layers 214, as shown in FIGS. 10A-10C. By way of example, operation 120 may include blanket depositing an inner spacer material layer in the S/D trenches 236. Particularly, the inner spacer material layer is deposited on the recessed lateral ends of the upper epitaxial layers 214 exposed in the cavities 238 and on the sidewalls of the bottommost epitaxial layer 214 and the epitaxial layers 216 exposed in the S/D recesses 236. The inner spacer material layer may include silicon oxides, silicon nitrides, silicon carbides, silicon carbide nitride, silicon oxide carbide, silicon carbide oxynitride, and/or other suitable dielectric materials. In some embodiments, the inner spacer material layer is deposited as a conformal layer with substantially uniform thickness on different surfaces. The inner spacer material layer can be formed by ALD or any other suitable method.

By conformally forming the inner spacer material layer, a volume of the cavities 238 is reduced or completely filled. After the inner spacer material layer is deposited, an etching operation is performed to partially remove the inner spacer material layer from the S/D trenches 236. Particularly, the inner spacer material layer is removed from the sidewalls of the bottommost epitaxial layer 214 and the epitaxial layers 216. By this etching, the inner spacer material layer remains substantially within the cavity 238, because of a small volume of the cavity. Generally, plasma dry etching etches a layer in wide and flat areas faster than a layer in concave (e.g., holes, grooves and/or slits) portions. Thus, the inner spacer material layer can remain inside the cavities 238. The remaining portions of the inner spacer material layer inside the cavities 238 provides isolation between to-be-formed metal gate structures and to-be-formed S/D epitaxial features, which are referred to as the inner spacers 240.

Figure 11A:
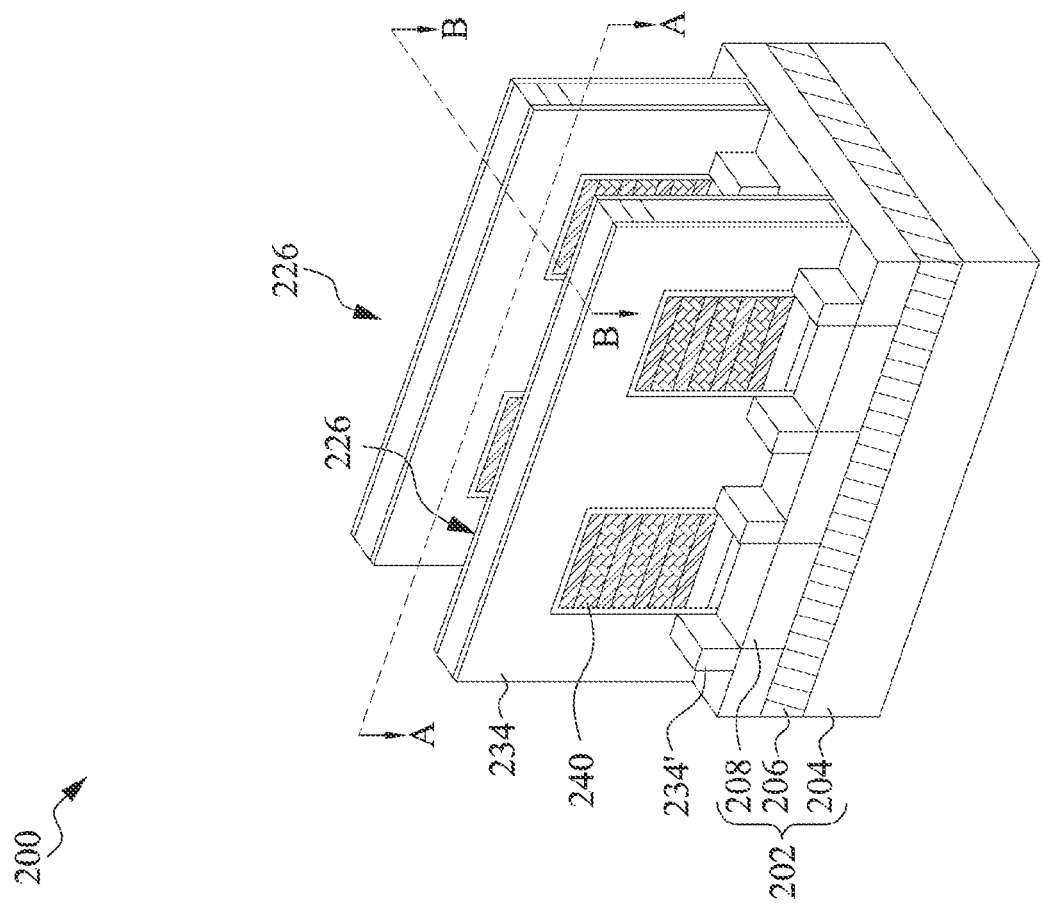

At operation 122, the method 100 (FIG. 1A) removes the bottommost epitaxial layer 214, as shown in FIGS. 11A-11C. In some embodiments, the bottommost epitaxial layer 214 is removed from the S/D trenches 236 in a selective etching process, while the epitaxial layers 216, the inner spacers 240, the overlaying semiconductor layer 208, and the sacrificial contact via feature 210 remain substantially intact. The selective etching process can include dry etching, wet etching, reactive ion etching (RIE), and/or other suitable processes.

Figure 12A:
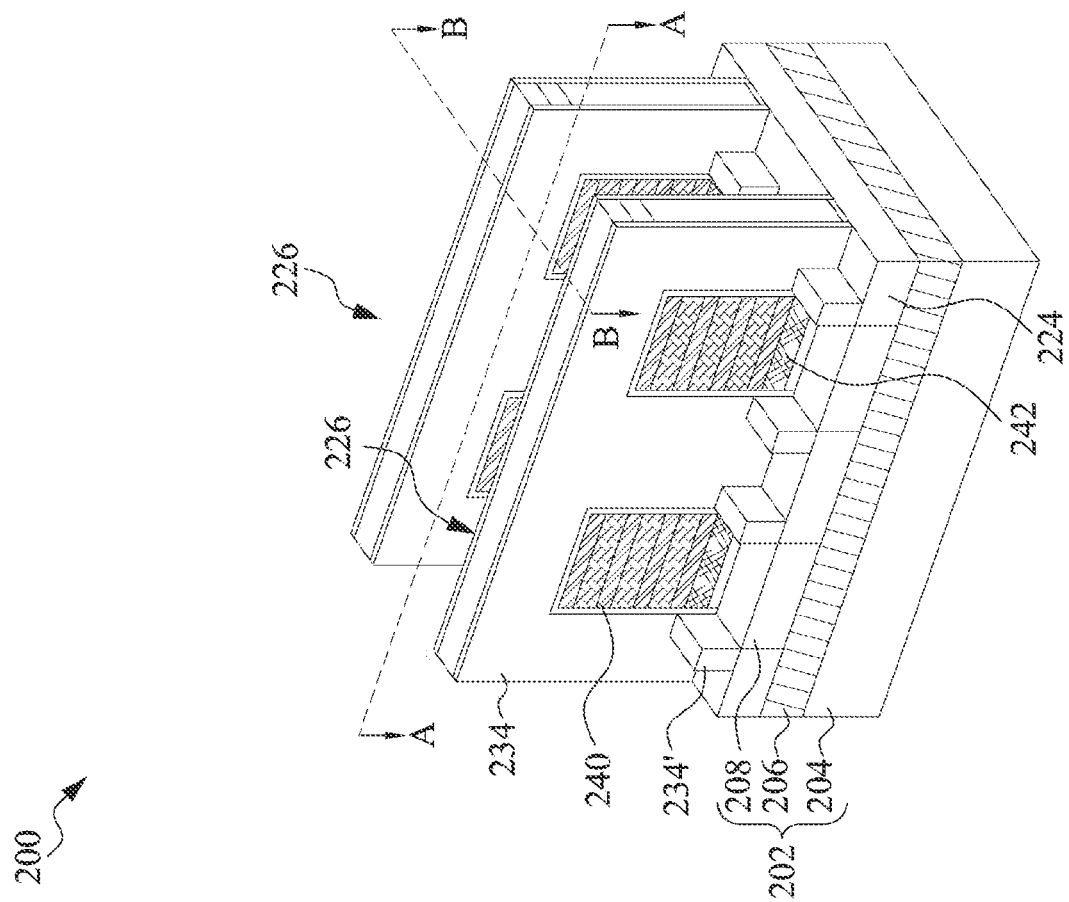
Figures 12B, 12C:
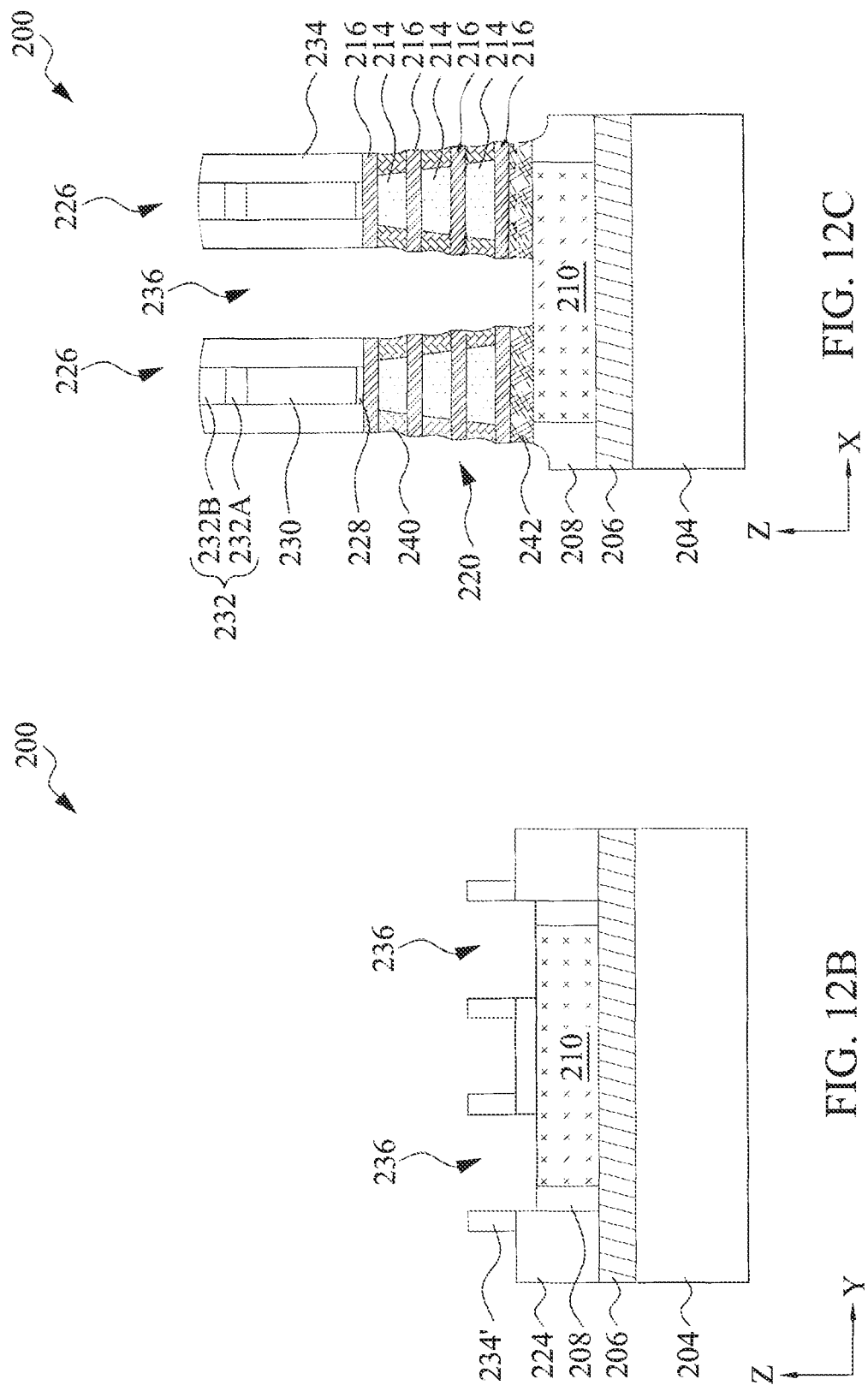

At operation 124, the method 100 (FIG. 1B) forms a self-aligned contact (SAC) layer 242 under the bottommost epitaxial layer 216 and filling the space formed by removing the bottommost epitaxial layer 214 at operation 122, as shown in FIGS. 12A-12C. The SAC layer 242 may include silicon oxide ($SiO_2$), aluminum oxide (AlO), silicon nitride (SiN), silicon oxynitride (SiON), silicon carbonitride (SiCN), or silicon carbon oxynitride (SiCON). The SAC layer 242 may include the same or different dielectric material compositions with the inner spacers 240, in accordance with some embodiments. Generally, the compositions of the SAC layer 242 and the sacrificial contact via feature 210 are selected such that there is a high etch selectivity therebetween. As to be discussed in further details below, the SAC layer 242 is used as an etch stop layer during an etch process in removing the sacrificial contact via feature 210 later on. In some embodiments, the SAC layer 242 is first deposited in the S/D trenches 236 using CVD, PVD, ALD, or other suitable process, filling the space under the bottommost epitaxial layer 216 and over the sidewalls of the S/D trenches 236. Subsequently, an etching-back process is performed to remove portions of the SAC layer 242 from the sidewalls of the S/D trenches 236, while other portions of the SAC layer 242 underneath the bottommost epitaxial layer 216 remain. Any suitable etching technique may be used to partially remove the SAC layer 242 from the S/D trenches 236 including dry etching, wet etching, RIE, and/or other etching methods, and in an exemplary embodiment, an anisotropic dry etching is used.

Figure 13A:
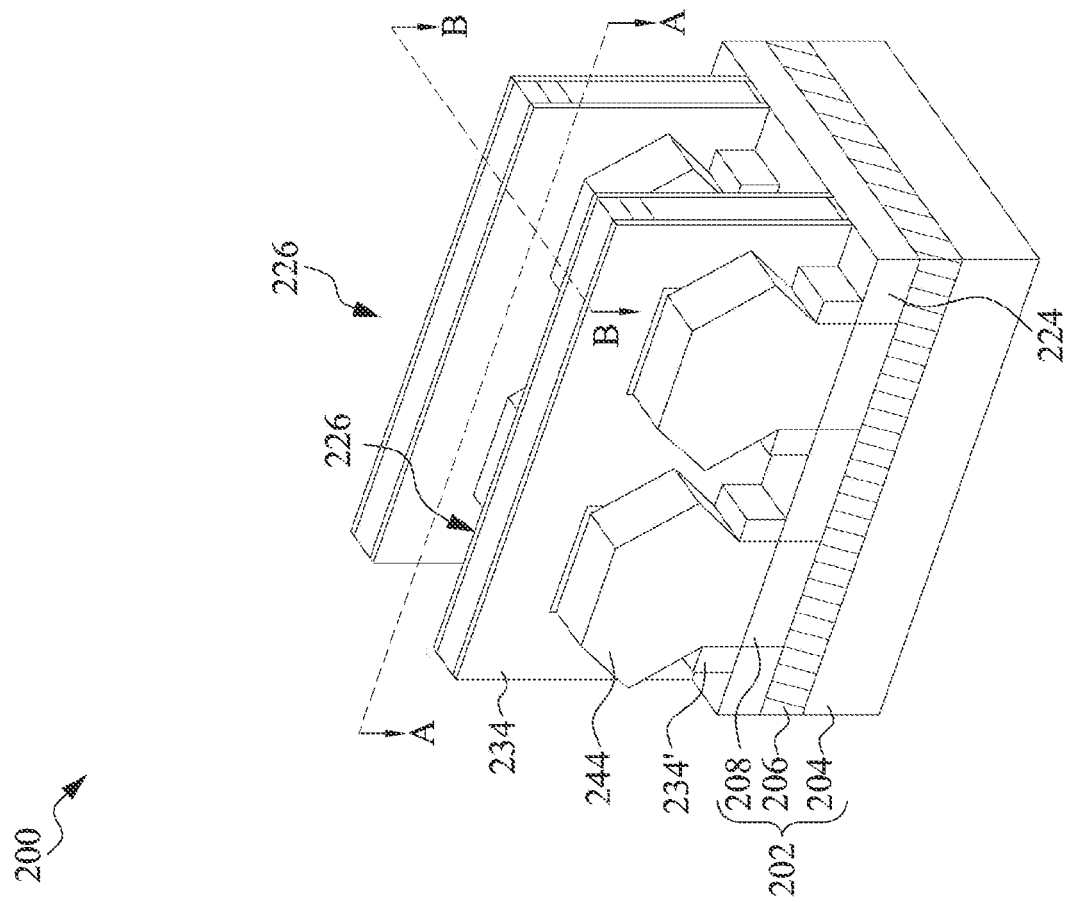
Figures 13B, 13C:
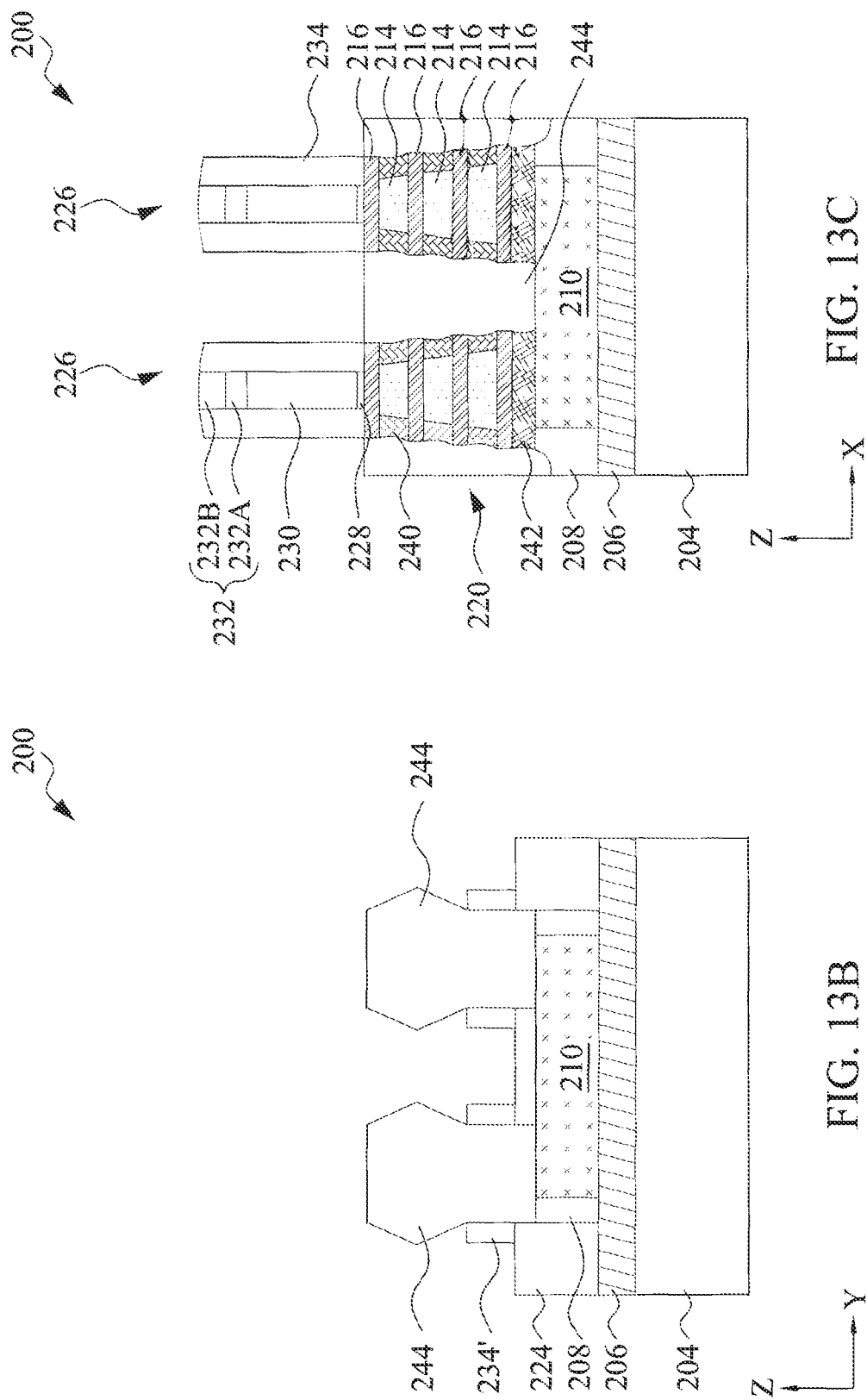

At operation 126, the method 100 (FIG. 1B) forms S/D epitaxial features 244 in the S/D trenches 236, as shown in FIGS. 13A-13C. In some embodiments, the S/D epitaxial features 244 include epitaxially grown semiconductor materials such as epitaxially grown silicon, germanium, or silicon germanium. The S/D epitaxial features 244 can be formed by any epitaxy processes including chemical vapor deposition (CVD) techniques (for example, vapor phase epitaxy and/or Ultra-High Vacuum CVD), molecular beam epitaxy, other suitable epitaxial growth processes, or combinations thereof. The S/D epitaxial features 244 may be doped with n-type dopants and/or p-type dopants. In some embodiments, for n-type transistors, the S/D epitaxial features 244 include silicon and can be doped with carbon, phosphorous, arsenic, other n-type dopant, or combinations thereof (for example, forming Si:C S/D epitaxial features, Si:P S/D epitaxial features, or Si:C:P S/D epitaxial features). In some embodiments, for p-type transistors, the S/D epitaxial features 244 include silicon germanium or germanium, and can be doped with boron, other p-type dopant, or combinations thereof (for example, forming Si:Ge:B S/D epitaxial features). The S/D epitaxial features 244 may include multiple epitaxial semiconductor layers having different levels of dopant density. In some embodiments, annealing processes (e.g., rapid thermal annealing (RTA) and/or laser annealing) are performed to activate dopants in the S/D epitaxial features 244.

Figure 14A:
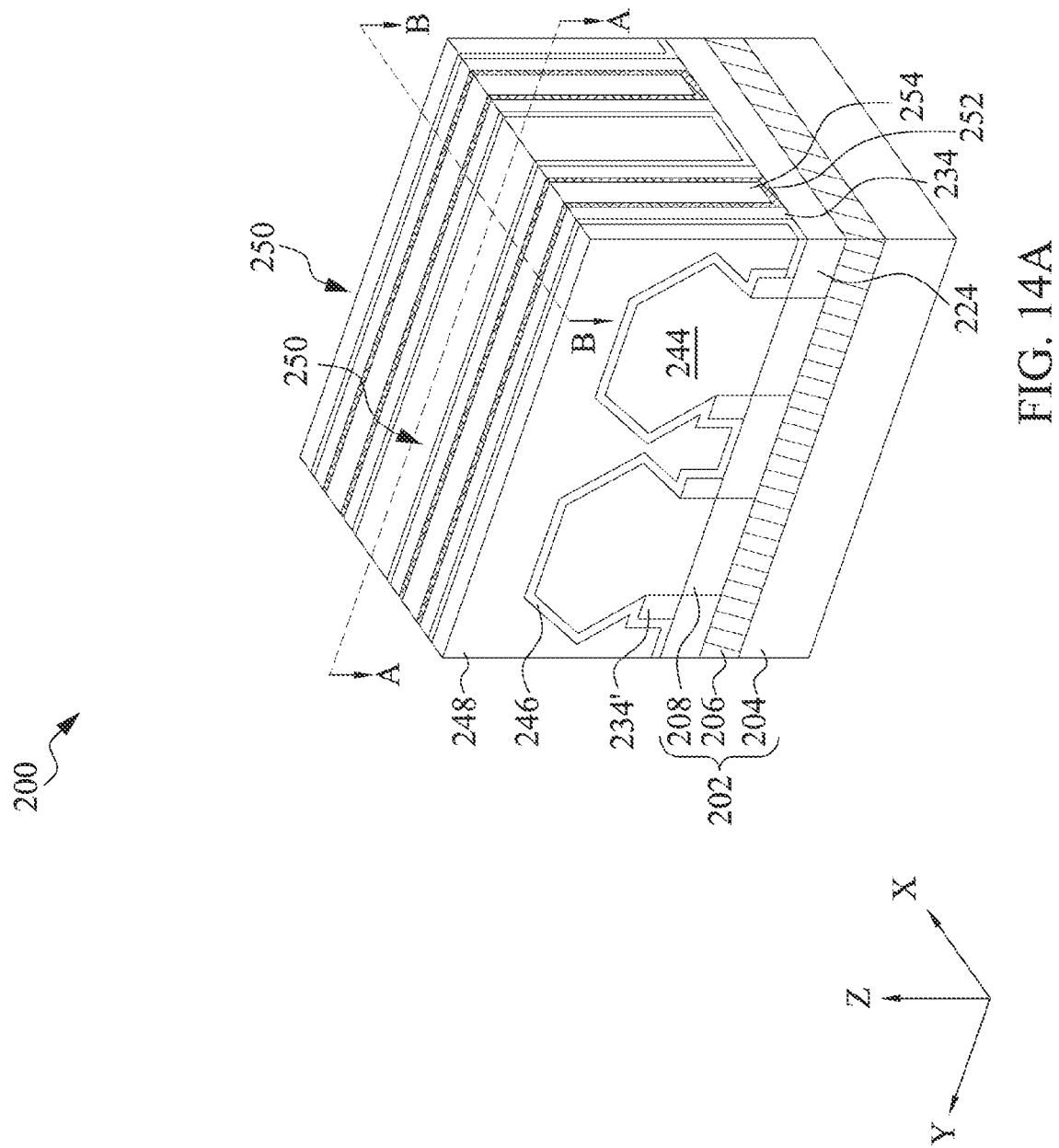
Figure 14C:
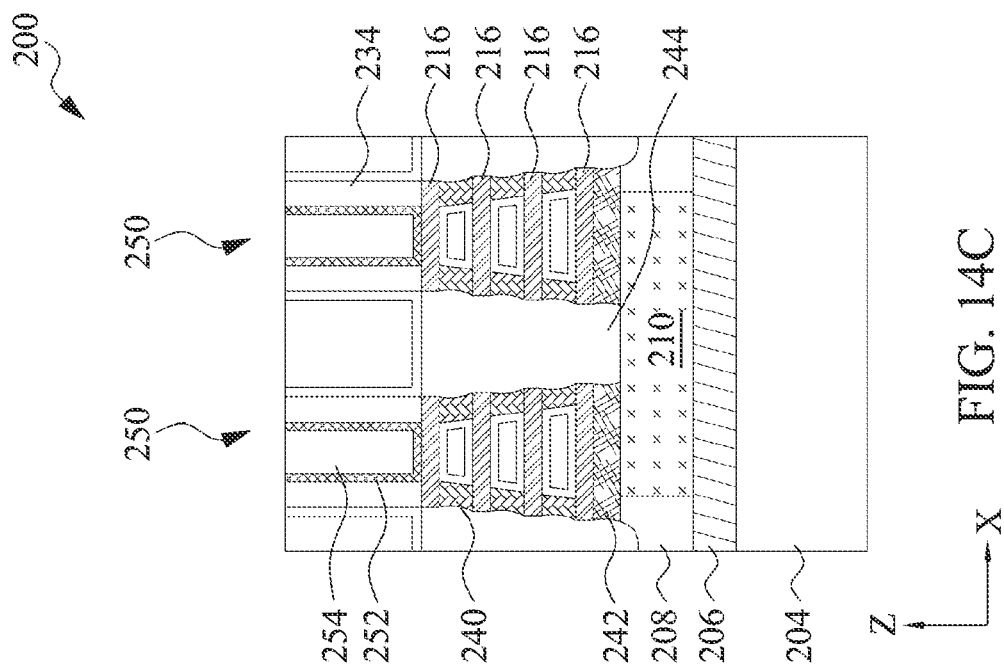
Figure 14B:
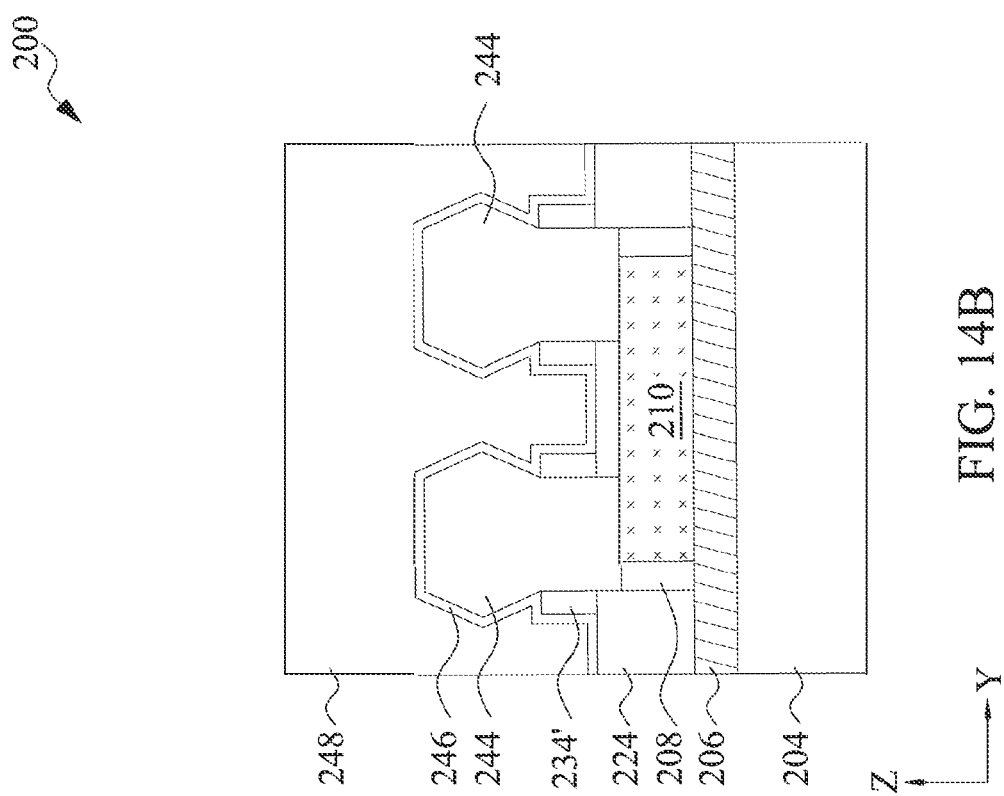

At operation 128, the method 100 (FIG. 1B) forms a contact etch stop layer (CESL) 246 over the S/D epitaxial features 244 and an interlayer dielectric (ILD) layer 248 over the CESL layer 246, as shown in FIGS. 14A-14C. The CESL layer 246 may include silicon nitride, silicon oxynitride, silicon nitride with oxygen (O) or carbon (C) elements, and/or other materials; and may be formed by CVD, PVD (physical vapor deposition), ALD, or other suitable methods. The ILD layer 248 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 248 may be formed by PECVD or FCVD (flowable CVD), or other suitable methods. In some embodiments, forming the ILD layer 248 further includes performing a CMP process to planarize a top surface of the device 200, such that the mask layer 232 over top portions of the sacrificial gate structures 226 are removed.

Still referring to FIGS. 14A-14C, at operation 130, the method 100 (FIG. 1B) replaces the sacrificial gate structures 226 with metal gate structures 250. By way of example, operation 130 may first removes the sacrificial gate structures 226 to form gate trenches in an etch process, such as plasma dry etching and/or wet etching. The gate trenches expose the epitaxial layers 214 and 216 in channel regions. The operation 130 then releases channel structures from channel regions. In the illustrated embodiment, channel structures are the epitaxial layers 216 in the form of nanosheets. In the present embodiment, the epitaxial layers 216 include silicon, and the epitaxial layers 214 include silicon germanium. The epitaxial layers 214 may be selectively removed. In some implementations, the selectively removal process includes oxidizing the epitaxial layers 214 using a suitable oxidizer, such as ozone. Thereafter, the oxidized epitaxial layers 214 may be selectively removed from the gate trenches. To further this embodiment, operation 130 includes a dry etching process to selectively remove the epitaxial layers 214, for example, by applying an HCl gas at a temperature of about 500° C. to about 700° C., or applying a gas mixture of $CF_4$, $SF_6$, and $CHF_3$. For the sake of simplicity and clarity, after the channel structure release, the epitaxial layers 216 are denoted as the channel structures 216. Subsequently, operation 130 forms the metal gate structures 250 in the gate trenches, wrapping each of the channel structures 216 in the channel regions. The inner spacers 240 separate the metal gate structures 250 from contacting the S/D epitaxial features 244.

The metal gate structures 250 include a gate dielectric layer 252 wrapping each channel structures 216 in the channel regions and a gate electrode layer 254 formed on the gate dielectric layer 252. In some embodiments, the gate dielectric layer 252 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 252 includes an interfacial layer formed between the channel structures and the high-k dielectric material. The gate dielectric layer 252 may be formed by CVD, ALD or any suitable method. In one embodiment, the gate dielectric layer 252 is formed using a highly conformal deposition process such as ALD in order to ensure the formation of a gate dielectric layer having a uniform thickness around each channel layers. The gate electrode layer 254 is formed on the gate dielectric layer 252 to surround each channel structure 216. The gate electrode layer 254 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 256 may be formed by CVD, ALD, electro-plating, or other suitable method. In certain embodiments of the present disclosure, one or more work function adjustment layers are interposed between the gate dielectric layer and the gate electrode layer. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-type transistors and the p-type transistors which may use different metal layers.

Figure 15A:
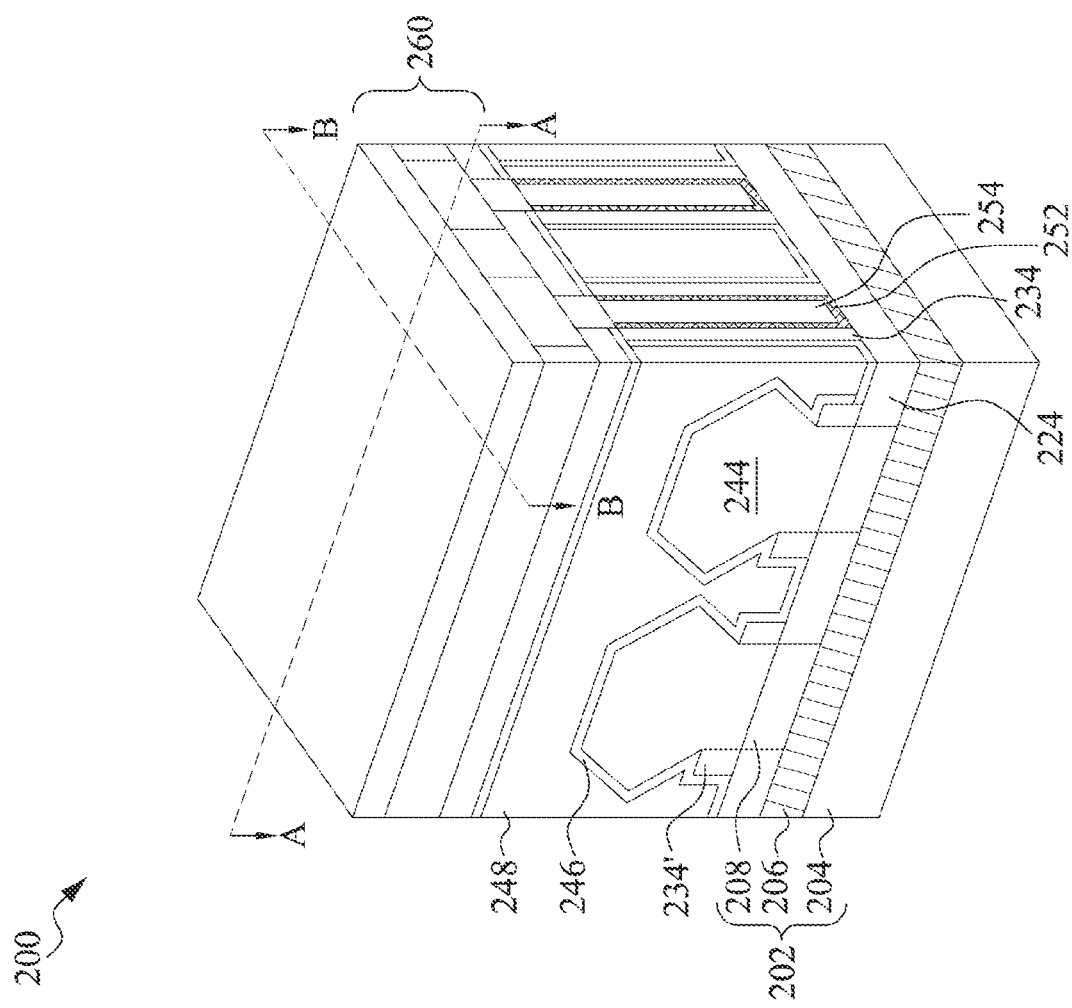
Figure 15C:
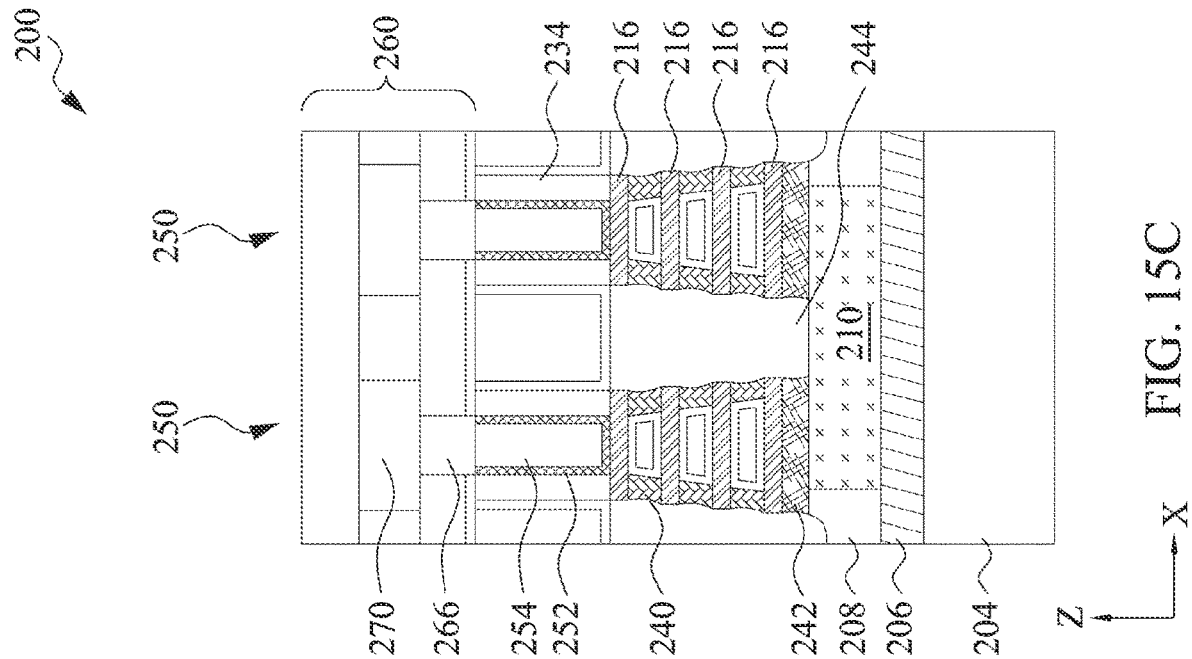
Figure 15B:
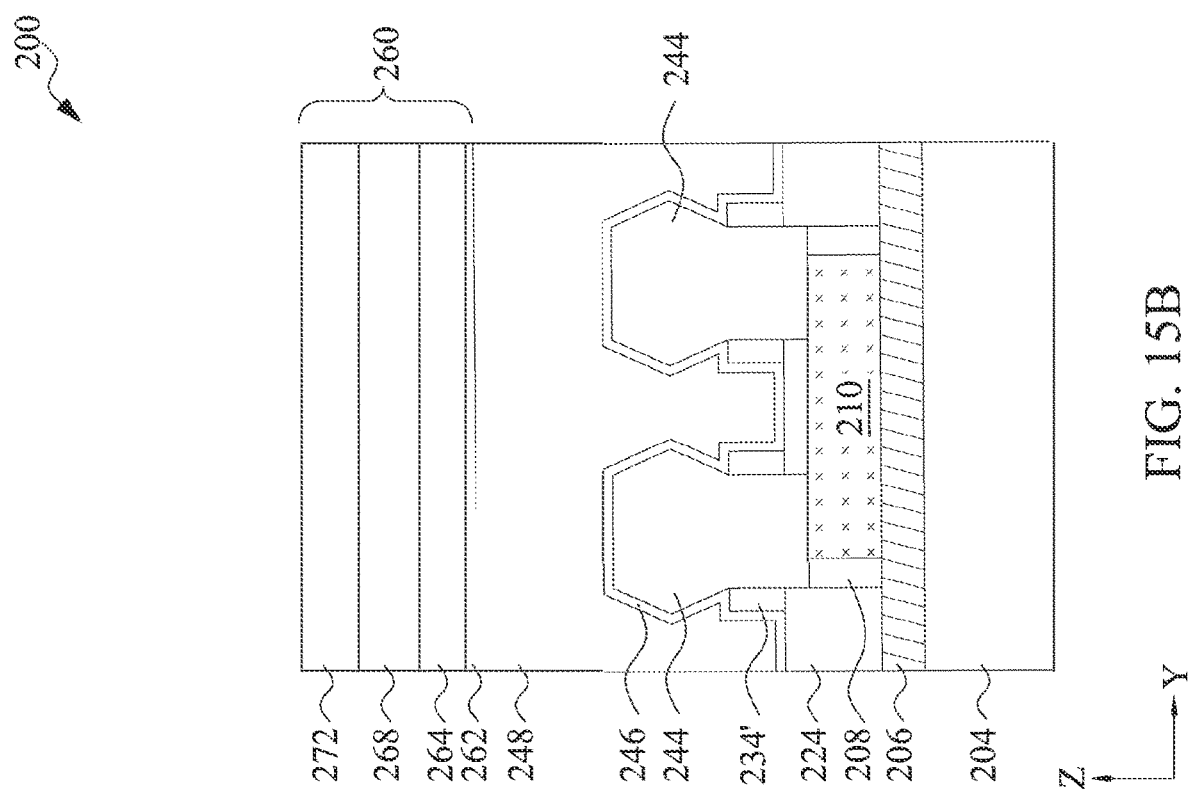

At operation 132, the method 100 (FIG. 1B) forms one or more interconnect layers 260 with contacts, vias, and wires embedded in dielectric layers, as shown in FIGS. 15A-15C. The one or more interconnect layers 260 connect gate, source, and drain electrodes of various transistors, as well as other circuits in the device 200, to form an integrated circuit in part or in whole. In some embodiments, the operation 132 includes performing one or more middle-end-of-line (MEOL) and back-end-of-line (BEOL) processes. This may include forming a metal contact plug (e.g., metal contact plugs 288 in FIG. 24) to a source/drain feature, additional etch stop layer (e.g., etch stop layer 262) and ILD layer (e.g., ILD layer 264) formation, formation of gate contact vias (e.g., gate contact via 266) and source/drain contact vias (not shown), formation of intermetal dielectric (IMD) layers (e.g., IMD layer 268), metal lines (e.g., metal line 270), contact pads (not shown), etc. The device 200 may further include passivation layers (e.g., passivation layer 272) and/or other layers built on the frontside of the device 200. These layers and the one or more interconnect layers are collectively denoted with the label 260.

Figure 16A:
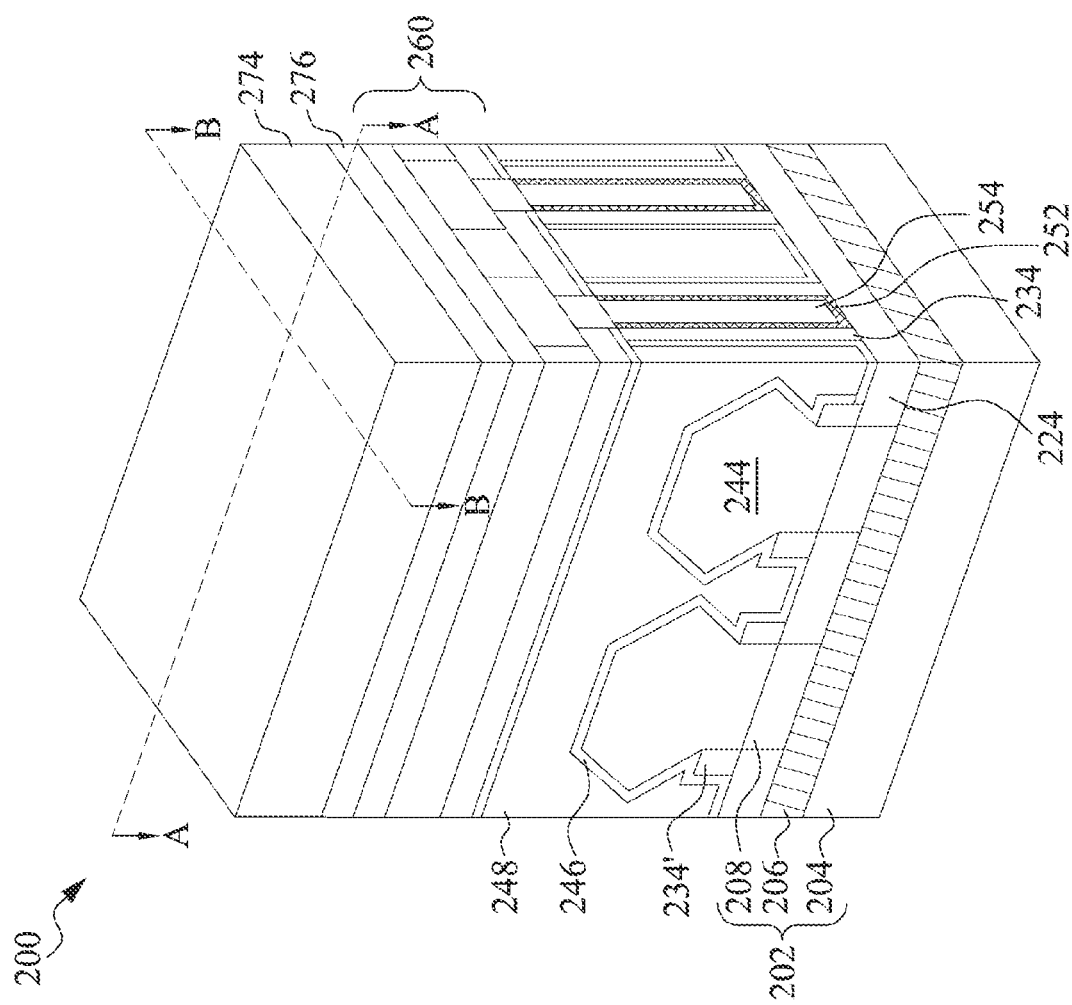
Figure 17A:
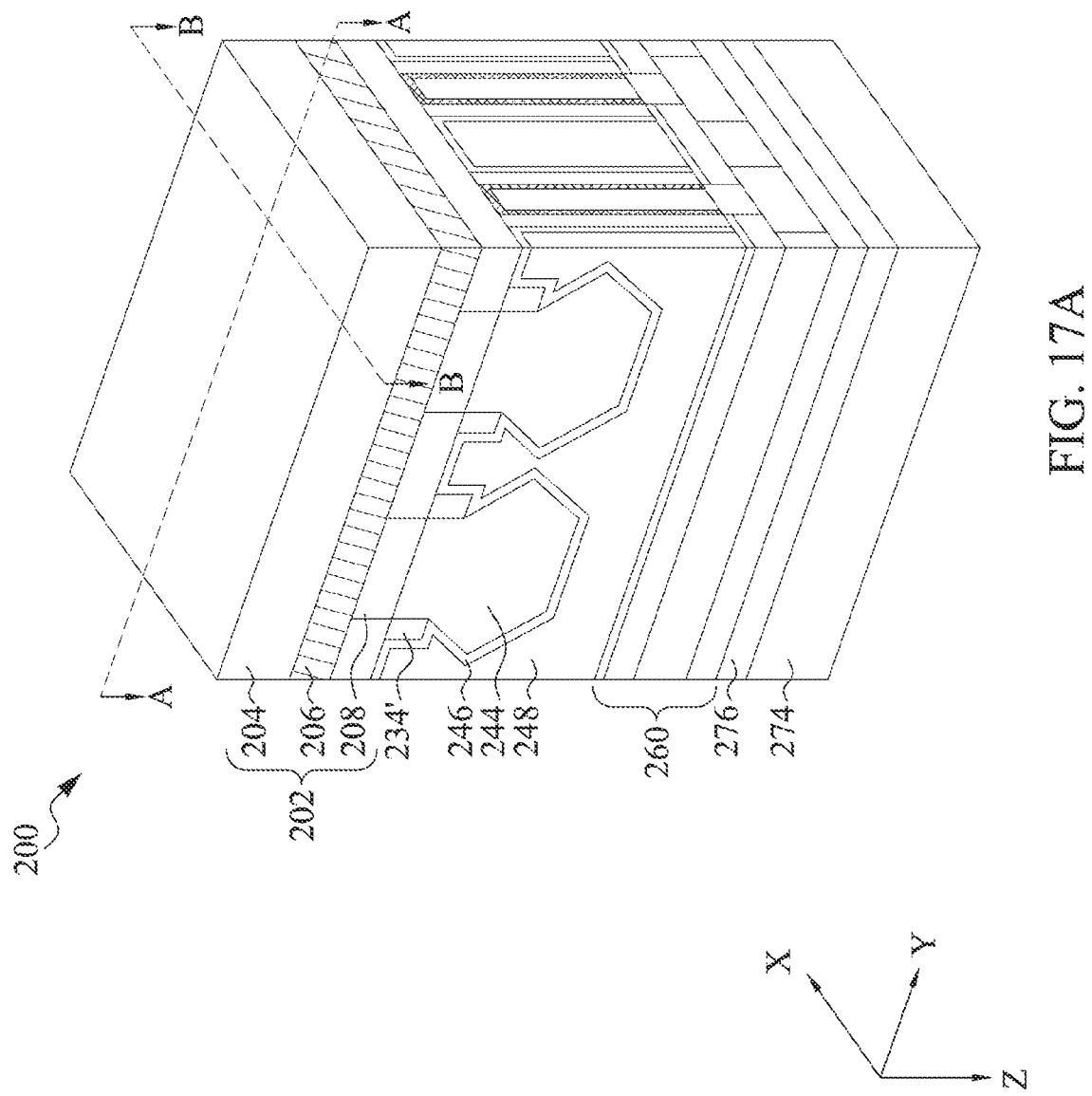
Figure 17C:
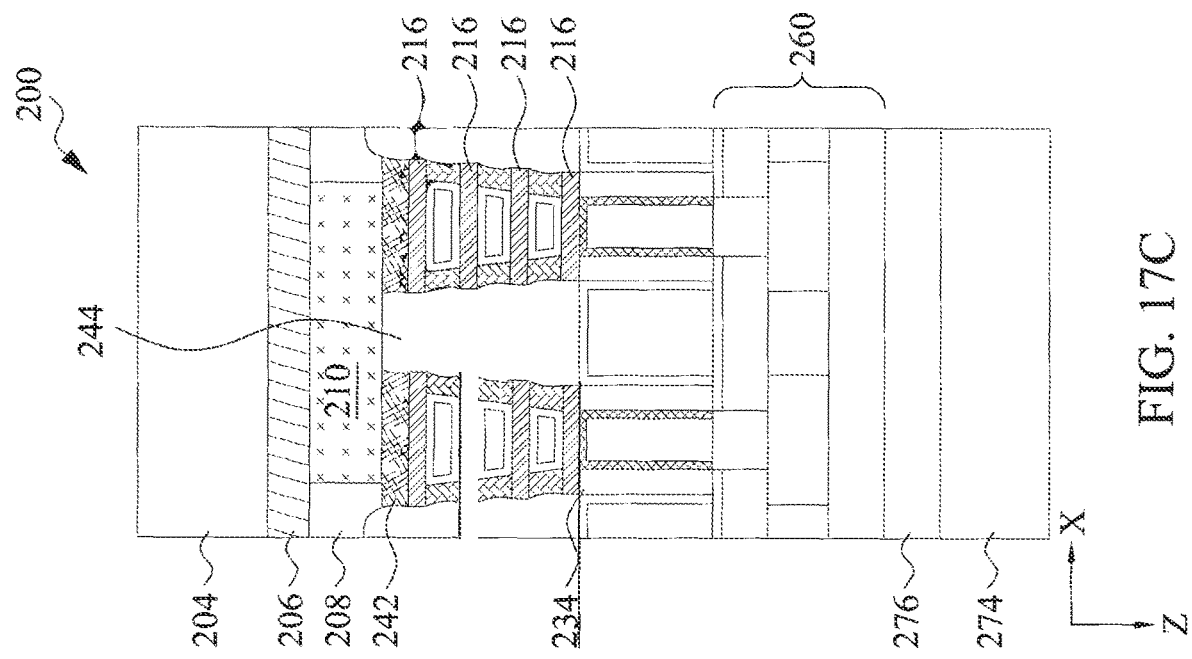
Figure 17B:
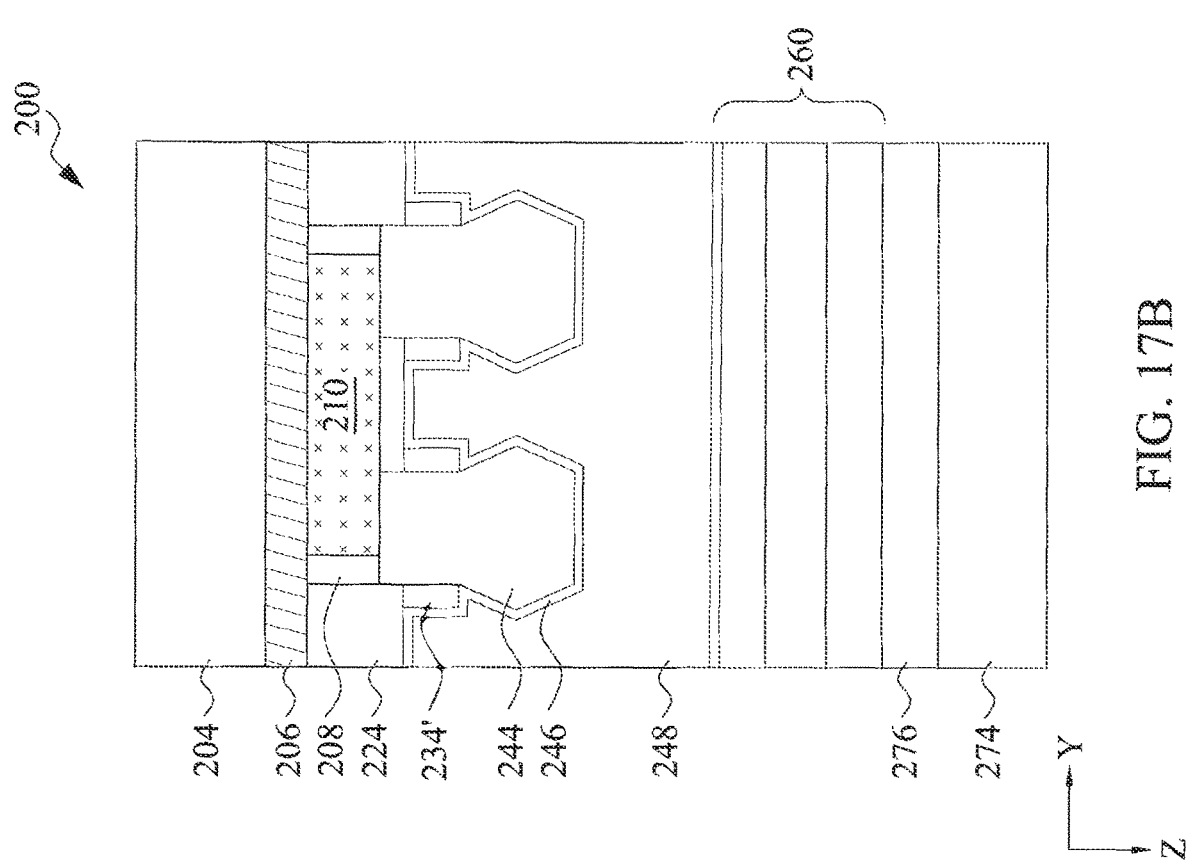

At operation 134, the method 100 (FIG. 1B) attaches the frontside of the device 200 to a carrier 274, as shown in FIGS. 16A-16C. The carrier 370 may be a silicon wafer in some embodiments. The operation 134 may use any suitable attaching processes, such as direct bonding, hybrid bonding, using adhesive, or other bonding methods. In the illustrated embodiment, an adhesive layer 276 is formed on the frontside of the device 200 and adjoins the carrier 370 to the frontside of the device 200. The operation 134 may further include alignment, annealing, and/or other processes. The attaching of the carrier 274 allows the device 200 to be flipped upside down. This makes the device 200 accessible from the backside of the device 200 for further processing. It is noted that the device 200 is flipped upside down in FIG. 17A-17C.

Figure 18A:
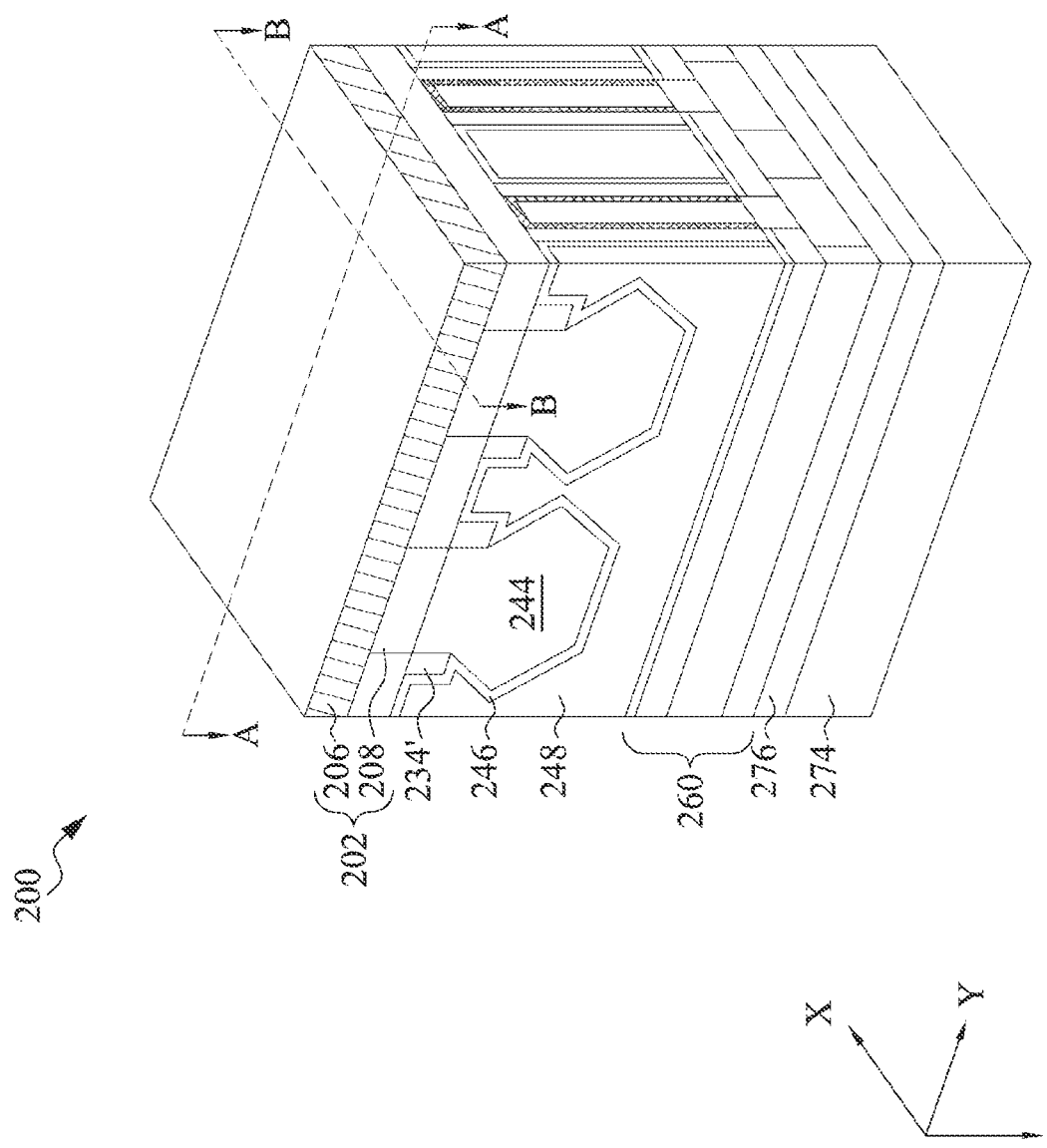
Figure 18C:
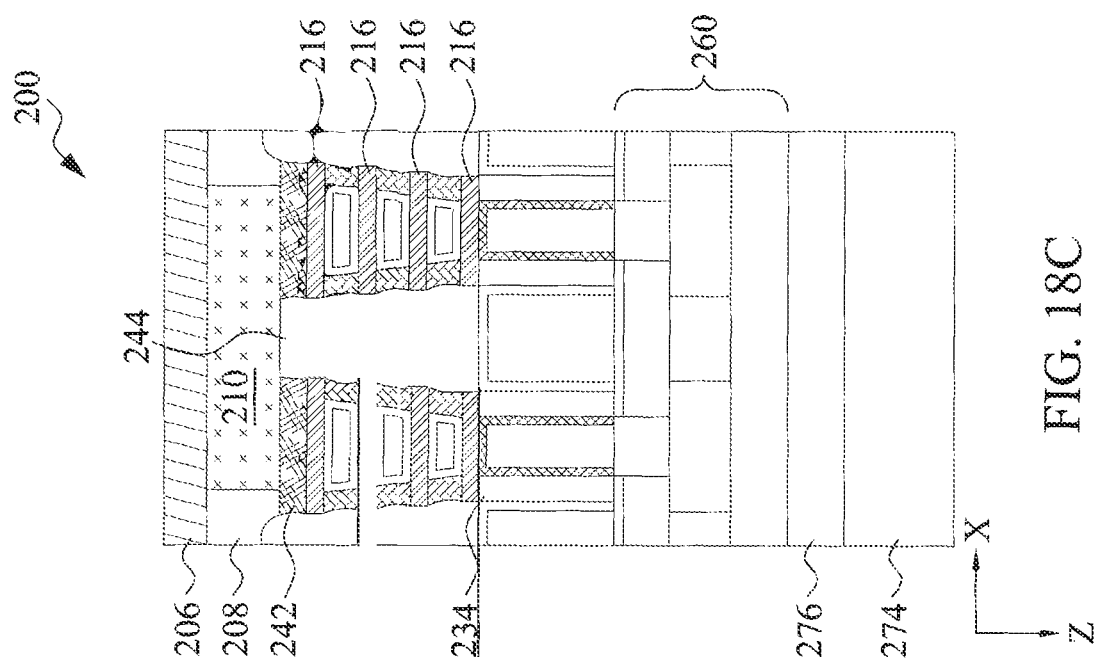
Figure 18B:
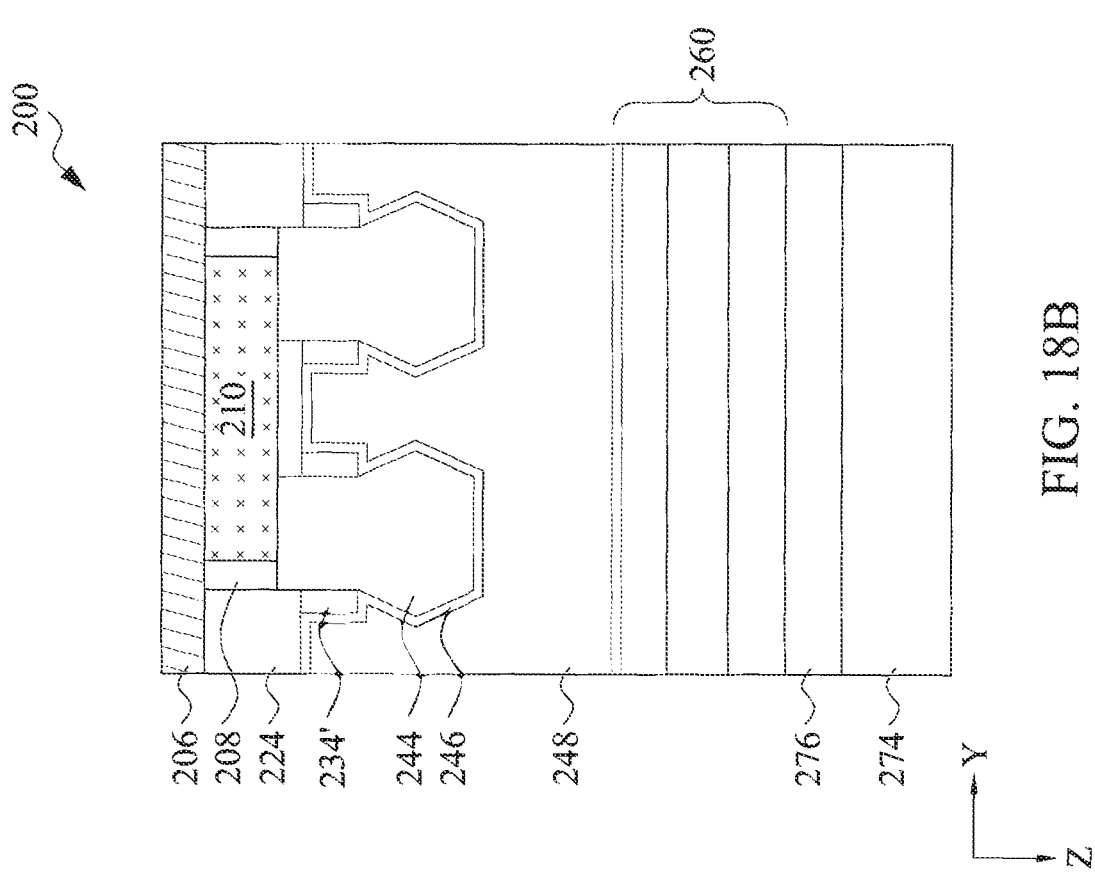

At operation 136, the method 100 (FIG. 1B) thins down the device 200 from the backside of the device 200 until the buried insulating layer 206 is exposed from the backside of the device 200, as shown in FIGS. 18A-18C. The thinning process may include a mechanical grinding process and/or a chemical thinning process. A substantial amount of base semiconductor layer 204 may be first removed from the substrate 202 during a mechanical grinding process. Afterwards, a chemical thinning process may apply an etching chemical to the backside of the substrate 202 to fully remove the base semiconductor layer 204 to expose the buried insulating layer 206.

Figure 19A:
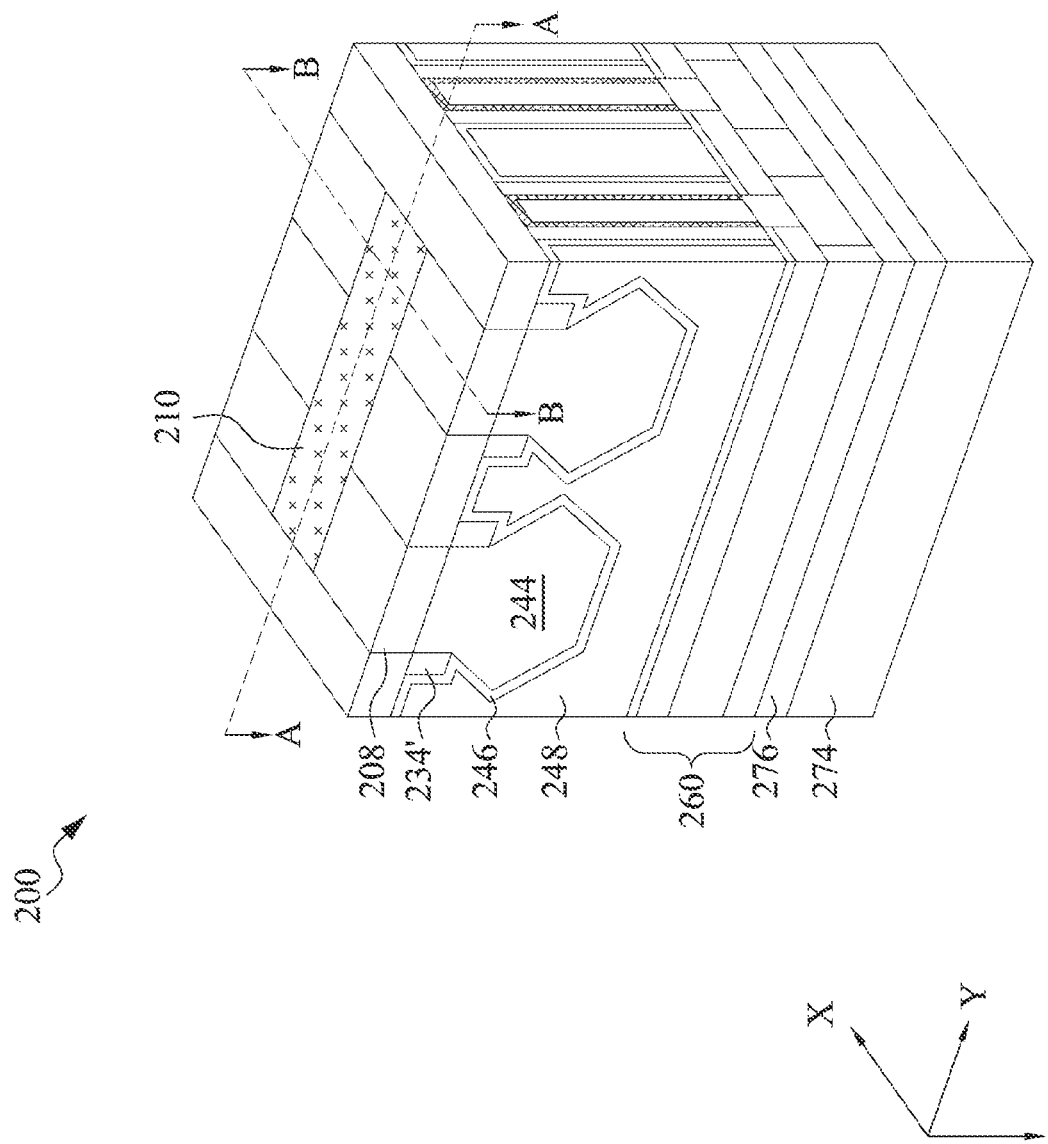
Figure 19C:
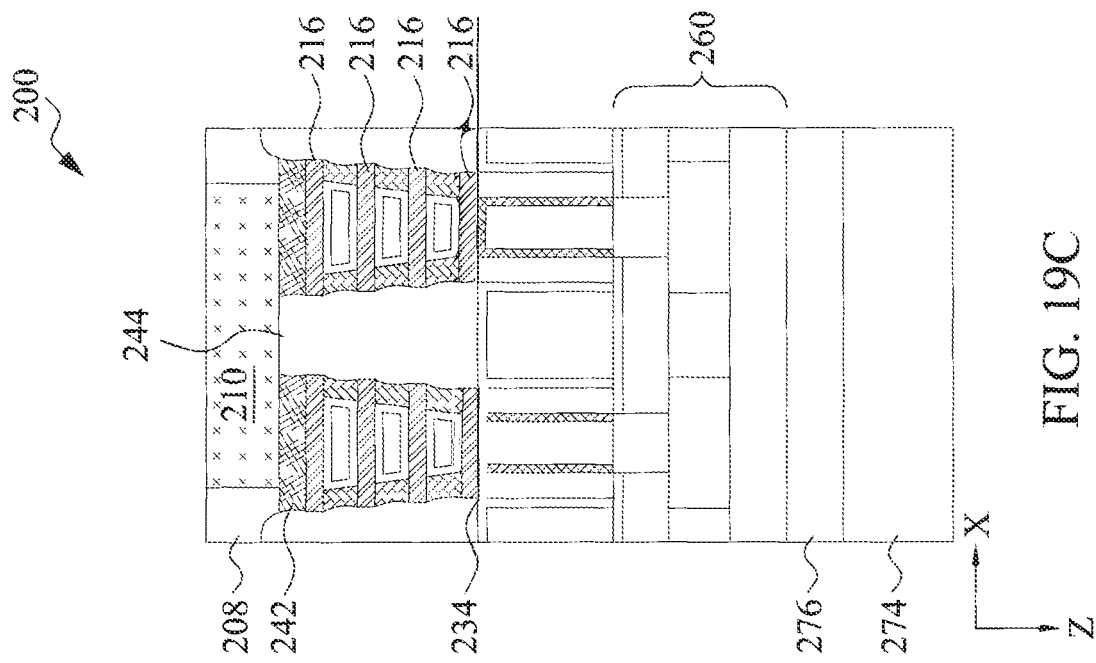
Figure 19B:
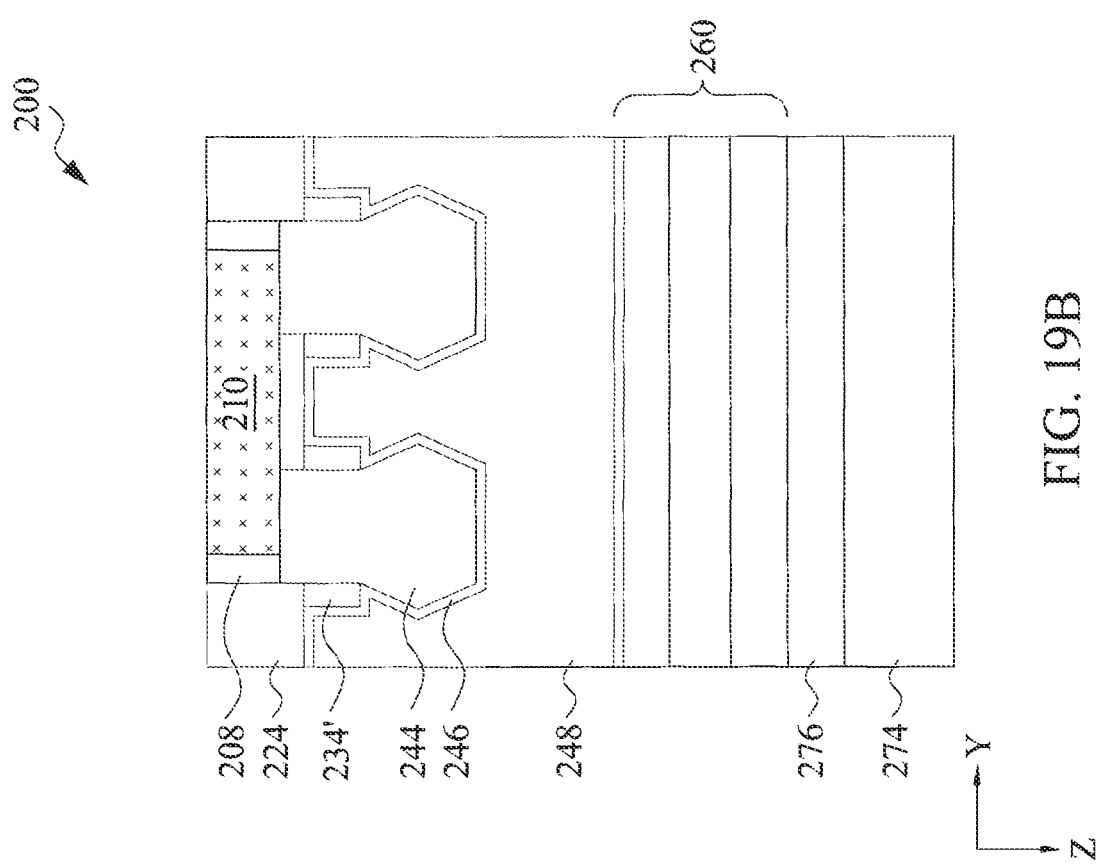

At operation 138, the method 100 (FIG. 1B) further thins down the device 200 from the backside of the device 200 until the sacrificial contact via feature 210 is exposed from the backside of the device 200, as shown in FIGS. 19A-19C. Similar to the operation 136, the thinning process may include a mechanical grinding process and/or a chemical thinning process. A substantial amount of buried insulating layer 206 may be first removed from the substrate 202 during a mechanical grinding process. Afterwards, a chemical thinning process may apply an etching chemical to the backside of the substrate 202 to fully remove the buried insulating layer 206 to expose the buried insulating layer 206, the overlaying semiconductor layer 208, and the STI feature 224.

Figure 20A:
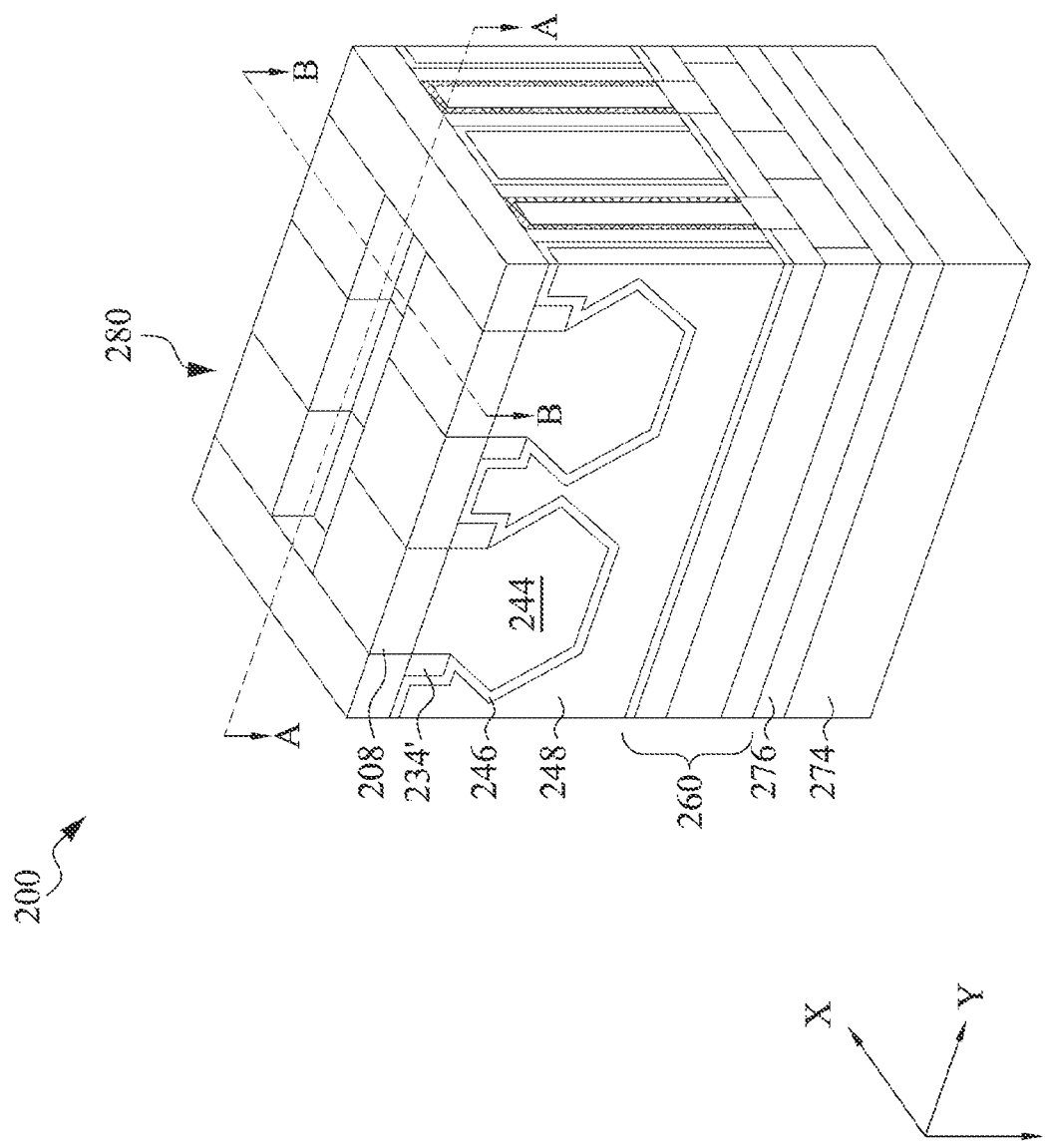
Figure 20C:
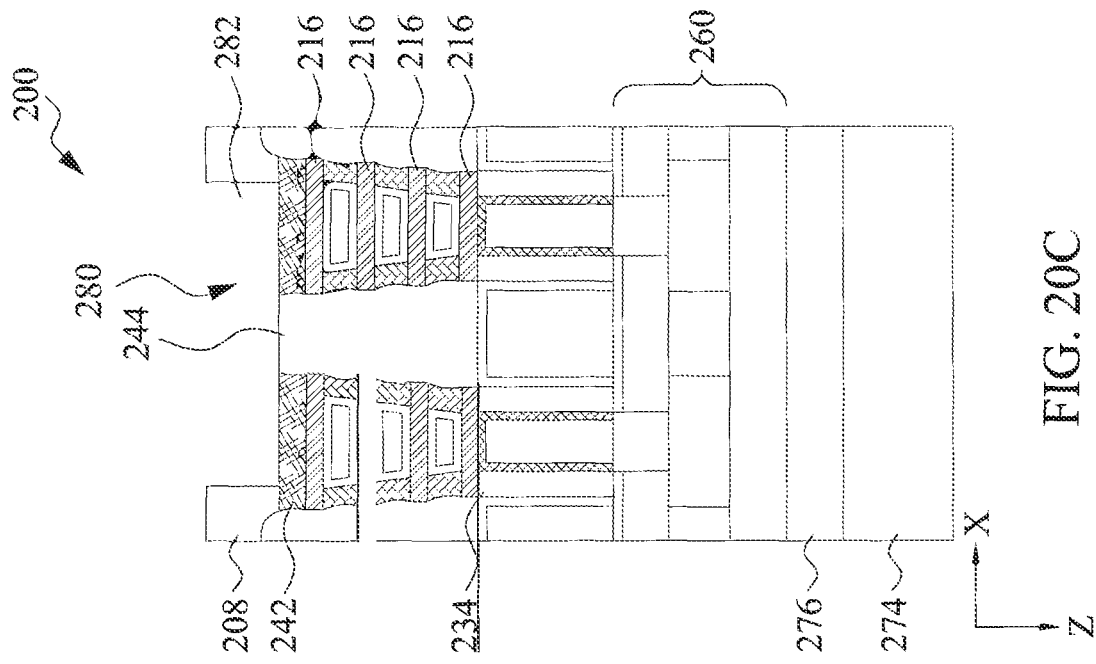
Figure 20B:
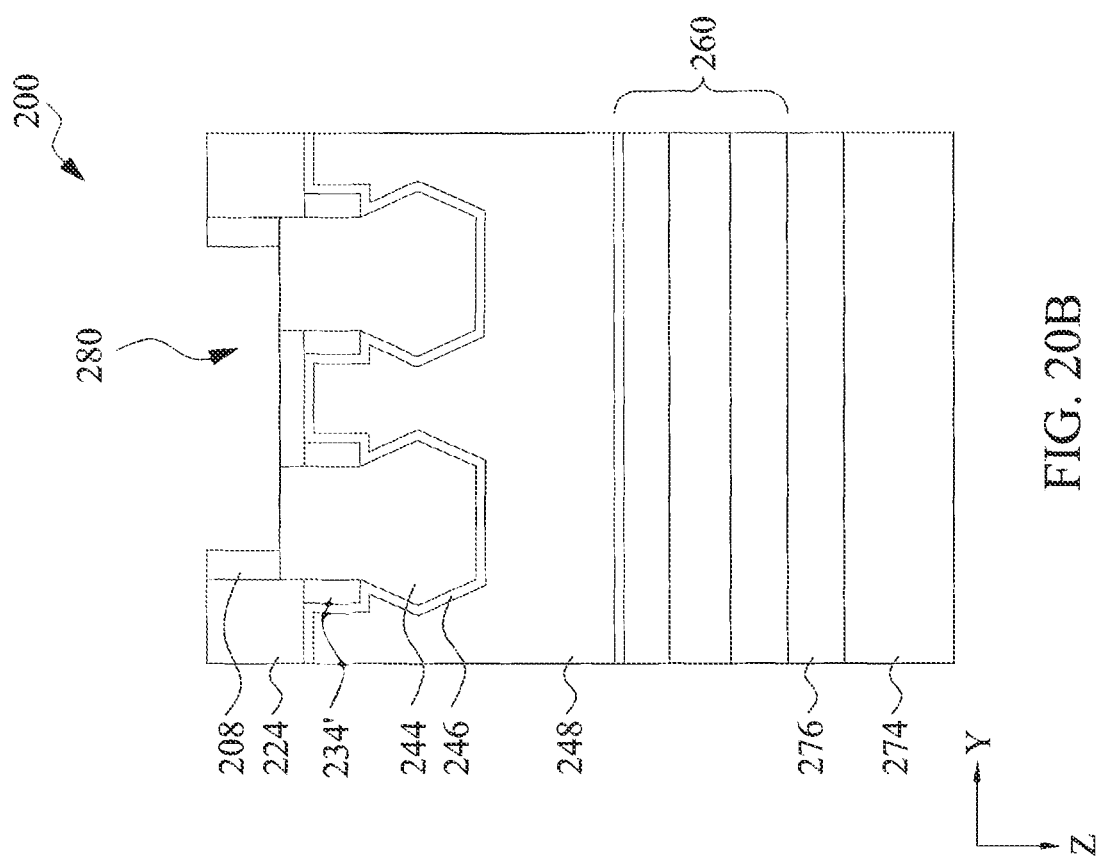

At operation 140, the method 100 (FIG. 1B) selectively etches the sacrificial contact via feature 210 to form a trench 280 over the backside of the S/D epitaxial features 244, as shown in FIGS. 20A-20C. The trench 280 exposes surfaces of the overlaying semiconductor layer 208, the STI feature 224, the SAC layer 242, and the S/D epitaxial features 244 from the backside. In some embodiments, the operation 140 applies an etching process that is tuned to be selective to the materials (e.g. silicon derivative materials or metal oxide) in the sacrificial contact via feature 210 and with no (or minimal) etching to the overlaying semiconductor layer 208, the STI feature 224, the SAC layer 242, and the S/D epitaxial features 244. In the illustrated embodiment, the exposed surfaces of the SAC layer 242 and the S/D epitaxial features 244 are substantially level. In an alternative embodiment, the etching process also etches the S/D epitaxial features 244 to recess the exposed surface to a level that is below the exposed surface of the SAC layer 242. In yet another alternative embodiment, the etching process also etches the SAC layer 242 to recess its exposed surface to a level that is below the exposed surface of the S/D epitaxial features 244, such that the S/D epitaxial features 244 protrude from the SAC layer 242. The operation 108 may apply more than one etching processes. For example, it may apply a first etching process to selectively remove the sacrificial contact via feature 210, and then apply a second etching process to selectively recess the S/D epitaxial features 244 to a desired level or to selectively recess the SAC layer 242 to a desired level, where the first and the second etching processes use different etching parameters such as using different etchants. The etching process(es) can be dry etching, wet etching, reactive ion etching, or other etching methods.

Figure 21A:
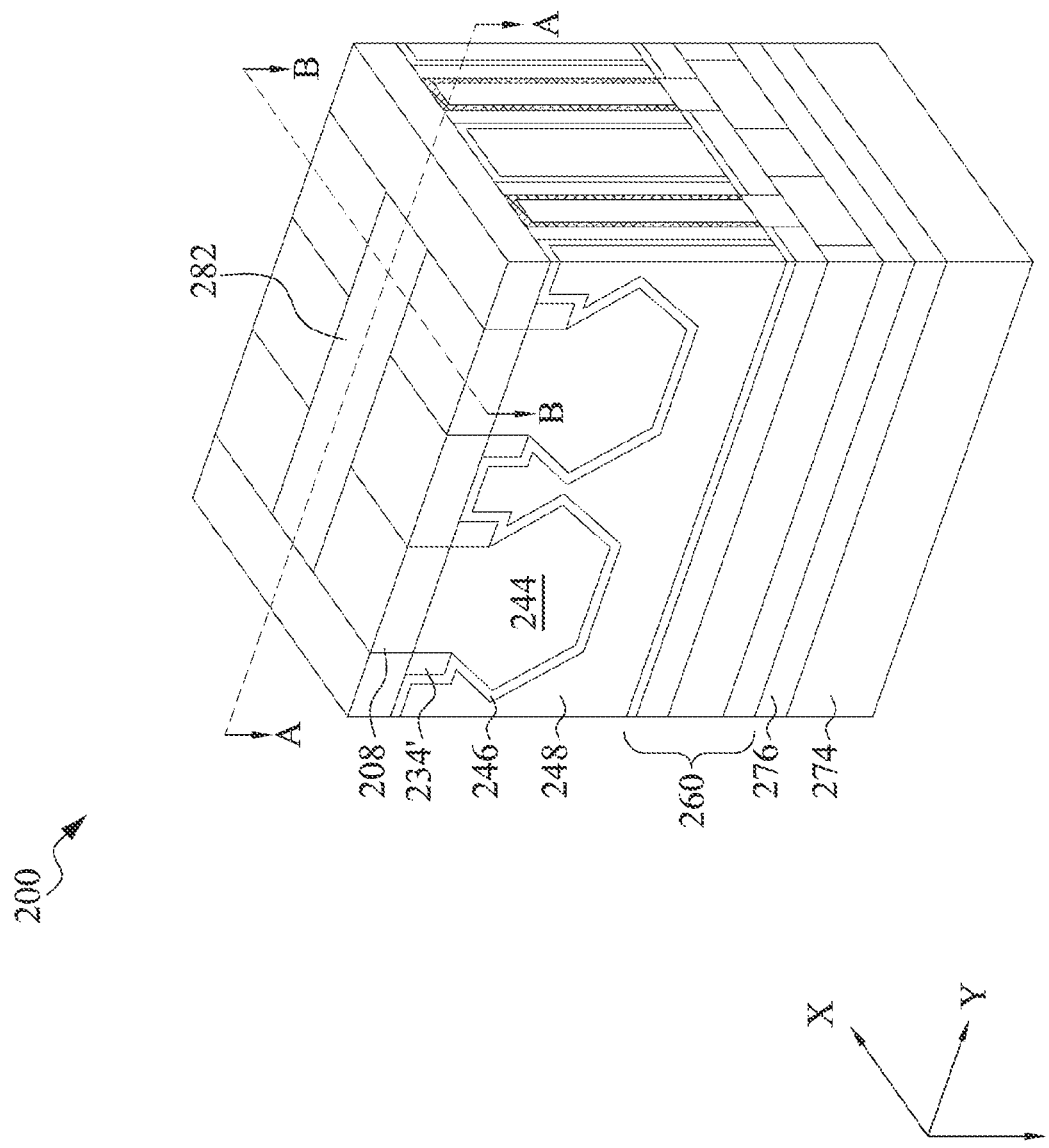
Figure 21C:
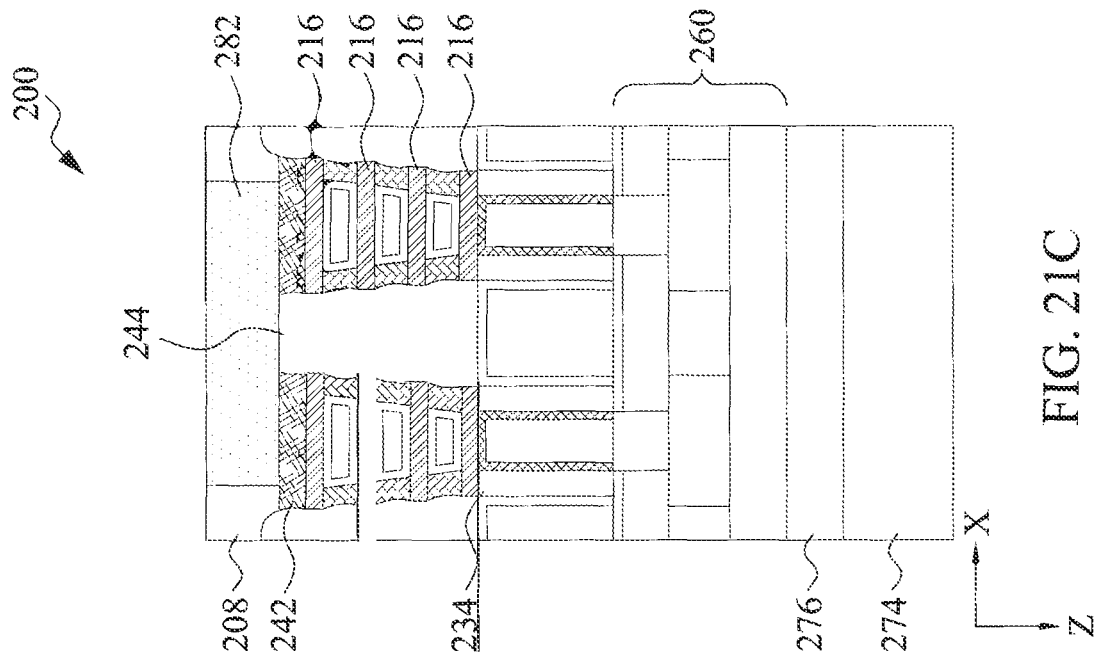
Figure 21B:
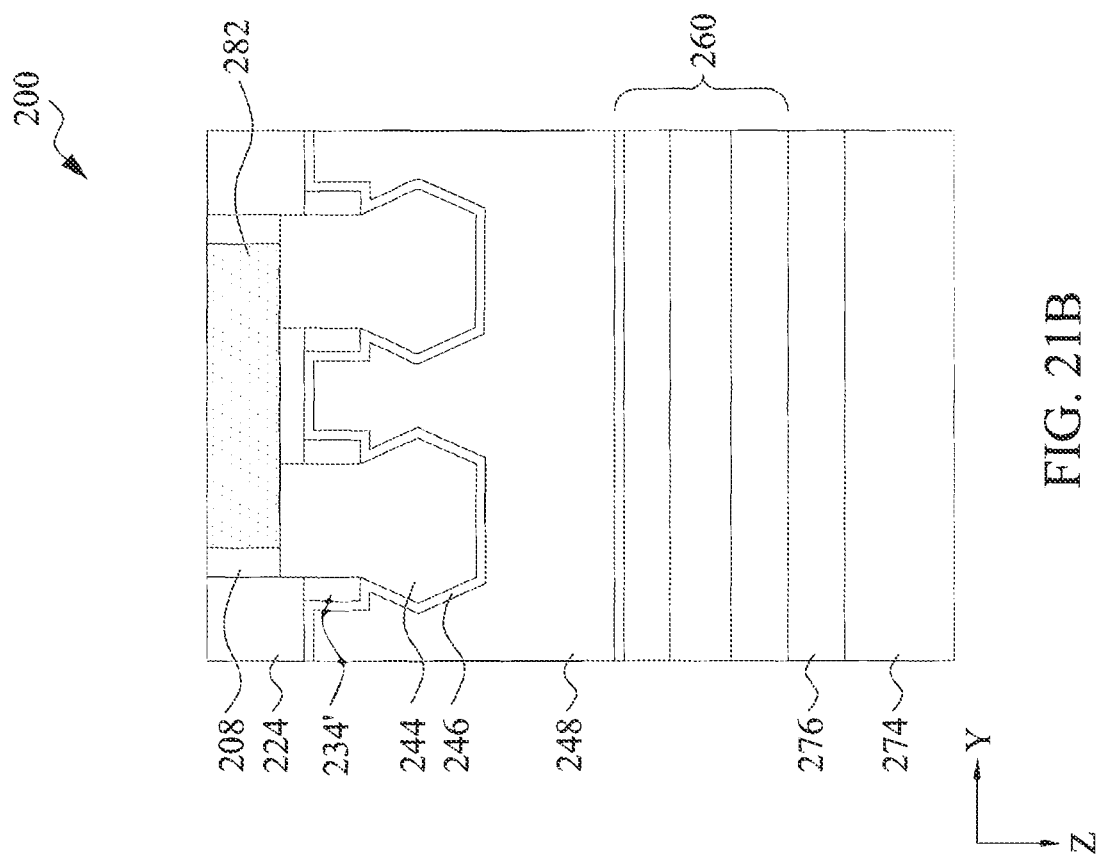

At operation 142, the method 100 (FIG. 1B) forms a backside conductive contact via 282 in the trench 280 that is formed by removal of the sacrificial contact via feature 210, as shown in FIGS. 21A-21C. The backside conductive contact via 282 may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be formed by CVD, PVD, ALD, plating, or other suitable processes. In the illustrated embodiment, the backside conductive contact via 282 directly contact the S/D epitaxial features 244. Alternatively, in an embodiment, the operation 142 optionally forms a silicide feature (not shown) between the S/D epitaxial features 244 and the backside conductive contact via 282 to further reduce contact resistance. In furtherance of the embodiment, the operation 142 first deposits one or more metals into the trenches 280, performing an annealing process to the device 200 to cause reaction between the one or more metals and the S/D epitaxial features 244 to produce the silicide feature, and removing un-reacted portions of the one or more metals, leaving the silicide feature in the trench 280. The one or more metals may include titanium (Ti), tantalum (Ta), tungsten (W), nickel (Ni), platinum (Pt), ytterbium (Yb), iridium (Jr), erbium (Er), cobalt (Co), or a combination thereof (e.g., an alloy of two or more metals) and may be deposited using CVD, PVD, ALD, or other suitable methods. The silicide feature may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), a combination thereof, or other suitable compounds.

Figure 22A:
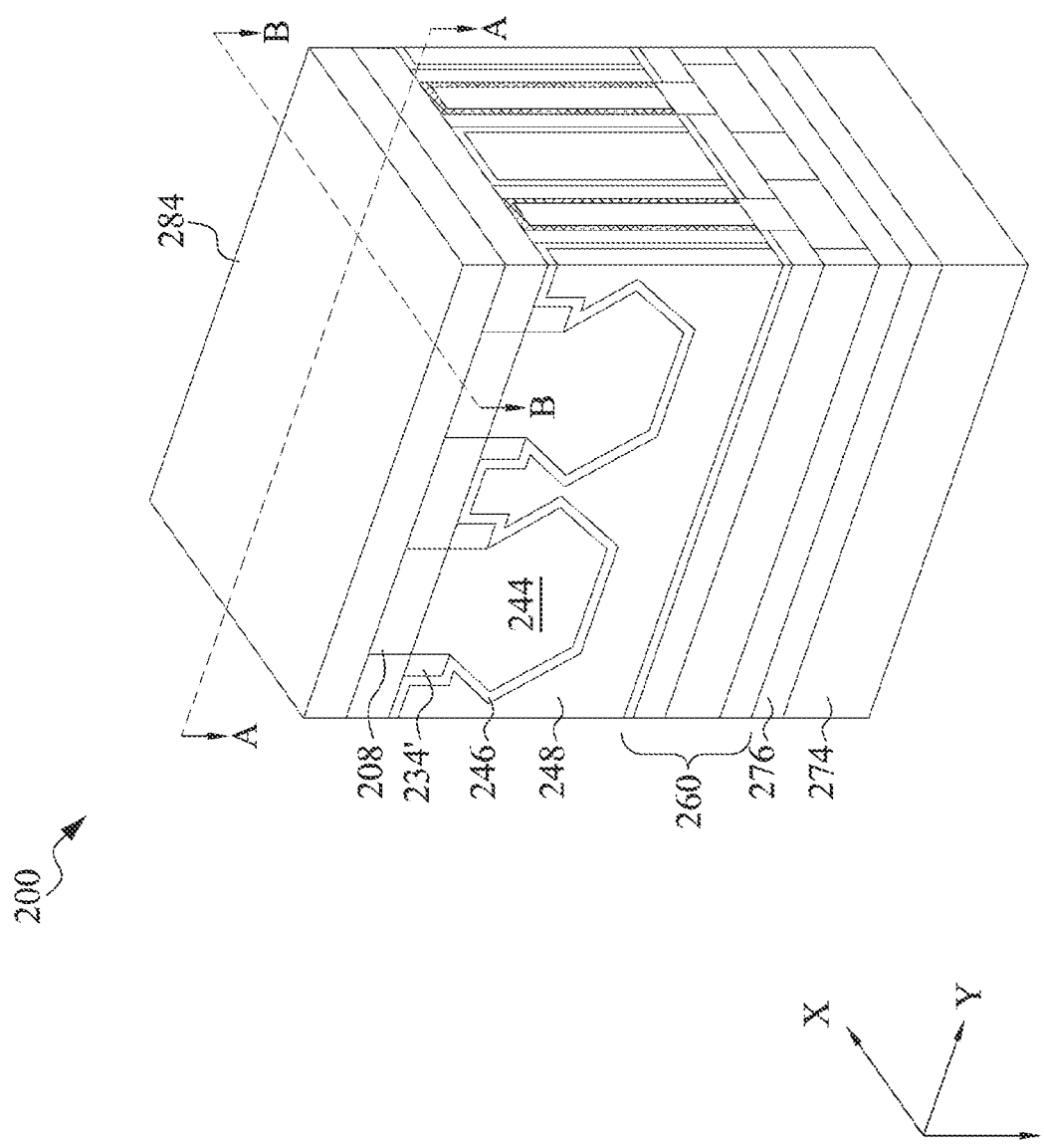

At operation 144, the method 100 (FIG. 1B) forms one or more backside interconnect layers 284 with backside power rails embedded in dielectric layers on the backside of the device 200. The resultant structure is shown in FIGS. 22A-22C according to an embodiment. The backside power rails electrically connect to the backside conductive contact via 282. In an embodiment, the backside power rails may be formed using a damascene process, a dual-damascene process, a metal patterning process, or other suitable processes. The backside power rails may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be deposited by CVD, PVD, ALD, plating, or other suitable processes. Although not shown in FIGS. 22A-22C, the backside power rails may include contacts, vias, wires, and/or other conductive features. Having backside power rails beneficially increases the number of metal tracks available in the device 200 for directly connecting to source/drain contacts and vias, including the backside conductive contact via 282. The backside power rails may have wider dimension than the first level metal (M0) tracks on the frontside of the device 200, which beneficially reduces the backside power rail resistance. By forming the sacrificial contact via feature before the forming of active regions (e.g., fins), a relatively larger contact area may be reserved between an S/D epitaxial feature and a power rail, effectively further reducing contact resistance and improving device performance. Moreover, a relatively larger contact area provides better overlay control between via and contact structures. To be noticed, although the resultant structure as shown in FIGS. 22A-22C does not show other S/D contacts (or contact plugs) on the frontside of the device 200, such metal features may be formed on the frontside of the device 200 in various other embodiments, such as the metal contact plugs 288 shown in FIG. 24, which provides electrical connection to other S/D epitaxial features not biased by the backside power rails. As discussed above in association with the operation 132, the metal contact plugs 288 may be formed in one or more MEOL or BEOL processes.

Figure 23A:
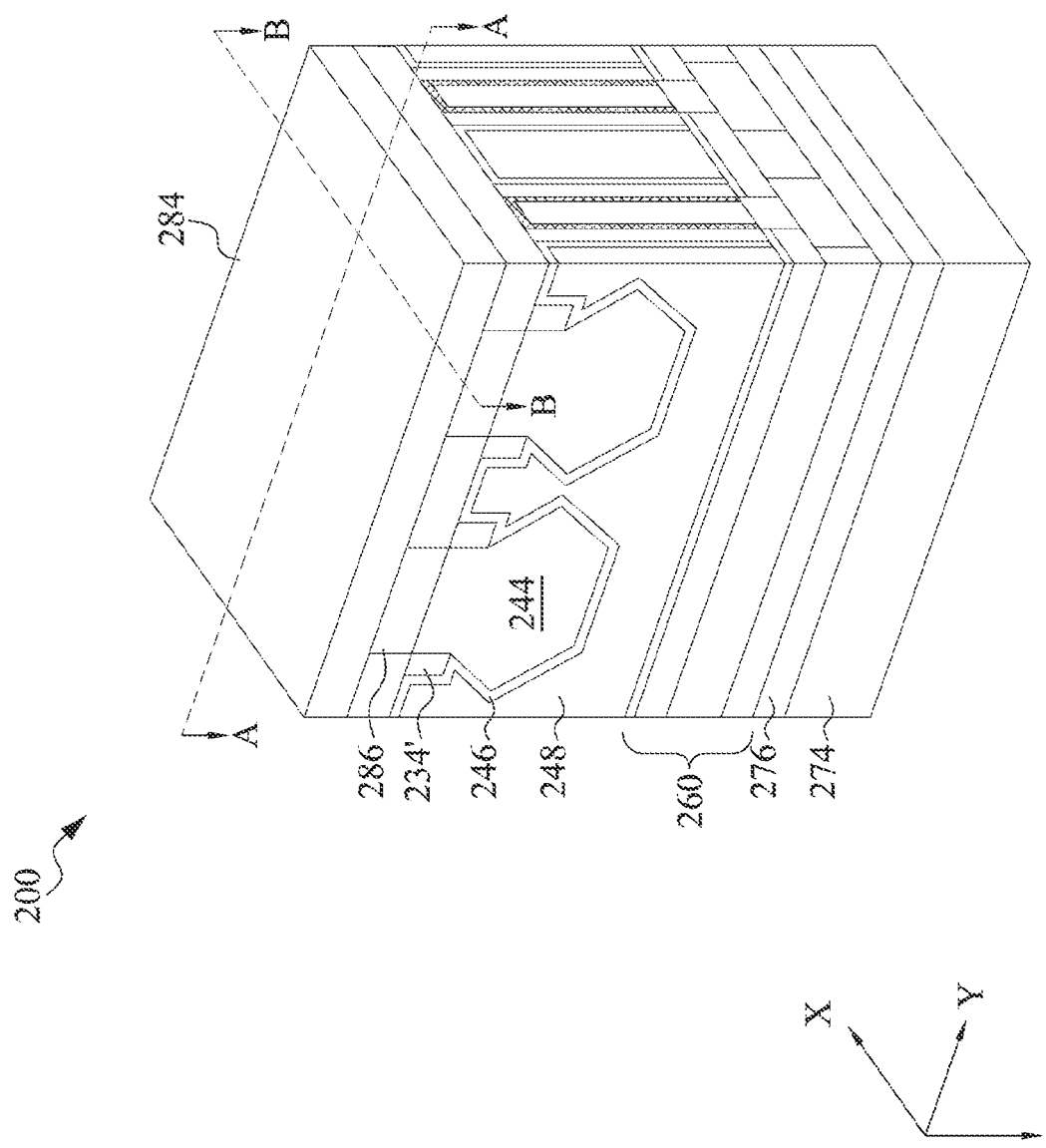
Figure 23C:
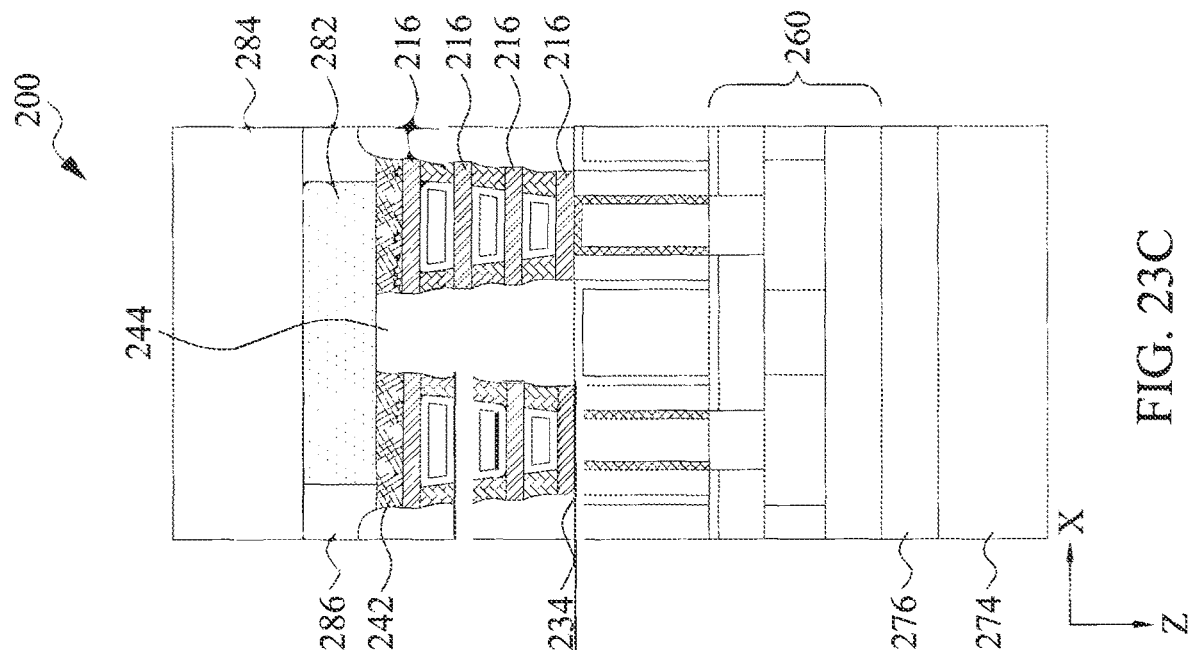
Figure 23B:
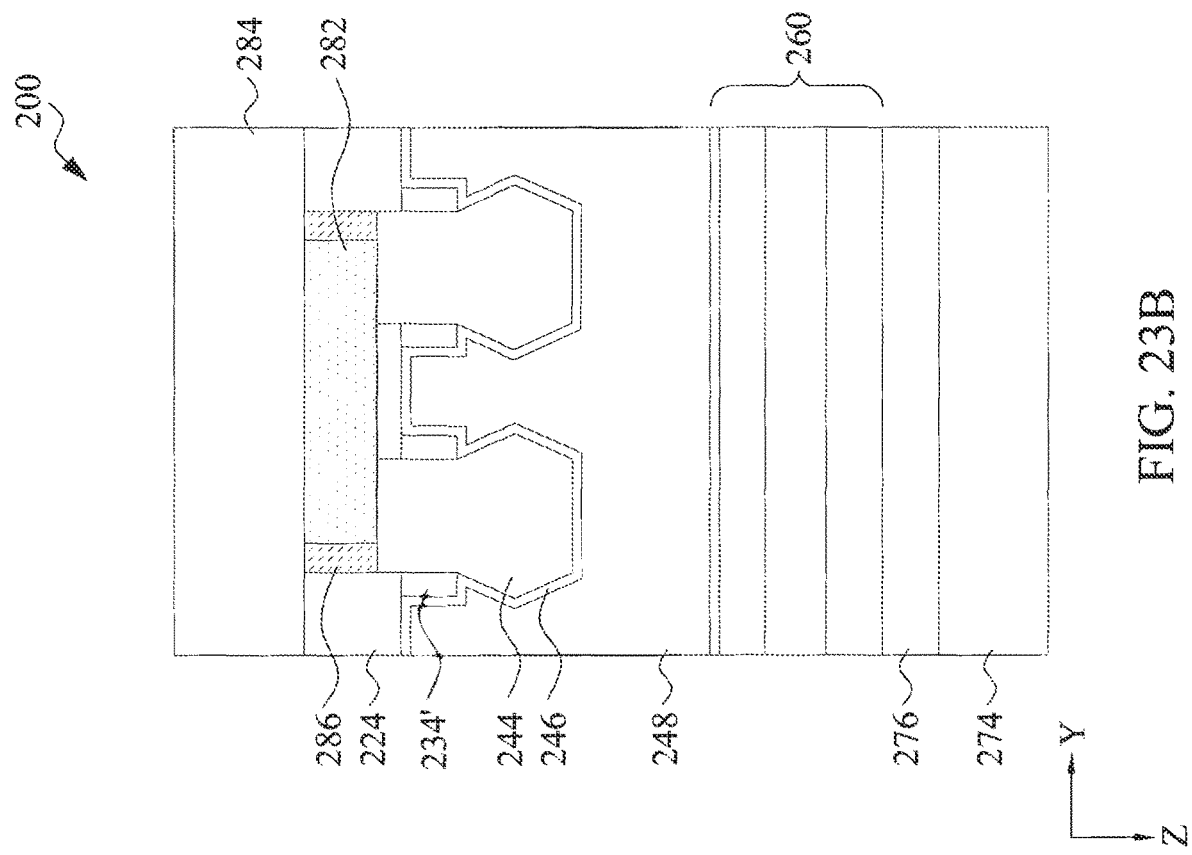

Reference is now made to FIGS. 23A-23C. FIGS. 23A-23C show an alternative embodiment of the resultant structure after the operation 144. Some processes and materials used to form the semiconductor device 200 may be similar to or the same as what has been described previously in association with FIGS. 1A-22C, and are not repeated herein. One difference is that the overlaying semiconductor layer 208 abutting the backside conductive contact via 282 is replaced with a dielectric layer 286. By replacing the semiconductor material in the overlaying semiconductor layer 208 with a dielectric material, the isolation between the S/D epitaxial features 244 and the backside interconnect layers 284 is improved, which in turn suppresses backside leakage current and increases an IC's TDDB (time-dependent dielectric breakdown) performance. In some embodiments, the dielectric material in the dielectric layer 286 includes silicon oxide ($SiO_2$), aluminum oxide (AlO), silicon nitride (SiN), silicon oxynitride (SiON), silicon carbonitride (SiCN), or silicon carbon oxynitride (SiCON). In furtherance of the embodiments, the dielectric layer 286 and the SAC layer 242 may include the same material composition in one example or different material compositions in another example. In various embodiments, the forming of the dielectric layer 286 may include removing the overlaying semiconductor layer 208 in a selective etching process to form trenches after the operation 138 which exposes the overlaying semiconductor layer 208 in a backside thinning process, and then depositing the dielectric material in the trenches by ALD, PVD, CVD, or other suitable process. Subsequently, the method 100 proceeds to the operation 140 in removing the sacrificial contact via feature 210 after the dielectric layer 286 is formed.

Figure 25:
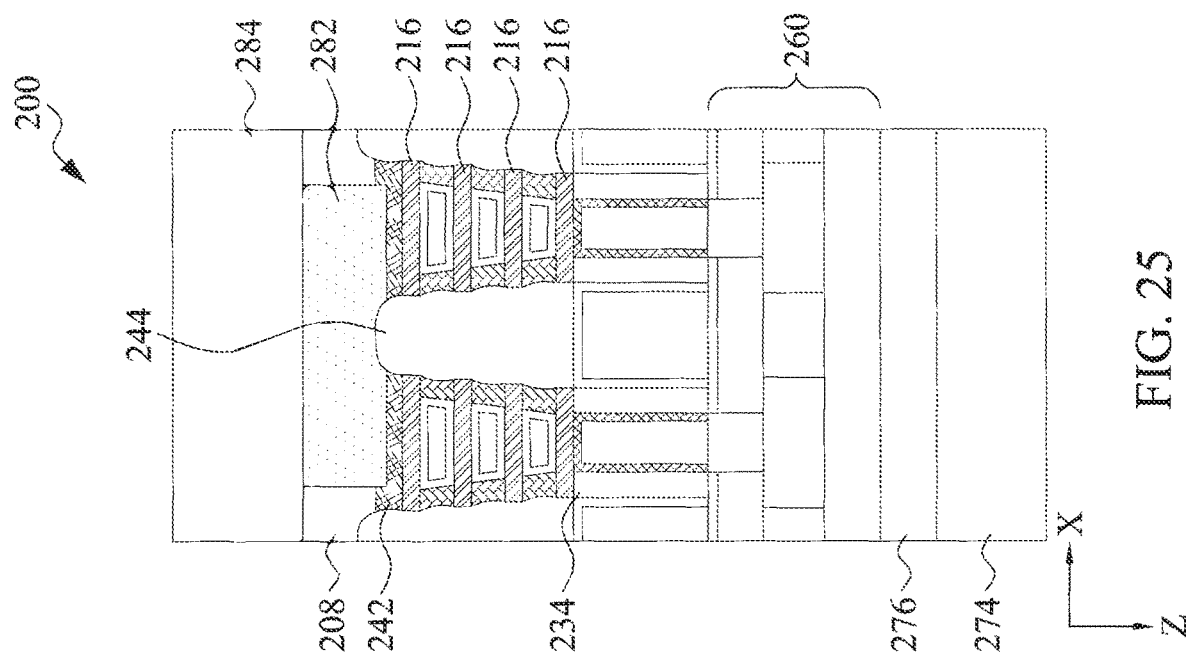
FIGS. 24, 25, and 26 illustrate cross-sectional views along the lengthwise direction of channel structures of the semiconductor device during fabrication processes according to the method of FIGS. 1A and 1B, in accordance with some alternative embodiments of the present disclosure.
Figure 24:
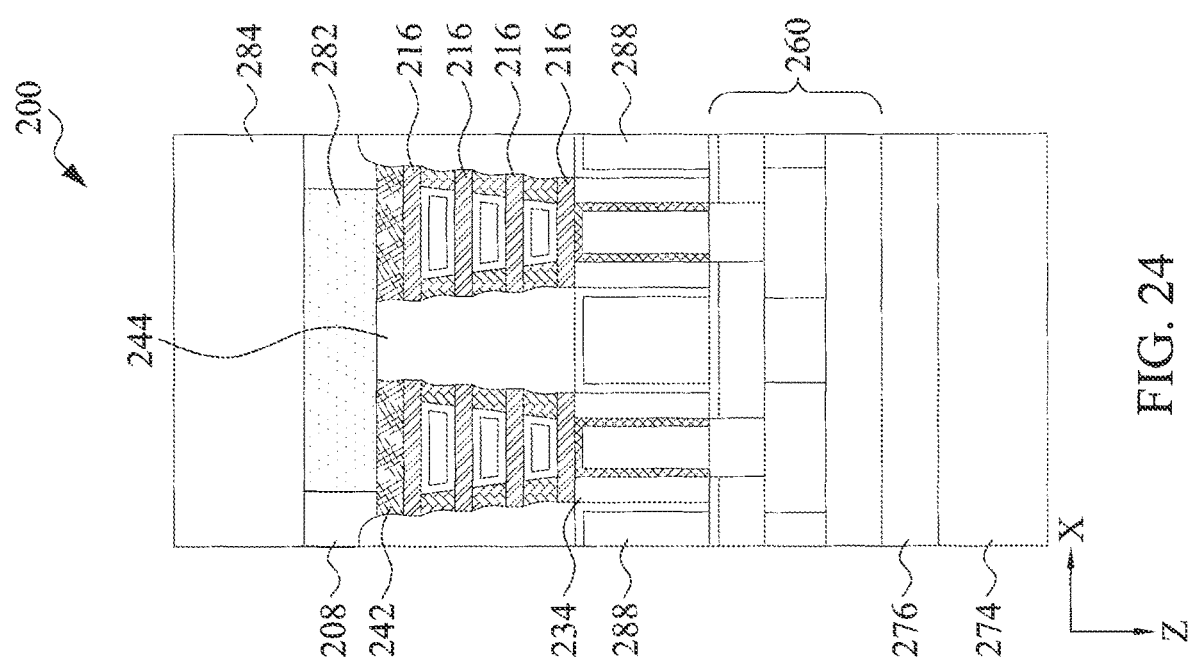

Reference is now made to FIG. 25. FIG. 25 shows a cross-sectional view along the B-B line of yet another alternative embodiment of the resultant structure after the operation 144. Some processes and materials used to form the semiconductor device 200 may be similar to or the same as what has been described previously in association with FIGS. 1A-22C, and are not repeated herein. One difference is that the S/D epitaxial feature 244 protrudes out of the SAC layer 242 and extends into (embedded in) the backside conductive contact via 282. As discussed above in association with the operation 140, the protruding portion of the S/D epitaxial feature may be formed by recessing the SAC layer 242 in one or more etching processes during or after the forming of the trench 280 (FIGS. 20A-20C). The etching process(es) can be dry etching, wet etching, reactive ion etching, or other etching methods.

Figure 26:
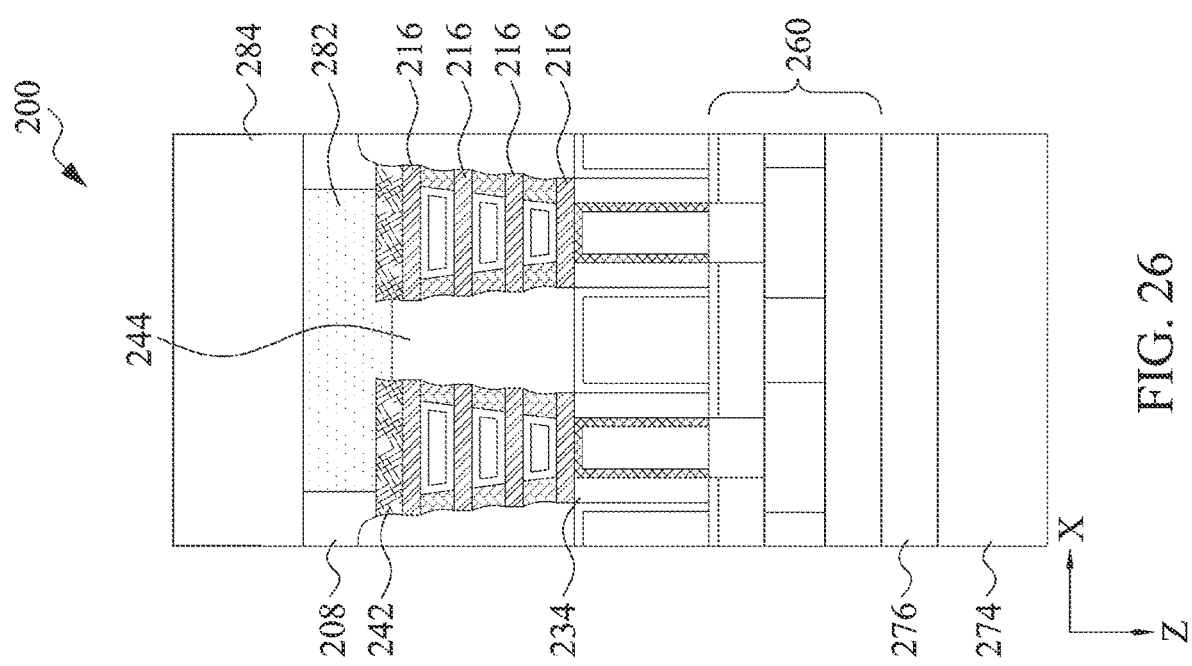

Reference is now made to FIG. 26. FIG. 26 shows a cross-sectional view along the B-B line of yet another alternative embodiment of the resultant structure after the operation 144. Some processes and materials used to form the semiconductor device 200 may be similar to or the same as what has been described previously in association with FIGS. 1A-22C, and are not repeated herein. One difference is that the S/D epitaxial feature 244 is recessed below the SAC layer 242 such that the backside conductive contact via 282 protrudes into the SAC layer 242. As discussed above in association with the operation 140, the protruding portion of the backside conductive contact via 282 may be formed by recessing the S/D epitaxial feature 244 in one or more etching processes during or after the forming of the trench 280 (FIGS. 20A-20C). The etching process(es) can be dry etching, wet etching, reactive ion etching, or other etching methods.

Figure 27:
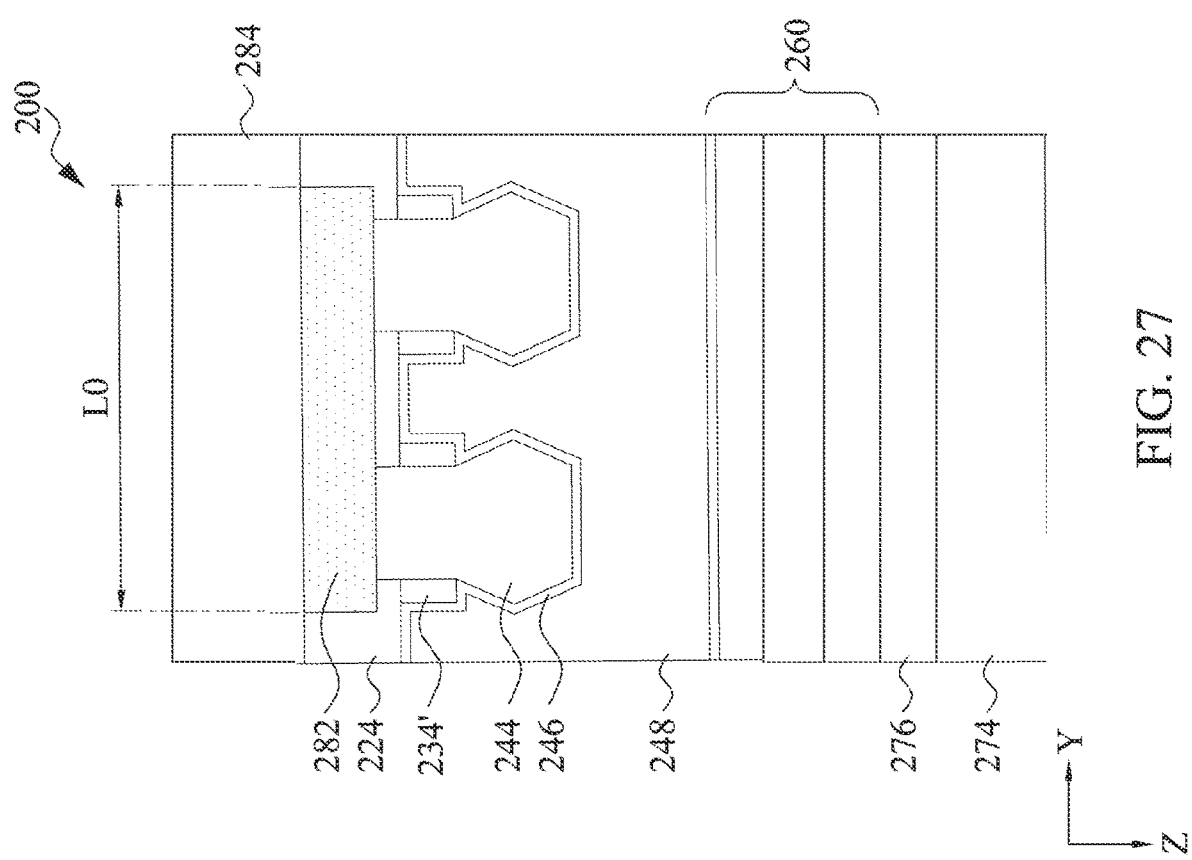
FIG. 27 illustrates a cross-sectional view perpendicular to the lengthwise direction of channel structures of the semiconductor device during fabrication processes according to the method of FIGS. 1A and 1B, in accordance with yet another alternative embodiment of the present disclosure.

Reference is now made to FIG. 27. FIG. 27 shows a cross-sectional view along the A-A line of yet another alternative embodiment of the resultant structure after operation 144. Some processes and materials used to form the semiconductor device 200 may be similar to or the same as what has been described previously in association with FIGS. 1A-22C, and are not repeated herein. One difference is that bottom surfaces of the S/D epitaxial feature 244 fully lands on the backside conductive contact via 282, instead of partially on the backside conductive contact via 282 and partially on the overlaying semiconductor layer 208 (FIG. 22B) or the dielectric layer 286 (FIG. 23B). As discussed above in association with the operation 108, the length L0 along the Y-direction of the sacrificial contact via feature 210 (thus the length of the backside conductive contact via 282) may be larger than a sum of the fin pitch P1 and fin width W1 (as illustrated by the dotted rectangular box 210' in FIG. 5B), such as equals to two or multiple times of the fin pitch P1 (e.g., L0=n*P1, n=2, 3, . . . ) in one example, such that both sidewalls of each of the fins 220 (thus the S/D epitaxial feature 244) may land on the top surface of the sacrificial contact via feature 210 (thus the backside conductive contact via 282).

At operation 146, the method 100 (FIG. 1B) performs further fabrication processes to the device 200. For example, it may form one or more interconnect layers on the backside of the device 200, form passivation layers on the backside of the device 200, perform other BEOL processes, and remove the carrier 274.

Although not intended to be limiting, embodiments of the present disclosure provide one or more of the following advantages. For example, embodiments of the present disclosure form a sacrificial (dummy) contact via feature on a wafer's backside before channel structures are formed in the frontside. This advantageously reserves a relatively larger contact area to form a conductive contact via between source/drain epitaxial features and backside power rails, which reduces contact resistance and improves device performance. Further, embodiments of the present disclosure form backside wiring layers, such as backside power rails, to increase the number of metal tracks available in an integrated circuit and increase the gate density for greater device integration. Embodiments of the present disclosure can be readily integrated into existing semiconductor manufacturing processes.

In one exemplary aspect, the present disclosure is directed to a method. The method includes forming a sacrificial feature in a top portion of a substrate, forming a fin over the sacrificial feature, recessing the fin in a source/drain (S/D) region, thereby forming an S/D trench exposing the sacrificial feature, forming an S/D epitaxial feature in the S/D trench, removing a bottom portion of the substrate, thereby exposing the sacrificial feature from a backside of the substrate, and replacing the sacrificial feature with a conductive feature. In some embodiments, the replacing of the sacrificial feature with the conductive feature includes removing the sacrificial feature in a selective etching process, thereby forming a trench exposing the S/D epitaxial feature, and depositing the conductive feature in the trench. In some embodiments, the trench also exposes the top portion of the substrate, and the replacing of the sacrificial feature with the conductive feature further includes prior to the removing of the sacrificial feature, removing the top portion of the substrate from the trench, and depositing a dielectric layer abutting the sacrificial feature. In some embodiments, the conductive feature is in physical contact with the S/D epitaxial feature. In some embodiments, the substrate includes a buried insulating layer, and the forming of the sacrificial feature includes patterning the top portion of the substrate, thereby forming an opening exposing the buried insulating layer, and depositing the sacrificial feature in the opening, covering the buried insulating layer. In some embodiments, the removing of the bottom portion of the substrate includes removing the buried insulating layer. In some embodiments, the top portion of the substrate includes an overlaying semiconductor layer, and the fin has a first sidewall directly above the overlaying semiconductor layer and a second sidewall directly above the sacrificial feature. In some embodiments, the fin has first and second sidewalls both directly above the sacrificial feature. In some embodiments, the method further includes removing a bottom portion of the fin and forming an etch stop layer stacked between the fin and the sacrificial feature, while the conductive feature is in physical contact with the etch stop layer.

In another exemplary aspect, the present disclosure is directed to a method. The method includes providing a structure having a frontside and a backside, the structure including a substrate at the backside of the structure and a fin at the frontside of the structure, the substrate including a sacrificial feature under the fin, and the fin including a plurality of sacrificial layers and a plurality of channel layers alternately arranged, recessing the fin from the frontside of the structure, thereby exposing the sacrificial feature in a source/drain (S/D) region, forming an S/D epitaxial feature above the sacrificial feature, thinning down the structure from the backside of the structure until the sacrificial feature is exposed, etching the sacrificial feature from the backside of the structure to form a trench exposing the S/D epitaxial feature, depositing a conductive feature in the trench, and forming a metal wiring layer on the backside of the structure, wherein the metal wiring layer electrically couples to the S/D epitaxial feature through the conductive feature. In some embodiments, the substrate includes a semiconductor layer surrounding the sacrificial feature, and wherein the thinning down of the structure also exposes the semiconductor layer. In some embodiments, the method further includes depositing an isolation feature at the frontside of the structure, the isolation feature covering the sacrificial feature and bottom portions of sidewalls of the fin, the trench also exposing the isolation feature. In some embodiments, a top surface of the isolation feature is above a top surface of a bottommost sacrificial layer. In some embodiments, the method further includes removing a bottommost sacrificial layer from the fin, thereby forming an opening between the fin and the sacrificial feature, and depositing a dielectric layer in the opening. In some embodiments, the trench also exposes the dielectric layer. In some embodiments, the method further includes recessing the dielectric layer from the backside of the structure, such that a portion of the S/D epitaxial feature protrudes from the recessed dielectric layer.

In another exemplary aspect, the present disclosure is directed to a semiconductor structure. The semiconductor structure device includes first and second source/drain (S/D) epitaxial features, one or more channel structures connecting the first and second S/D epitaxial features, a gate structure engaging the one or more channel structures. The first and second S/D epitaxial features, the one or more channel structures, and the gate structure are at a frontside of the semiconductor structure. The semiconductor structure also includes a metal wiring layer at a backside of the semiconductor structure and a conductive feature connecting the metal wiring layer and the first S/D epitaxial feature, wherein the conductive feature extends to a position directly under the one or more channel structures. In some embodiments, a bottom surface of the first S/D epitaxial feature partially contacts the conductive feature. In some embodiments, a portion of the first S/D epitaxial feature is embedded in the conductive feature. In some embodiments, the conductive feature is a first conductive feature, and the semiconductor structure further includes a second conductive feature at the frontside of the semiconductor structure, the second conductive feature being in physical contact with the second S/D epitaxial feature.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   forming a sacrificial feature in a top portion of a substrate;
   forming a fin over the sacrificial feature;
   after the forming of the sacrificial feature and the forming of the fin, recessing the fin in a source/drain (S/D) region, thereby forming an S/D trench exposing the sacrificial feature;
   after the forming of the S/D trench, forming an S/D epitaxial feature in the S/D trench;
   removing a bottom portion of the substrate, thereby exposing the sacrificial feature from a backside of the substrate; and
   replacing the sacrificial feature that was formed prior to the recessing of the fin with a conductive feature in electrical coupling with the S/D epitaxial feature.

2. The method of claim 1, wherein the replacing of the sacrificial feature with the conductive feature includes:
   removing the sacrificial feature in a selective etching process, thereby forming a trench exposing the S/D epitaxial feature, and
   depositing the conductive feature in the trench.

3. The method of claim 2, wherein the trench also exposes the top portion of the substrate, and wherein the replacing of the sacrificial feature with the conductive feature further includes:
   prior to the removing of the sacrificial feature, removing the top portion of the substrate from the trench, and
   depositing a dielectric layer abutting the sacrificial feature.

4. The method of claim 1, wherein the conductive feature is in physical contact with the S/D epitaxial feature.

5. The method of claim 1, wherein the substrate includes a buried insulating layer, and wherein the forming of the sacrificial feature includes:

patterning the top portion of the substrate, thereby forming an opening exposing the buried insulating layer, and
depositing the sacrificial feature in the opening, covering the buried insulating layer.

6. The method of claim 5, wherein the removing of the bottom portion of the substrate includes removing the buried insulating layer.

7. The method of claim 1, wherein the top portion of the substrate includes an overlaying semiconductor layer, and wherein the fin has a first sidewall directly above the overlaying semiconductor layer and a second sidewall directly above the sacrificial feature.

8. The method of claim 1, wherein the fin has first and second sidewalls both directly above the sacrificial feature.

9. The method of claim 1, further comprising:
   removing a bottom portion of the fin; and
   forming an etch stop layer stacked between the fin and the sacrificial feature, wherein the conductive feature is in physical contact with the etch stop layer.

10. A method, comprising:
    providing a structure having a frontside and a backside, the structure including a substrate at the backside of the structure and a fin at the frontside of the structure, wherein the substrate includes a sacrificial feature under the fin, and wherein the fin includes a plurality of sacrificial layers and a plurality of channel layers alternately arranged;
    after the providing of the structure that includes the sacrificial feature under the fin, recessing the fin from the frontside of the structure to form a source/drain (S/D) recess, thereby exposing the sacrificial feature in the S/D recess;
    after the forming of the S/D recess, forming an S/D epitaxial feature in the S/D recess and above the sacrificial feature;
    thinning down the structure from the backside of the structure until the sacrificial feature is exposed;
    etching the sacrificial feature that was provided prior to the recessing of the fin from the backside of the structure to form a trench exposing the S/D epitaxial feature;
    depositing a conductive feature in the trench; and
    forming a metal wiring layer on the backside of the structure, wherein the metal wiring layer electrically couples to the S/D epitaxial feature through the conductive feature.

11. The method of claim 10, wherein the substrate includes a semiconductor layer surrounding the sacrificial feature, and wherein the thinning down of the structure also exposes the semiconductor layer.

12. The method of claim 10, further comprising:
    depositing an isolation feature at the frontside of the structure, the isolation feature covering the sacrificial feature and bottom portions of sidewalls of the fin,
    wherein the trench also exposes the isolation feature.

13. The method of claim 12, wherein a top surface of the isolation feature is above a top surface of a bottommost sacrificial layer.

14. The method of claim 10, further comprising:
    removing a bottommost sacrificial layer from the fin, thereby forming an opening between the fin and the sacrificial feature; and
    depositing a dielectric layer in the opening.

15. The method of claim 14, wherein the trench also exposes the dielectric layer.

16. The method of claim 14, further comprising:

recessing the dielectric layer from the backside of the structure, such that a portion of the S/D epitaxial feature protrudes from the recessed dielectric layer.

17. A method, comprising:

providing a structure having a frontside and a backside, the structure including a substrate at the backside of the structure and a fin at the frontside of the structure, wherein the substrate includes a sacrificial feature directly under the fin, and wherein the fin includes a plurality of sacrificial layers and a plurality of channel layers alternately arranged;

after the providing of the structure that includes the sacrificial feature directly under the fin, recessing the fin from the frontside of the structure to form a source/drain recess, thereby exposing the sacrificial feature in the source/drain recess;

replacing a bottommost one of the sacrificial layers with an isolation layer;

after the forming of the source/drain recess, forming an epitaxial feature in the source/drain recess and abutting the isolation layer;

thinning down the structure from the backside of the structure until the sacrificial feature is exposed;

etching the sacrificial feature that was provided prior to the recessing of the fin from the backside of the structure to form a trench; and depositing a conductive feature in the trench, wherein the conductive feature electrically couples to the epitaxial feature.

18. The method of claim 17, wherein the forming of the epitaxial feature is after the replacing of the bottommost one of the sacrificial layers.

19. The method of claim 17, wherein the conductive feature is in physical contact with a bottom surface of the isolation layer.

20. The method of claim 17, wherein prior to the recessing of the fin, the fin has at least a sidewall directly above the sacrificial feature.

* * * * *